(12) United States Patent
Landsberger et al.

(10) Patent No.: US 7,714,694 B2
(45) Date of Patent: May 11, 2010

(54) COMPENSATING FOR LINEAR AND NON-LINEAR TRIMMING-INDUCED SHIFT OF TEMPERATURE COEFFICIENT OF RESISTANCE

(75) Inventors: Leslie M. Landsberger, Montreal (CA); Oleg Grudin, Montreal (CA)

(73) Assignee: Microbridge Technologies Canada, Inc., Montreal (CA)

( * ) Notice: Subject to any disclaimer, the term of this patent is extended or adjusted under 35 U.S.C. 154(b) by 653 days.

(21) Appl. No.: 11/689,244

(22) Filed: Mar. 21, 2007

(65) Prior Publication Data

US 2007/0159293 A1 Jul. 12, 2007

Related U.S. Application Data

(63) Continuation-in-part of application No. PCT/CA2005/001440, filed on Sep. 21, 2005.

(60) Provisional application No. 60/611,274, filed on Sep. 21, 2004, provisional application No. 60/784,785, filed on Mar. 23, 2006, provisional application No. 60/784,784, filed on Mar. 23, 2006, provisional application No. 60/784,783, filed on Mar. 23, 2006.

(51) Int. Cl.
*H01C 7/06* (2006.01)
(52) U.S. Cl. ............................ 338/9; 338/195; 338/308; 29/610.1; 29/620; 438/382
(58) Field of Classification Search .................. 338/9, 338/195, 308, 309, 322, 324, 328; 29/610.1, 29/612, 620, 825, 829; 438/382, 385, 238
See application file for complete search history.

(56) References Cited

U.S. PATENT DOCUMENTS 4,079,349 A    3/1978   Dorfeld (Continued)

FOREIGN PATENT DOCUMENTS

WO    WO 2003/023794 A2    3/2003

(Continued)

OTHER PUBLICATIONS

Written Opinion of the International Searching Authority PCT/CA2007/00482, Jun. 15, 2007, Microbridge Technologies Inc. et al., pp. 1-5.

(Continued)

*Primary Examiner*—Kyung Lee
(74) *Attorney, Agent, or Firm*—Burns & Levinson LLP; Jerry Cohen

(57) ABSTRACT

A compound resistor is used to compensate for trimming induced shift in temperature coefficient of resistance of a trimmable resistor. The compound resistor is composed of a first and second portion, at least one of the two portions being thermally trimmable, and the parameters for the first and second portion are selected such that the trimming induced shift can be minimized on an overall resistance and temperature coefficient of resistance of the compound resistors by trimming the trimmable resistor. The invention also allows for exploring trimming range available via true thermal trimming without actually trimming out resistor's value of a resistor. The invention also allows design of thermal isolation to minimize or optimize resistance variation of the overall compound resistance.

72 Claims, 25 Drawing Sheets

U.S. PATENT DOCUMENTS

| | | | |
|---|---|---|---|
| 4,210,996 | A | 7/1980 | Amemiya et al. |
| 4,472,239 | A | 9/1984 | Johnson et al. |
| 4,907,341 | A | 3/1990 | Chapel, Jr. et al. |
| 5,187,559 | A | 2/1993 | Isobe et al. |
| 5,600,174 | A * | 2/1997 | Reay et al. ............... 257/467 |
| 5,635,893 | A | 6/1997 | Spraggins et al. |
| 5,679,275 | A | 10/1997 | Spraggins et al. |
| 5,772,332 | A * | 6/1998 | Geller ................... 383/119 |
| 6,023,091 | A | 2/2000 | Koch et al. |
| 6,097,276 | A | 8/2000 | Van Den Brock et al. |
| 6,204,105 | B1 * | 3/2001 | Jung ..................... 438/238 |
| 6,306,718 | B1 | 10/2001 | Singh et al. |
| 6,329,272 | B1 * | 12/2001 | Gagnon et al. ............ 438/549 |
| 6,437,681 | B1 * | 8/2002 | Wang et al. ................ 338/25 |
| 6,489,881 | B1 * | 12/2002 | Aleksandravicius et al. . 338/307 |
| 7,249,409 | B2 * | 7/2007 | Landsberger et al. ...... 29/610.1 |
| 2006/0049912 | A1 | 3/2006 | Grudin et al. |
| 2006/0062272 | A1 | 3/2006 | Grudin et al. |
| 2006/0279349 | A1 | 12/2006 | Grudin et al. |
| 2007/0013389 | A1 | 1/2007 | Grudin et al. |
| 2007/0034608 | A1 | 2/2007 | Grudin et al. |
| 2007/0109091 | A1 | 5/2007 | Landsberger et al. |

FOREIGN PATENT DOCUMENTS

| | | |
|---|---|---|
| WO | WO 2004/083840 A1 | 9/2004 |
| WO | WO 2004/097859 A2 | 11/2004 |
| WO | WO 2004/097860 A1 | 11/2004 |
| WO | WO 2006/050607 A1 | 5/2006 |

OTHER PUBLICATIONS

Kato, K, Ono, T, "Changes in Temperature Coefficient of Resistance of Heavily Doped Polysilicon Resistors Caused by Electrical Trimming," Jpn. J. Appl. Phys. vol. 35 (1996), pp. 4209-4215.

Feldbaummer, D; Babcock, J.; Chen, C. "Pulse Current Trimming of Polysilicon Resistors Trans. on Electron Devices," vol. 42 (1995), pp. 689-696.

K. Kato, T. Ono, *Changes in Temperature Coefficient of Resistance of Heavily Doped Polysilicon Resistors Caused by Electrical Trimming*, Jpn. J Appl. Phys. vol. 35 (1996), pp. 4209-4215.

D. Feldbaumer, J. Babcock, C. Chen, *Pulse Current Trimming of Polysilicon Resistors Trans. On Electron Devices* vol. 42 (1995), pp. 689-696.

Feldbaumer D.W. et al *Theory and application of polysilicon resistor trimming*, Solid State Electronics, Elsevier Science Publishers, vol. 38, No. 11, p. 1861-1869 G.B. 1995 (XP004002629).

Tkachenko, N.N., *Noise transformation that accompanies the trimming of polycrystalline silicon layers*, Solid State Phenomena, vols. 51-52, p. 391-398 Switzerland 1996 (XP001182251).

Mandurah M.M. et al. *Dopant segregation in polycrystalline silicon*, Journal of Applied Physics, vol. 51, No. 11, pp. 5755-5763 U.S.A. 1980 (XP002254692).

* cited by examiner

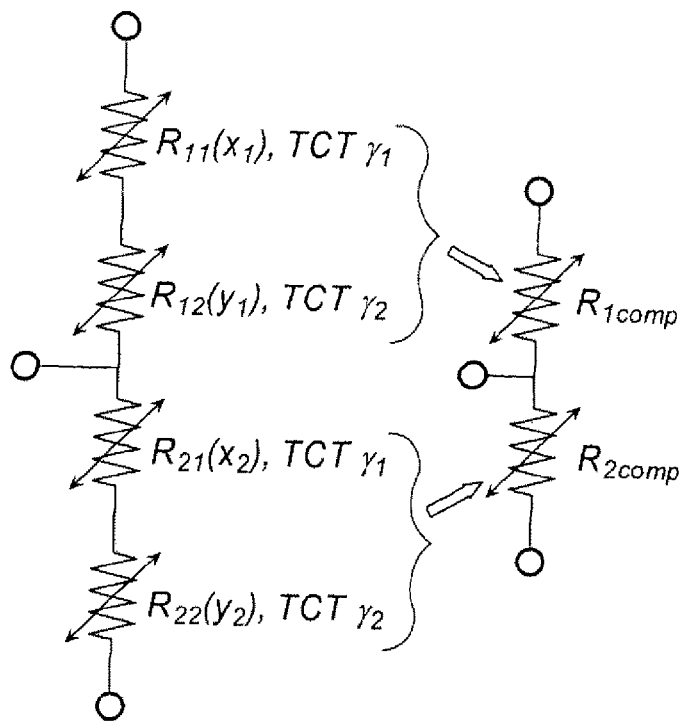
Fig. 7
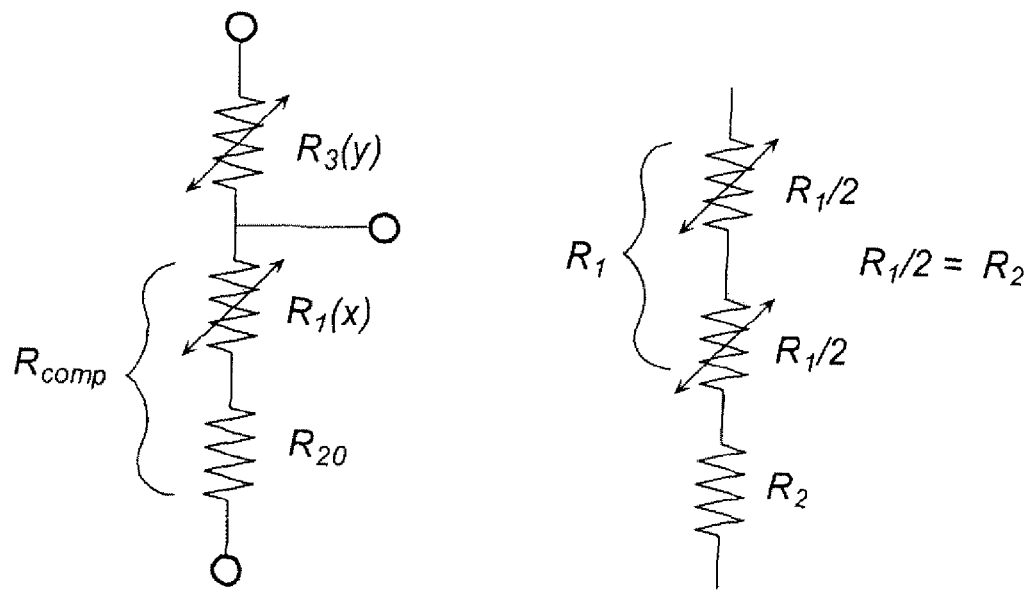
Fig. 8
Fig. 9

COMPENSATING FOR LINEAR AND NON-LINEAR TRIMMING-INDUCED SHIFT OF TEMPERATURE COEFFICIENT OF RESISTANCE

CROSS-REFERENCE TO RELATED APPLICATIONS

This application is a continuation in part of International Application No. PCT/CA2005/001,440 filed 21 Sep. 2005 and also claims priority from U.S. provisional application 60/611,274 filed Sep. 21, 2004; 60/784,785 filed Mar. 23, 2006; 60/784,784 filed Mar. 23, 2006; and 60/784,783 filed Mar. 23, 2006. The contents of said applications are incorporated herein by reference as though set out at length herein.

TECHNICAL FIELD

The invention relates to resistors and resistor networks which are electro-thermally trimmable, and more specifically, to thermal trimming of these resistors to adjust resistance, temperature coefficient of resistance and relative temperature coefficient of resistance.

BACKGROUND OF THE INVENTION

In working with resistors referred to as "precision resistors", it is advantageous to have the capability to precisely adjust the resistance value. It is also advantageous to precisely adjust the temperature coefficient of resistance (TCR) of such a resistor.

It is known that joint and independent adjustment of resistance and TCR can be achieved for compound resistors containing a first portion with a first resistance value and a positive TCR and a second portion with a second resistance value and a negative TCR (U.S. Pat. No. 4,079,349, U.S. Pat. No. 4,907,341, U.S. Pat. No. 6,097,276). Independent trimming of these two portions of the compound resistor results in the adjustment of the total resistance and of the TCR of the compound resistor. The trimming technique is based on a process of cutting the resistive material such as by laser beam cutting or ultrasonic probe cutting or others. The material properties, namely the TCR, of the bulk resistor material, remain substantially constant during this trimming process, since only the shapes of the resistor portions are being trimmed.

Another non-laser trimming technique is known to adjust the resistance of thin film resistors. This technique is based on thermal trimming of a resistor made from a thermally mutable material. Resistor trimming is achieved by heating using electric current pulses passed through the resistor itself or through an adjacent auxiliary heater (U.S. Pat. No. 4,210,996, 5,635,893, 5,679,275). Instead of direct physical removal of portions of the resistor material as is done in laser trimming, thermal trimming directly modifies the physical properties of the material such as resistivity and TCR.

It was reported that resistance trimming is accompanied by significant changes of TCR (K. Kato, T. Ono Changes in Thermal Coefficient of Resistance of Heavily Doped Polysilicon Resistors Caused by Electrical Trimming Jpn. J. Appl. Phys. Vol. 35 (1996), pp. 4209-4215; D. Feldbaumer, J. Babcock, C. Chen Pulse Current Trimming of Polysilicon Resistors Trans. On Electron Devices vol. 42 (1995), pp. 689-696; U.S. Pat. No. 6,306,718). As a measure of this effect, the term "Temperature Coefficient of Trimming" (TCT) is used hereinafter in this text and defines a change of TCR per fraction of trimming, which is a trimming-induced shift of TCR. For example, a TCT of −100 ppm/K/trim-fraction means that trimming resistance down by a trim fraction of 0.01 (1%) results in a shift of TCR equal to 10 ppm/K in the opposite direction from the direction of the trim (in this case an increase of 10 ppm/K). It is known experimentally that for polysilicon resistors, TCT is typically negative (increase in TCR with decrease of resistance), with its value dependent on type of dopant and doping level.

Non-zero TCT generates a new problem (not existing in typical cutting-based trimming techniques), which can be illustrated by the following example. Consider a resistor divider consisting of two trimmable resistors with the same initial TCR, and TCT=−2000 ppm/K/trim-fraction. If the resistance ratio is adjusted by trimming one of the resistors "down" by 10%, the accompanying change in relative TCR (RTCR) may reach 200 ppm/K. While resistance matching can potentially be done very precisely using thermal trimming (better than 0.01-0.1%), variation of ambient temperature in the range of ±50° C. can make the divider voltage very unstable, with resistance ratio drift reaching ±1%.

Near-zero TCR of the resistor is often desirable because it gives near-zero resistance drift with variation of ambient temperature. One of the problems of compound resistors consisting of two portions with positive and negative TCR is that near-zero TCR of the whole resistor does not mean near-zero TCR of each individual portion.

Thermally-trimmable resistors feature electrically-driven trimming, may be done at any practical stage in the manufacturer-to-user chain (including after packaging), and once trimmed, they are purely-passive components. However, they may also have constraints on bi-directionality of trimming. These types of resistors may often be more easily trimmable in one direction than another. For example, certain thermally-trimmable polysilicon resistors may be readily trimmed down (in the direction of decreasing resistance), from its as-manufactured resistance value ($R_{as-mfr}$), by tens of percent of $R_{as-mfr}$, but after such a trim-down, may have only limited trim-up (recovery) range. Other trimming characteristics also exist.

Joint and independent adjustment of resistance and TCR can be achieved for compound resistors containing a first portion with a first resistance value and a positive TCR and a second portion with a second resistance value and a negative TCR. Independent trimming of these two portions of the compound resistor results in the adjustment of the total resistance and of the TCR of the compound resistor.

In an in-circuit trimming application, limitations to full bi-directionality significantly constrain what can be done, and/or constrain trimming performance (e.g. speed, precision, range). For example, if a single trimmable resistor (any trimming method), is trimmable only in one direction, then one must be more conservative in seeking the $V_{out}$ target. One must approach more slowly, to make sure that circuit settling times are accounted for, and one must be mindful of the quantization of the resistance trim, since the next trim may jump too far. Another example, if more than one trimmable resistor is used, then the optimal position of one resistor may depend on the position of the other, and vice-versa, but trims must be done sequentially, and so an individual trim of one resistor may reach an interim (non-optimal) target while irreversibly overshooting the optimal target (which may not be known until another resistor (or resistors) has reached its optimal position, or close to its optimal position).

The objects of the present invention include, without limitation, overcoming above described limitations.

SUMMARY OF THE INVENTION

The present invention includes systems and methods meeting the foregoing objects and also includes enhanced resistor and circuit products and higher level assemblies made or processed thereby.

An embodiment of the present invention compensates (or minimizes) RTCR (TCR mismatch) resulting from non-zero TCT of a thermally trimmable resistor network by constructing a compound resistor from at least two resistive portions having different resistance and TCR values.

An embodiment of the present invention achieves independent adjustment of resistance ratio and RTCR of a thermally trimmable resistor network, the RTCR being adjusted to near-zero or intentionally to a non-zero value. A trimmable resistor network with adjustable non-zero RTCR can be used in various different applications where temperature drift of circuit parameters (offset, gain, sensitivity and others) is needed.

According to one aspect of the invention a method for design and production of a trimmable resistive component is provided to afford a predetermined behavior of temperature coefficient of resistance (TCR) as a function of trimming.

The method comprises the steps of selecting materials to form a compound resistor having at least a first portion and a second portion, at least said first portion including a first resistor $R_1$, that is thermally trimmable and has a first resistivity, a first temperature coefficient of resistance value $\alpha_0$, and a trimming-induced shift of temperature coefficient $\gamma_1$, which defines a change in said $\alpha_0$ per fraction of trimming x of said first resistivity, said second portion including at least a second resistor, $R_2$ having a second resistivity value, and a second temperature coefficient of resistance value $\beta_0$; determining how said TCR value of said resistive component changes as at least said first portion is trimmed, by generating a function of said TCR versus trim-fraction x, with $R_1$ and $R_2$ as variable parameters and $\alpha_0$, $\beta_0$, and $\gamma_1$ as fixed parameters; and selecting specific values for $R_1$ and $R_2$ or $R_1/R_2$ to provide said resistive component with said predetermined behavior of said TCR, thereby incorporating an effect of said $\gamma_1$ in said resistive component, with $\gamma_1$ being (a) a constant or (b) a function, $\gamma_1$ (x), representing fixed behavior of $\gamma_1$ as a function of trim-fraction x.

The method may be adapted in various ways preferred for certain usages: to further define the change in $\alpha_o$ per fraction of trimming by a variation of $\gamma_1$ as a function of x; to establish resistance values and/or a ratio of resistance of the two portions such that the compound resistor provides a substantially flat TCR vs. trim-fraction relationship in a useful portion of the range of trimming; to provide one or more additional resistors to shift untrimmed value of TCR of the compound resistor, to a greater or lesser value without changing the shape of the curve of TCR vs. trim-fraction of the compound resistor; to also trim a second (or third, etc.) portion of the compound resistor having a value $\gamma_2$ of trimming-induced shift of temperature coefficient defining a change in $\beta_o$ per fraction of trimming y, to thereby establish two curves of variation of TCR of the resistive component based on two substantially different curves of TCR variation with trim fraction x and trim fraction y, the two curves having slopes of different signs. Thermal isolation can be used for the first and second portion together and/or to isolate them from each other. The method may be adapted to provide a predetermined behavior wherein said second portion is part of an application specific circuit, and said selecting specific values for $R_1$ and $R_2$ or $R_1/R_2$ comprises selecting said specific values to provide a predetermined behavior of a temperature coefficient of voltage across said second portion as a function of trimming said first resistor.

There is also provided through the invention;

(a) a family of trimmable resistive components incorporating the results of the foregoing methods, (b) a family of application specific circuits incorporating said components and/or methods, and (c) a family of methods complementing the methods of the preceding paragraph, e.g. effecting trim or trim-capable components, circuits prior to and/or after full production and installations of the components and/or circuits.

This trimmable resistive component has a predetermined behavior of temperature coefficient of resistance (TCR) as a function of trimming and comprises: a first portion composed of a first resistor that is thermally trimmable and has a first resistivity, a first temperature coefficient of resistance value $\alpha_0$, and a trimming-induced shift of temperature coefficient $\gamma_1$, which defines a change in said $\alpha_0$ per fraction of trimming x of said first resistivity; and a second portion composed of at least a second resistor having a second resistivity value and a second temperature coefficient of resistance value $\beta_0$, said first portion and said second portion having specific values for $R_1$ and $R_2$ or $R_1/R_2$ to provide said resistive component with said predetermined behavior of said TCR value; wherein said predetermined behavior of said TCR is defined by a function of said TCR versus trim-fraction x, with $R_1$ and $R_2$ as variable parameters and $\alpha_0$, $\beta_0$, and $\gamma_1$ as fixed parameters, thereby incorporating an effect of said $\gamma_1$ in said resistive component with $\gamma_1$ being (a) a constant or (b) a function, $\gamma_1$ (x), representing fixed behavior of $\gamma_1$ as a function of trim-fraction x.

The basic trimmable resistive component may have one or more of the product modifications corresponding to the above cited modifications of methodology of making and using such component.

Such component or component(s) may be used in application specific circuits with one or more adjustable parameters (not necessarily limited to trimmable resistance per se) comprising at least one compound resistor including: a first portion comprising a first resistor, $R_1$, that is thermally trimmable and has a first resistivity, a first temperature coefficient of resistance (TCR) value $\alpha_0$, and a trimming-induced shift of temperature coefficient $\gamma_1$, which defines a change in said $\alpha_0$ per fraction of trimming x of said first resistivity; and a second portion comprising a second resistor, $R_2$, having a second resistivity value and a second TCR value $\beta_0$, said first portion and said second portion having specific values for at least one of $R_1$ and $R_2$ and $R_1/R_2$ to provide said compound resistor with said predetermined behavior of said TCR value; circuitry for said application connected to said at least one compound resistor; wherein said predetermined behavior of said TCR is defined by a function of said TCR versus trim-fraction x, with $R_1$ and $R_2$ as variable parameters and $\alpha_0$, $\beta_0$, and $\gamma_1$ as fixed parameters, thereby incorporating an effect of said $\gamma_1$ in said compound resistor, $\gamma_1$ being (a) a constant or (b) a function, $\gamma_1$ (x), representing fixed behavior of $\gamma_1$ as a function of trim-fraction x.

In a preferred embodiment, trimming algorithms such as those disclosed in PCT publications WO04/097859, WO04/097860, and WO04/083840 are used. In addition, control circuitry such as that described in PCT publications WO03/023794 and WO04/097859 to trim resistors is also preferred.

In accordance with a further broad aspect of the present invention, it can be used for making precision adjustable resistors and resistor networks. Electro-thermal trimming used for the adjustment in general changes not only resistance value but also TCR of trimmable material. The proposed solutions allow the designer/user to achieve:

resistance adjustment with reduced variation of the resistor's TCR;

resistance ratio adjustment of at least two resistors, along with independent near-zero RTCR adjustment;

resistance ratio adjustment of at least two resistors, along with intentional RTCR adjustment to a substantially non-zero value;

The term "compound resistor" is to be understood as a resistor composed of more than one identifiable resistor, which can have the same or different resistances, resistivity, sheet resistances, trim amounts, and other physical properties.

A "resistive component" can be a single resistance, a network of resistances, multiple resistances where some of the multiple resistances are part of an application circuit, multiple resistances completely integrated into an application circuit, or multiple resistances external to an application circuit. It can also be a compound resistor as defined above.

The analysis done to generate the function can be numerical (when computer-based simulation tools are used), analytical (based on classic electricity laws), or experimental (when set of curves TCR(x) is generated experimentally) and should not be limited to any one of these techniques. It can readily be understood by a person of ordinary skill in the art that basic electrical laws to be used in generating the function as described above can be Ohm's Law (relating current, voltage and resistance in a resistor), Kirchoff's current law (for summing of currents at a node), Kirchoff's voltage law (regarding the sum of voltages around a closed electrical loop), and equations describing how the component values of electrical components (e.g. resistance) vary with temperature.

While the term "resistivity" (units: ohm-cm) is used, it should be understood that "sheet resistance" (units: ohms/square) could also be one of the properties of the materials instead of "resistivity". Starting from "resistivity", one can calculate resistance by multiplying by the length and dividing by the cross-sectional area ($R=\rho*L/A$). However, in practice thin films typical of semiconductor devices may be used in the fabrication processes, and these are described in terms of "sheet resistance", in part because the resistivity may not be constant throughout the thickness of the film, because the layout designer typically may not have control over the vertical dimension (thickness) of the film, and because what can be most easily measured is the "sheet resistance" (a property of the film). One calculates the resistance by multiplying "sheet resistance" by a number of "squares" that compose a resistor trace.

The terms "trim-fraction" and "fraction of trimming" are used interchangeably to mean the fraction of the as-manufactured resistance by which the trim reduces the resistance.

Not used

BRIEF DESCRIPTION OF THE DRAWINGS

Further features and advantages of the present invention will become apparent from the following detailed description, taken in combination with the appended drawings, in which:

FIG. 7 shows a series connection of two compound resistors, each compound resistor consisting of two trimmable resistors;

FIG. 8 shows a series connection of a compound resistor as in FIG. 1, along with a third resistor which is trimmable;

FIG. 9 shows an alternative circuit configuration for a compound resistor, with two resistors forming the first portion and one resistor forming the second portion;

It will be noted that throughout the appended drawings, like features are identified by like reference numerals.

DETAILED DESCRIPTION

Figure 1:
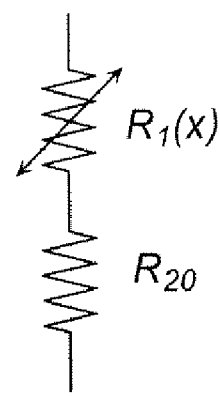
FIG. 1 is a schematic of a compound resistor consisting of two parts connected in series, as per an embodiment of the present invention.

FIG. 1 shows a schematic of a compound resistor consisting of two parts connected in series, a trimmable resistor R₁ with TCR α₀, negative TCT γ₁(x), and ballast resistor R₂₀ (non-trimmable) with TCR β₀. Suppose that resistor R₁ is trimmable in a range of ±15°% from a "middle" resistance value R₁₀:

$$R_1(x) = R_{10}(1+x) \tag{1}$$

where x is the trim fraction and −0.15<x<0.15. The TCR of the resistor R₁ varies as:

$$\alpha(x) = \alpha_0 + \gamma_1(x)x \tag{2}$$

The resistance and TCR of the compound resistor can be expressed as:

$$R_{comp}(x) = R_1(x) + R_{20} \tag{3a}$$

$$\alpha_{comp}(x) = \frac{R_{10}(1+x)(\alpha_0 + \gamma_1(x)x) + R_{20}\beta_0}{R_{10}(1+x) + R_{20}} \tag{3b}$$

It can be shown that the change of TCR with trim of the compound resistor, (the "effective TCT" of the compound resistor), at x=0, $$\frac{d\alpha_{comp}(x)}{dx}$$

equals zero when the resistance ratio k=R₂₀/R₁₀ equals;

$$k = \frac{\gamma_{10}}{\beta_0 - \alpha_0 - \gamma_{10}} \tag{4}$$

where γ₁₀ is the untrimmed value of γ₁(x). Note that this condition, $$\frac{d\alpha_{comp}(x)}{dx} = 0,$$

can be moved to a different value of x by changing the value of the ratio k.

Figure 2:
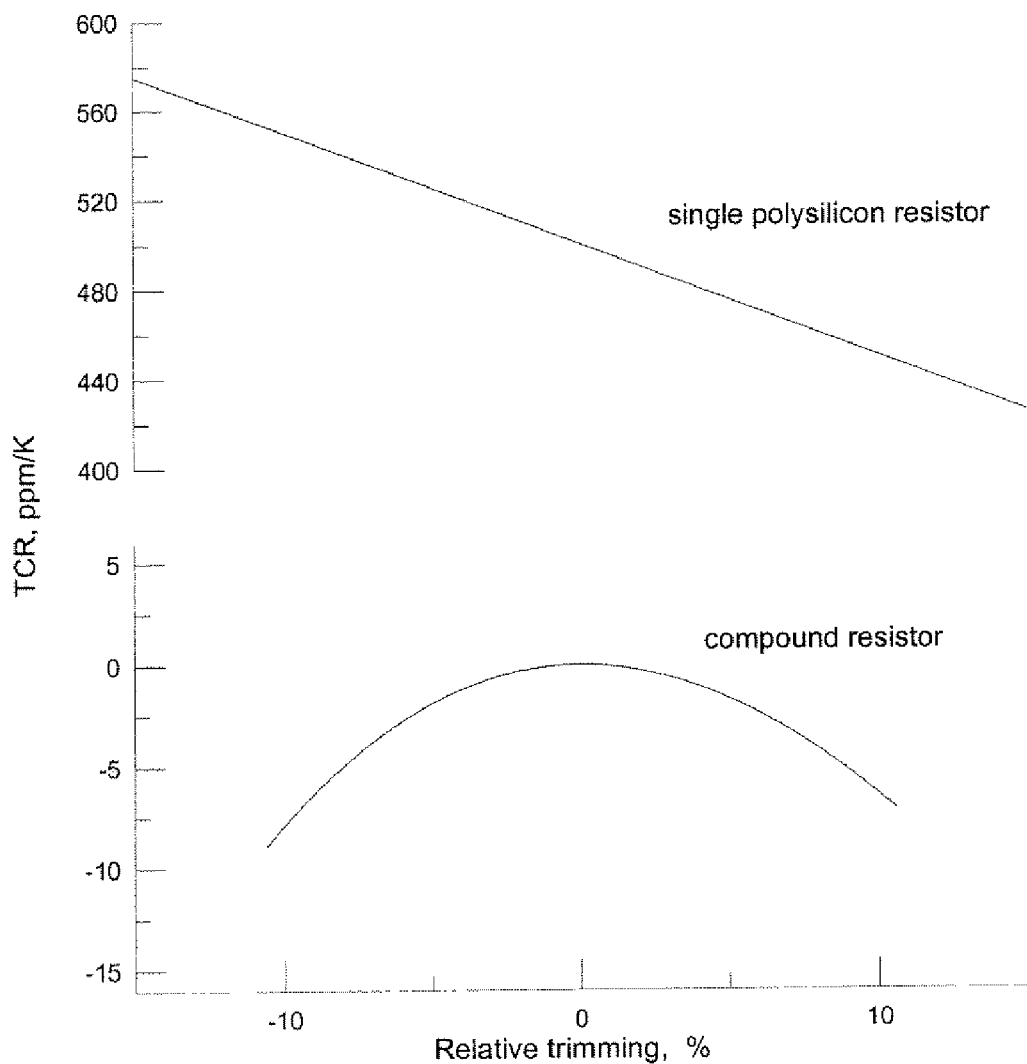
FIG. 2 is a comparative graph of the TCR of a single trimmable resistor $R_1$ and the TCR of a compound resistor as in FIG. 1.

The upper part of FIG. 2 depicts the variation of TCR with x, for a single trimmable resistor R₁, and in the lower part of FIG. 2, the TCR of a compound resistor (such as shown in FIG. 1), as a function of resistance trimming relative to a "middle" value R₁₀. The parameters of the resistors used in this example are: α₀=500 ppm/K, β₀=−1200 ppm/K, γ₁=500 ppm/K/trim-fraction (γ₁ not a function of x in this example). The resistance value of the resistor R₂ used for TCT compensation was calculated from eq. (4): R₂₀=0.417R₁₀. The curve would be different if γ₁ varied significantly with x.

Only positive values of resistance ratio k (eq. (4)) have physical meaning. Therefore TCT compensation is possible only if:

$$\alpha_0 - \beta_0 > -\gamma_1(x) \text{ over the entire desired range of x} \tag{5}$$

Consider the result from the derived equation (4). TCT compensation for a resistor having negative TCT is possible only in the case when the ballast resistor R₂₀ has a more negative TCR than the trimmable resistor. For example, compensation for a trimmable resistor having α₀=1000 ppm/K and γ₁=−500 ppm/K/trim-fraction is possible when the ballast resistor R₂₀ has TCR β₀<500 ppm/K. Another example of possible compensation is α₀=−1200 ppm/K, γ₁=−3000 ppm/K/trim-fraction and β₀<−4200 ppm/K. (Note that we do not consider here the practical realization of a resistor or resistor network with a particular TCR such as −4200 ppm/K).

It also should be understood that the compound resistor has a trimming range narrower than that of a single trimmable resistor by a factor of $1/(1+k)$. That is why the trimming range of the compound resistor in FIG. 2 is $1/(1+0.417)=0.706$, narrower than the trimming range of single resistor $R_1$. To maintain a substantial trimming range for the compound resistor, it is preferable to choose materials for its two portions so that the parameter k is minimized. A simple guideline for this is to use resistor materials with low TCT $\gamma_1(x)$ and high initial TCR difference $\alpha_0-\beta_0$. Application-specific cases where an intentionally narrow trimming range of the compound resistor is needed also may exist. Equations (4,5) can be used to make an effective choice of the resistor materials.

Figure 3:
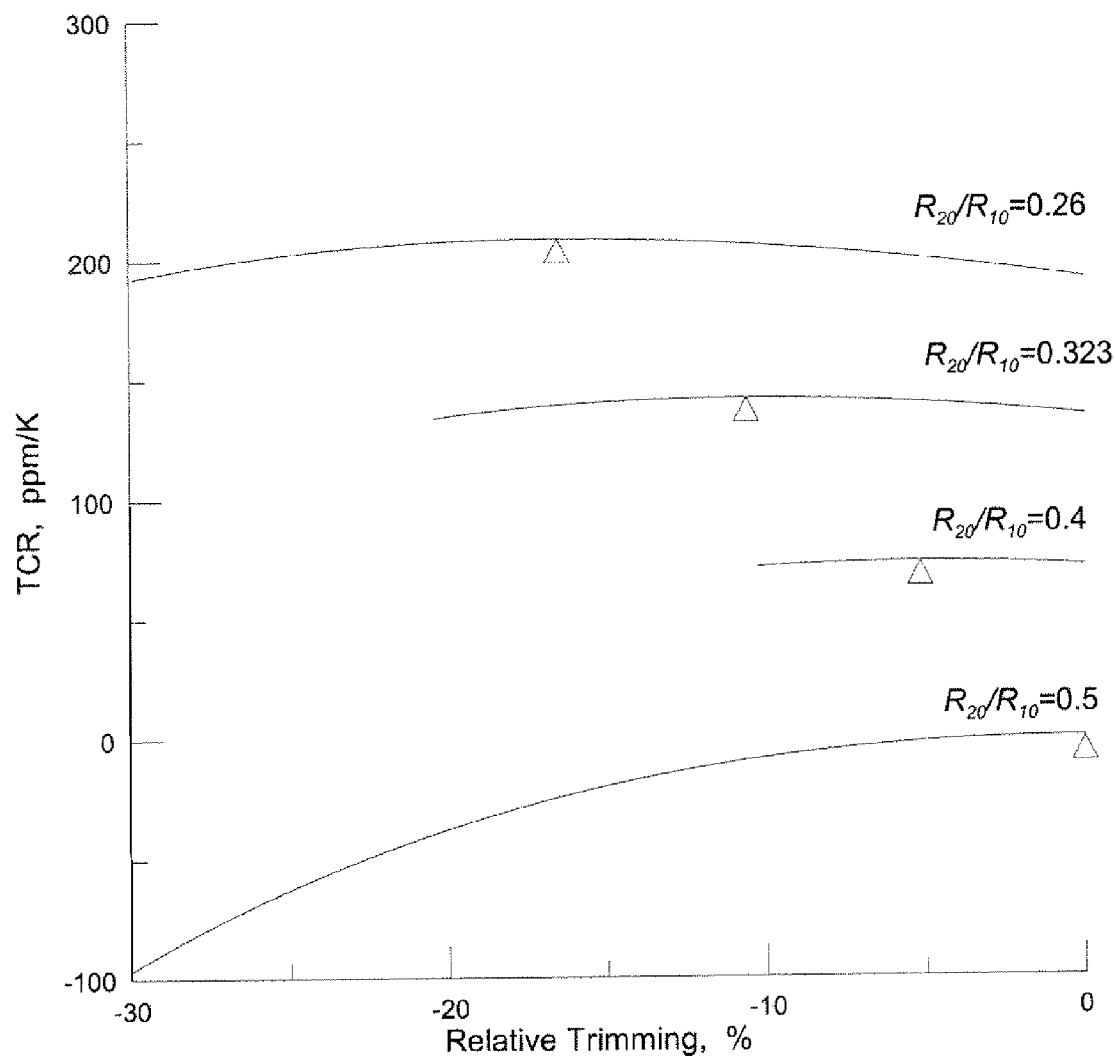
FIG. 3 is a graph showing TCR of a compound resistor configured as shown in FIG. 1 vs. relative trimming of its resistance value, for several different ratios of $R_{20}/R_{10}$.

FIG. 3 is a graph which shows the TCR of the compound resistor vs. relative trimming of its resistance value. The resistor is analogous to those shown in FIG. 1 and has the following as-manufactured parameters for the two resistive portions: resistance $R_{10}$, (note that here $R_{10}$ refers to the as-manufactured resistance, which is at the upper end of the available trim range in this example, as opposed to a "middle" resistance), TCR $\alpha_0=500$ ppm/K, TCT $\gamma_1=-500$ ppm/K/trim-fraction (still constant with x), for the first portion, and correspondingly $R_{20}$ and $\beta_0=-1000$ ppm/K, for the second portion TCT compensation is reached at $k=R_{20}/R_{10}=\gamma_1/(\beta_0-\alpha_0-\gamma_1)=0.5$.

In practice, thermal trimming usually results in reduction of resistance from its as-manufactured value to a certain target value, and the resistance seldom subsequently reaches above the as-manufactured value. It may be preferable to have minimal variation of TCR of the compound resistor in a given desired trimming range. It can also be seen from FIG. 3 that the compound resistor with ratio $R_{20}/R_{10}=0.26$ has better TCR uniformity in a 30% trimming range than the compound resistor with ratio $R_{20}/R_{10}=0.5$ ($\pm 8.5$ ppm/K vs. $\pm 50$ ppm/K). Analogously, compound resistors with ratios $R_{20}/R_{10}=0.4$ and $R_{20}/R_{10}=0.323$ have optimal TCR uniformity in their trimming ranges of 10% and 20%, respectively, (corresponding to $\pm 1$ ppm/K and $\pm 3.5$ ppm/K, respectively). Note that the trim-fractions at which the compound resistor becomes ideally TCT-compensated are located approximately at the middle of the trimming range. These points are designated by triangles in the figure. Specifically at these points, the resistance ratio of the two portions is defined by Eq (6), a modified version of equation (4):

$$\frac{R_{20}}{R_1(x)} = \frac{\gamma_1}{\beta_0 - \alpha(x) - \gamma_1} \tag{6}$$

These specific trim-fractions at which the compound resistor becomes ideally TCT-compensated, can be pre-determined (designed by the user), by proper selection of the resistor values and properties. It should be understood that $R_1(x)$, $\alpha(x)$ are not as-manufactured resistance and TCR of the first portion but its actual values reached at a certain trimming level (at these "predetermined trim-fractions").

A procedure for implementing an embodiment of the method of the present invention is as follows (for a circuit as shown in FIG. 1):

1. The materials are chosen for the two portions of the resistor (with specific sheet resistance and TCR for both portions, and TCT for the first portion).
2. The trimming range required for a given application is chosen.
3. The as-manufactured resistance ratio of two portions is defined (based on the known sheet resistances, TCR's and TCT), such that the compound resistor reaches ideal TCT-compensation (defined by eq. (6)) approximately at the middle of the desired trimming range, thus providing relatively "flat" TCR vs. trimming in that entire desired trimming range.
4. The actual layout of the two resistive portions is designed to reach the required absolute as-manufactured resistance value. (Note that in step (3) we define only the resistance ratio.)

The above examples examine cases where $\gamma_1$ is a constant (does not vary with x). Now consider an example where TCT is a function of x—$\gamma_1$ is $\gamma_1(x)$. Consider a series-compound resistor, consisting of two parts—first, trimmable resistor with initial resistance $R_{10}=10000\Omega$, TCR $\alpha_0=320$ ppm/K and second non-trimmable resistor connected in series, having resistance $R_{20}=0.23 \cdot R_{10}$ (k=0.23) and TCR $\beta_0=-1300$ ppm/K. TCT of the first resistor is of the form:

$$\gamma_1=\gamma_{10}(1+\xi x), \tag{7}$$

where $\xi$ is the 2nd-order coefficient describing non-linear variation of TCR vs trimming, such that:

$$\alpha(x)=\alpha_o+\gamma_{10}(1+\xi x)x \tag{8}$$

Figure 23:
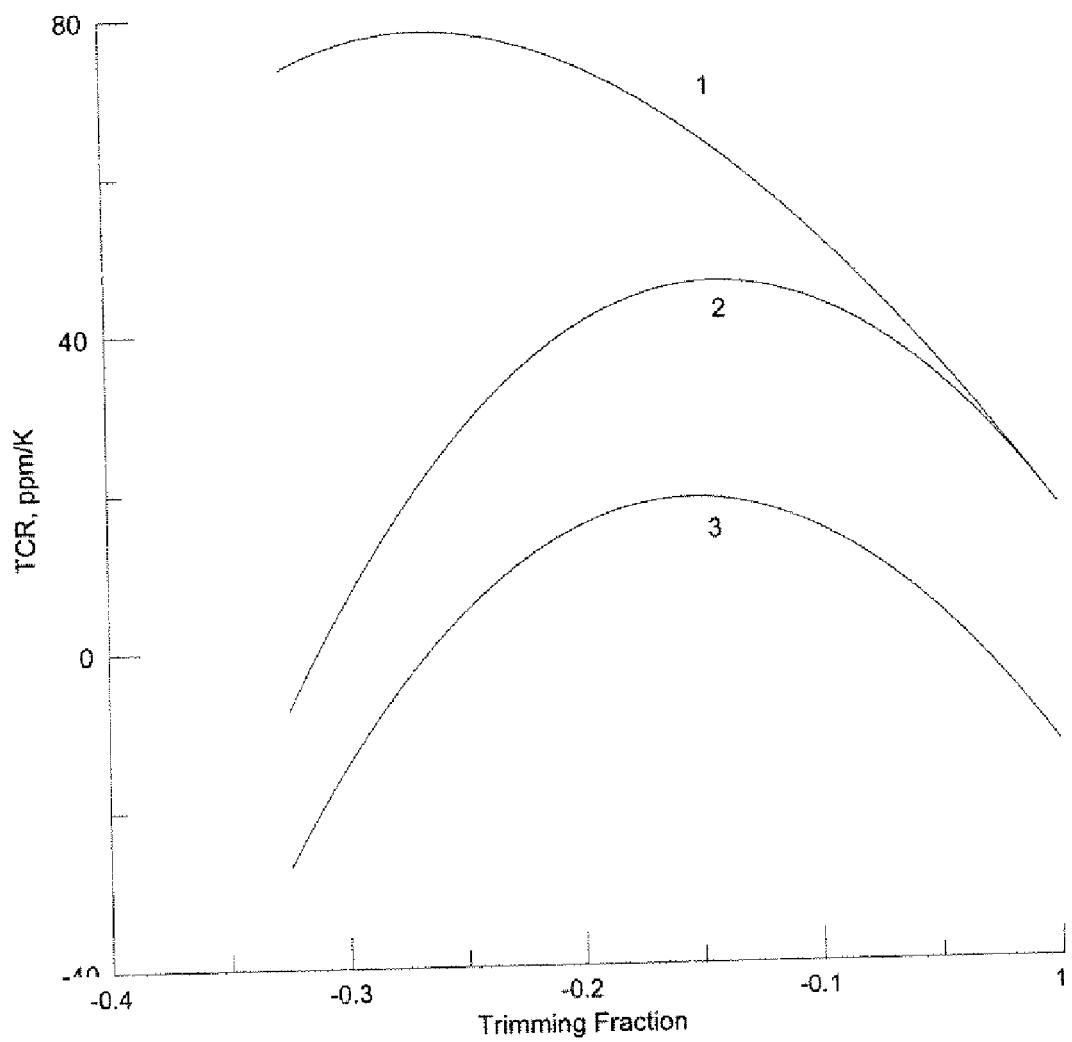
FIG. 23 is a graph showing TCR of a series-compound resistor configured as shown in FIG. 1 vs. relative trimming of its trimmable portion, where $\xi=0$ for curve 1, but non-zero for curves 2 and 3.

For curve 1 in FIG. 23, $\gamma_{10}=-700$ ppm/K, and the coefficient $\xi=0$.

Curve 2 in FIG. 23 represents the variation of TCR with trimming fraction for the described compound resistor with significant variation of $\gamma_1$ with x, $\xi=1$. The behavior of the TCR of the compound resistor vs trim fraction is quite different from the case where $\xi=0$. In such cases, where there is significant non-linearity in TCT, the "optimum" initial ratio of as-manufactured resistances $R_{20}/R_{10}$, may be quite different from that predicted by Eq. 4 or Eq. 6 or the procedure described a few paragraphs above, and should be based on Eq. 3b. For this case, a somewhat modified procedure would be:

1. The materials are chosen for the two portions of the resistor (with specific sheet resistance and TCR for both portions, and $\gamma_1(x)$ for the first portion).
2. The trimming range required for a given application is chosen.
3. The as-manufactured resistance ratio of the two portions is defined (based on the known sheet resistances, TCR's and $\gamma_1(x)$), such that the compound resistor reaches ideal TCT-compensation approximately at the middle of the desired trimming range, thus providing relatively "flat" TCR vs. trimming in that entire desired trimming range. In order to find this ratio, $R_{20}/R_{10}$, one can solve analytically Eqs. 3-4 (if an analytical form is available), or, more generally, simulate a set of curves "TCR vs. trim-fraction" using equation 3b, and choose that ratio which provides the optimal "flat" TCR behavior vs. trim,
4. The actual layout of the two resistive portions is designed to reach the required absolute as-manufactured resistance value. (Note that in step (3) we define only the resistance ratio.)

Figure 25:
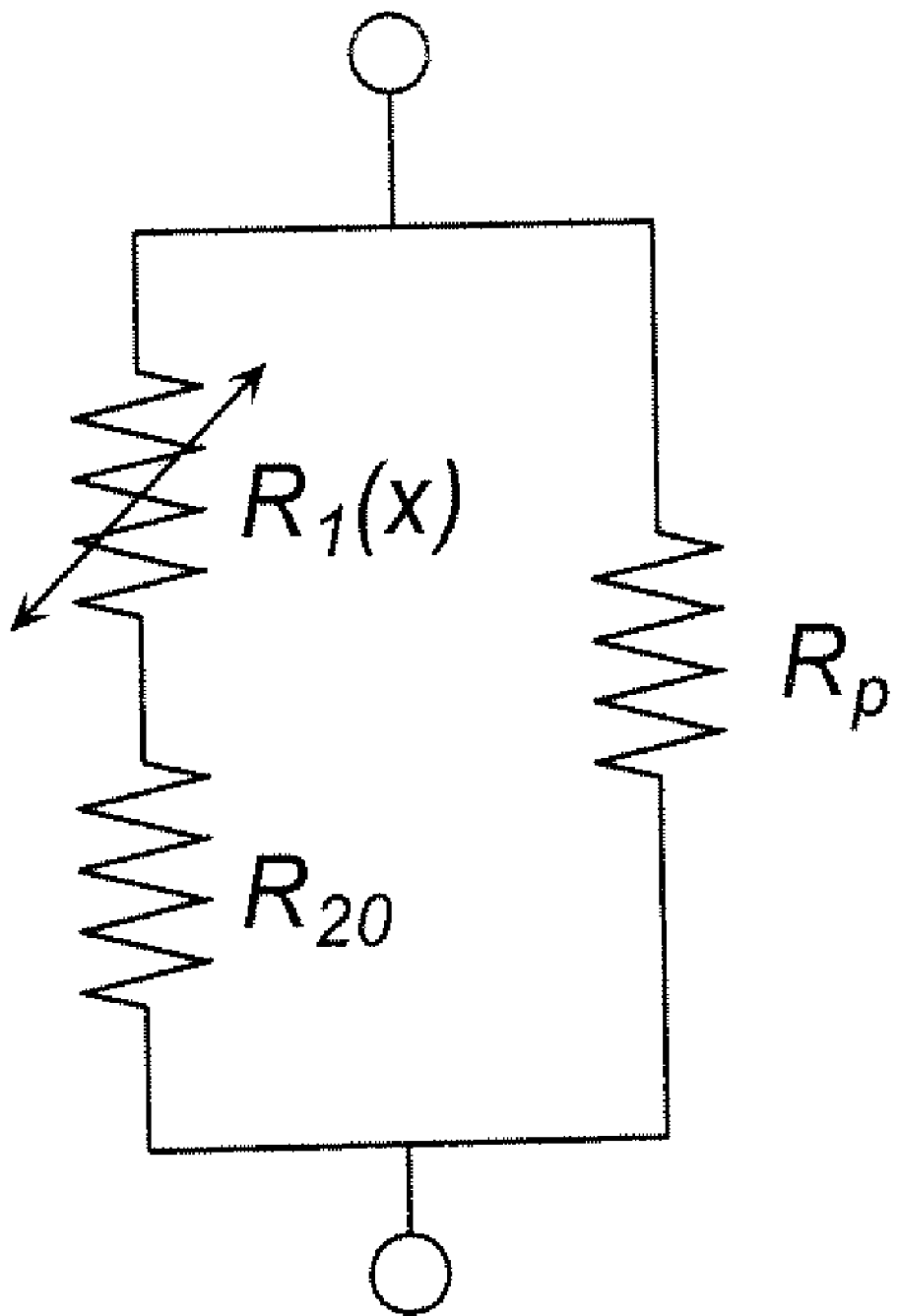
FIG. 25 shows a series-connected compound resistor with an additional $R_p$ in parallel.

Note that in FIG. 23, Curve 1 or Curve 2, the TCR of the compound resistor remains positive in almost the entire trimming range. To shift TCR closer to zero without appreciably changing the shape of the TCR vs. trim, one can connect an additional resistor $R_p$ (which need not be trimmable), in parallel with the original series-connected two resistive pants, as illustrated in FIG. 25. Curve 3 in FIG. 23 shows the TCR vs. trim behavior for the compound resistor with $R_p=k_p \cdot R_{10}=200$ K$\Omega$ ($k_p=20$) and TCR $\beta_p=-500$ ppm/K. With the addition of this $R_p$, the overall TCR of the compound resistor has been shifted closer to zero over its entire trim range. This technique (connection of a third resistive portion in parallel with the other two portions), allows shifting of the entire TCR curve, without appreciably changing the shape of the curve of TCR vs trim, where one or both of the series-connected portions is trimmed. This is effective whether the TCT behavior is linear or non-linear. The additional resistor which shifts the curve of TCR vs. trim-fraction can be a resistor or any other resistive component such as an active electronic component or passive electronic component.

If $R_p$ has negative TCR, then it will act to make the overall TCR of the compound resistor more negative. In the above example, this moves the overall TCR closer to zero. On the other hand, if $R_p$ has a positive TCR, then it will act to make the overall TCR of the compound resistor more positive. In the context of the above example, this would move the overall TCR of the compound resistor farther above zero. In this way, one may use such $R_p$ to adjust the overall TCR vs. trim curve of the compound resistor in a desired manner.

Similarly, one may add a portion of resistance ($R_s$) in series with a parallel-compound resistor to adjust the overall TCR of the compound resistor. While in the above-described case of adding $R_p$ to a series-compound resistor, the value of $R_p$ should be relatively large in order to not disturb the shape of the curve of TCR vs trim, here the value of $R_s$ should be relatively small compared to the parallel-connected portions, if one wants to avoid disturbing the shape of the curve of TCR vs trim.

Figure 4:
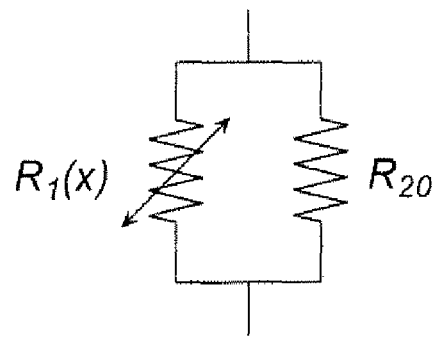
FIG. 4 is a schematic of a compound resistor in a parallel configurations as per another embodiment of the present invention.

FIG. 4 shows a schematic of the analogous compound resistor with two resistive parts connected in parallel, instead of in series. The resistance of the compound resistor and its TCR can be found as:

$$R_{comp}(x) = \frac{R_1(x)R_{20}}{R_1(x) + R_{20}} \quad (9a)$$

$$\alpha_{comp}(x) = \frac{\alpha(x)R_2 + \beta_0 R_1(x)}{R_1(x) + R_{20}} \quad (9b)$$

where $R_1(x)$ and $\alpha(x)$ are defined by eqs. (1) and (2).

Assuming that at x=0 $\gamma_1(x)=\gamma_{10}$, TCT compensation for this parallel-compound resistor at x=0 is reached at $$k = \frac{\alpha_0 - \beta_0 - \gamma_{10}}{\gamma_{10}} \quad (10)$$

Compensation of negative TCT of the trimmable resistor is possible when the ratio $k=R_{20}/R_{10}$ is positive, and $$\beta_0 - \alpha_0 > -\gamma_1(x) \text{ over the entire desired range of x}. \quad (11)$$

The compound resistor has a trimming range narrower than that of a single trimmable resistor by a factor of k/(1+t). Therefore, to maintain a substantial trimming range for the compound resistor, it is again preferable to choose materials with high TCR difference $\beta_0-\alpha_0$ so as to maximize the parameter k.

Figure 5:
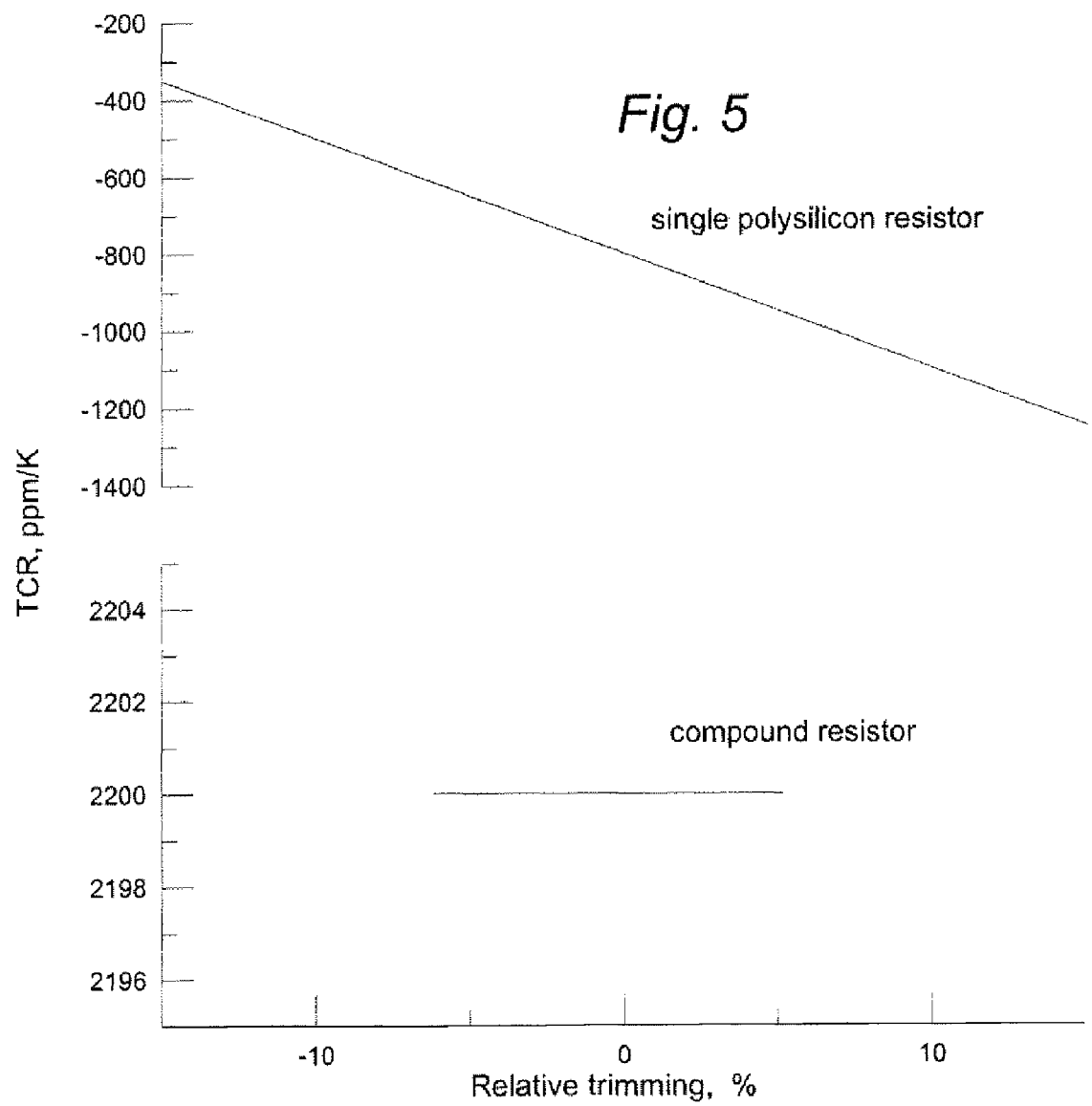
FIG. 5 is a comparative graph of the TCR of a single trimmable resistor $R_1$ and the TCR of a compound resistor as in FIG. 4.

Similarly to FIG. 2, FIG. 5 plots the TCR of a single trimmable resistor $R_1$ and the TCR of a compound resistor composed of two resistors connected in parallel, as a function of resistance trimming, relative to its "middle" value $R_{10}$. The parameters of the resistors in this example are: $\alpha_0$=−800 ppm/K, $\beta_0$=4000 ppm/K, $\gamma_1$=−3000 ppm/K/trim-fraction. The resistance value of the resistor $R_{20}$ used for TCT compensation and calculated from eq. (10) equals $0.6R_{10}$. The trimming range of the compound resistor is narrower than for single resistor $R_1$ by a factor 0.6/(1+0.6)=0.375 and reaches (±15%)·0.375=±5.6%.

Figure 24:
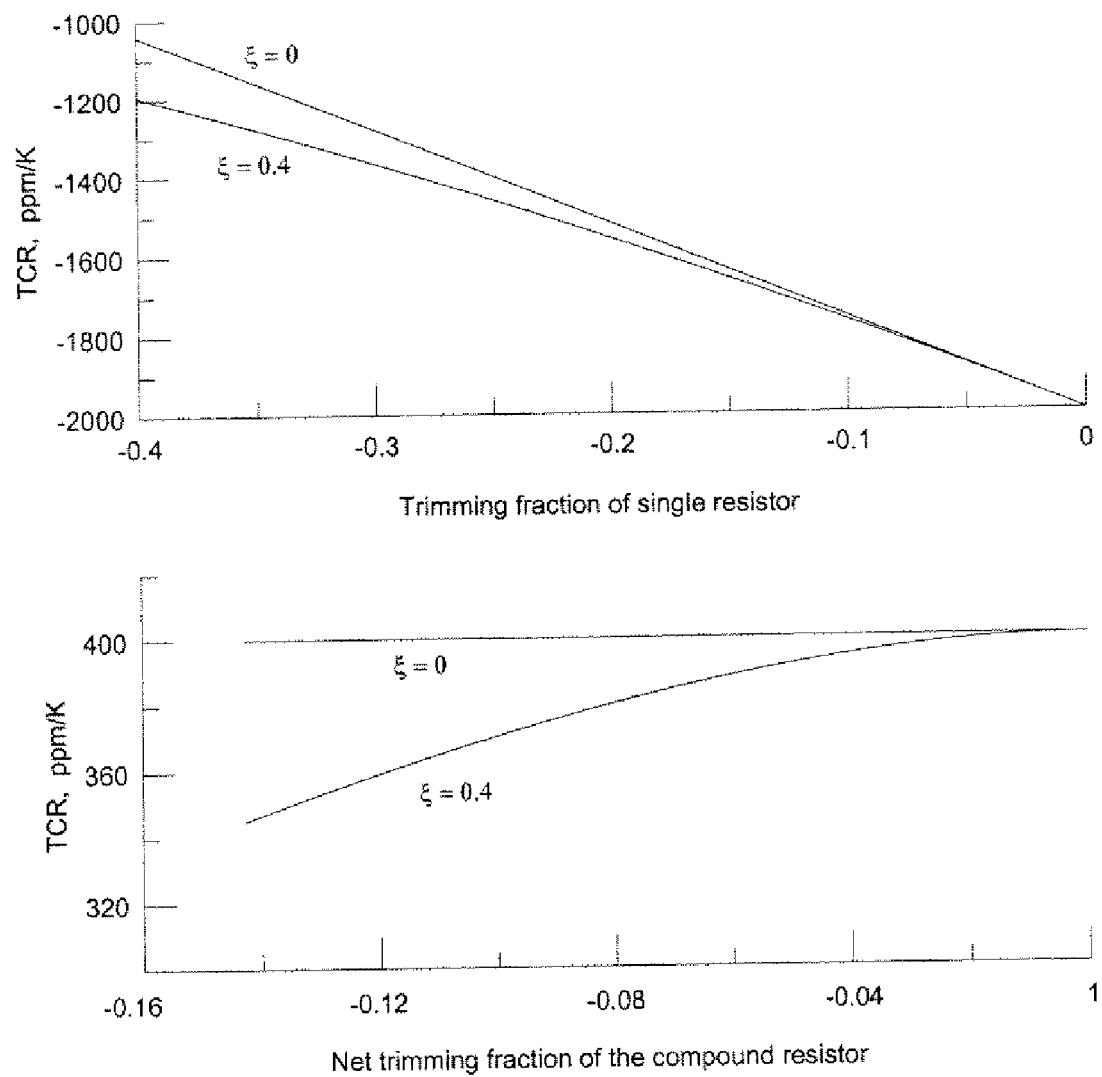
FIG. 24 shows TCR of a parallel-compound resistor configures as shown in FIG. 4, as a function of trimming fraction of the trimmable portion (−0.4<x<0), for the single trimmable portion (upper graph), and for the compound resistor (lower graph)

As with the series-connected compound resistor, again, non-linearity of TCT can make a significant difference in the analysis and choice of "optimal" as-manufactured ratio of resistances. FIG. 24 shows TCR as a function of trimming fraction of the trimmable portion (−0.4<x<0), for the single trimmable portion (upper graph) and for the parallel compound resistor (lower graph) as a function of net trimming fraction of the parallel-compound resistor.

Trimmable part: $\alpha_o$=−2000 ppm/K, $\gamma_1=\gamma_{10}(1+\xi x)$, where $\gamma_{10}$=−2400 ppm/K, and $\xi$ is the $2^{nd}$-order coefficient describing non-linear variation of TCR vs. trimming, such that: $\alpha(x)=\alpha_o+\gamma_{10}(1+\xi x)x$.

Passive Part Connected in Parallel to the Above Trimmable Portion:

$\beta_0$=1200 ppm/K; $R_2=R_1*0.3333$.

The curves in FIG. 24 show that the introduction of non-linearity of TCT ($\xi$=0.4 instead of $\xi$=0) changes significantly the behavior of TCR for the compound resistor.

It should be understood that in cases where the variation of resistance with temperature is or may be non-linear, where such non-linearity may be significant, then the procedures can be applied, while taking account of these non-linearities (for example, taking account of the non-linearities in the targets of resistance and variation of resistance with temperature).

The examples below demonstrate the invented techniques applied to various cases and application-specific circuits. For simplicity, they have addressed the case where $\gamma_1$ does not vary significantly with trim-fraction of any trimmable portion(s). It will be readily evident to one skilled in the art that these analyses can be extended to the ease where gamma does vary significantly with trim-fraction, and that experimental measurements combined with mathematical simulation can provide the user with enough guidance to find optimal sets of parameters for given applications.

The above-described compound trimmable resistors with compensated TCT can be used in designing various resistor networks. For example a resistor divider can be built from two TCT-compensated trimmable resistors. Resistance ratio adjustment of this divider can be performed with near-zero RTCR variations as wilt be explained further below.

It is known from prior art that thermally mutable materials, for example polysilicon doped with different types of dopants, may have significantly different TCT. In particular, it was reported that polysilicon doped with Boron has much lower TCT than polysilicon doped with Arsenic (D. Feldbaumer, J. Babcock, C. Chen, Pulse Current Trimming of Polysilicon Resistors, Trans. on Electron Devices, vol. 42 (1995), pp. 689-696). Polysilicon samples doped with one type of dopant but at different doping levels also may have different TCT (U.S. Pat. No. 6,306,718).

Thermally trimmable single resistors with different TCR and TCT are proposed to be used in a compound resistor to provide independent adjustment of resistance value and TCR. Consider a compound resistor constructed from two resistors in series analogous to those shown in FIG. 1 but with the second resistor also being trimmable. Consider an example where TCR and TCT of the two resistive portions are: $\alpha_0$=5000 ppm/K, $\gamma_1$=500 ppm/K/trim-fraction for the first resistor, and $\beta_0$=−1000 ppm/K, $\gamma_2$=−3000 ppm/K/trim-fraction for the second resistor. Each of the two single resistors are trimmable as $R_1(x)=R_{10}(1+x)$ and $R_2(x)=R_{20}(1+y)$, where x and y are the respective trimming fractions. The compound resistor is TCT-compensated (by trimming of the first resistive portion) when the resistance ratio is $k=R_{20}/R_{10}=\gamma_1/(\beta_0-\alpha_0-\gamma_1)=0.5$.

Figure 6:
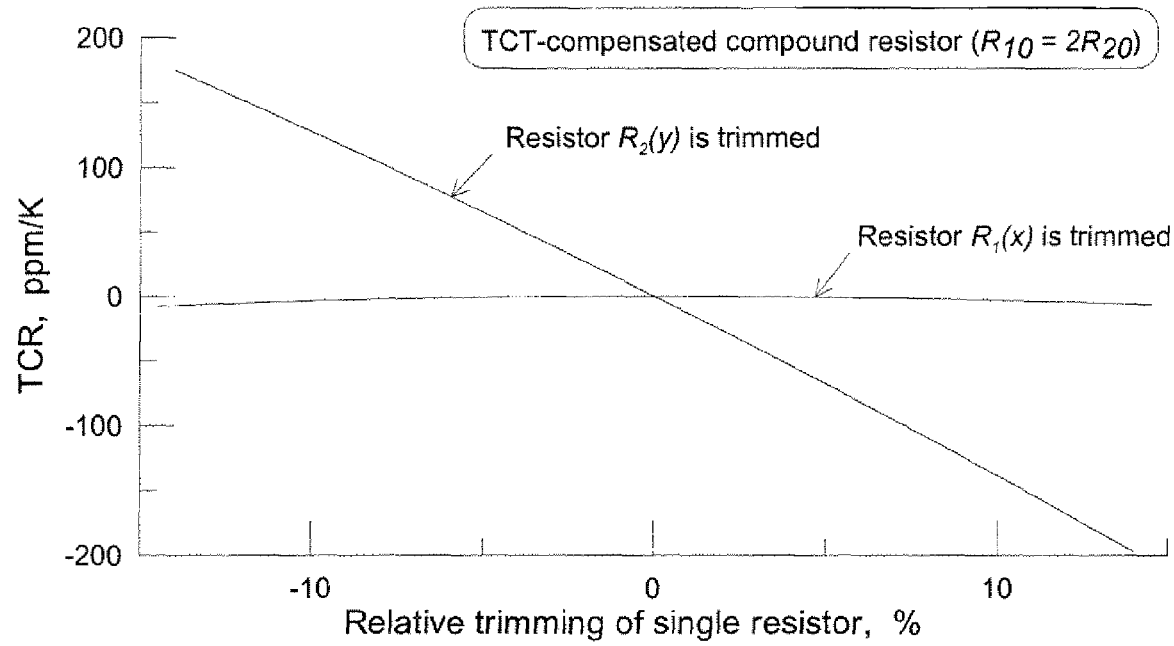
FIG. 6 is a graph which shows the dependence of the TCR of a compound resistor $R_{comp}$, composed of two trimmable portions in series, $R_1(x)$, $R_2(y)$, as a function of relative trimming of the compound resistor.
Figure 6:
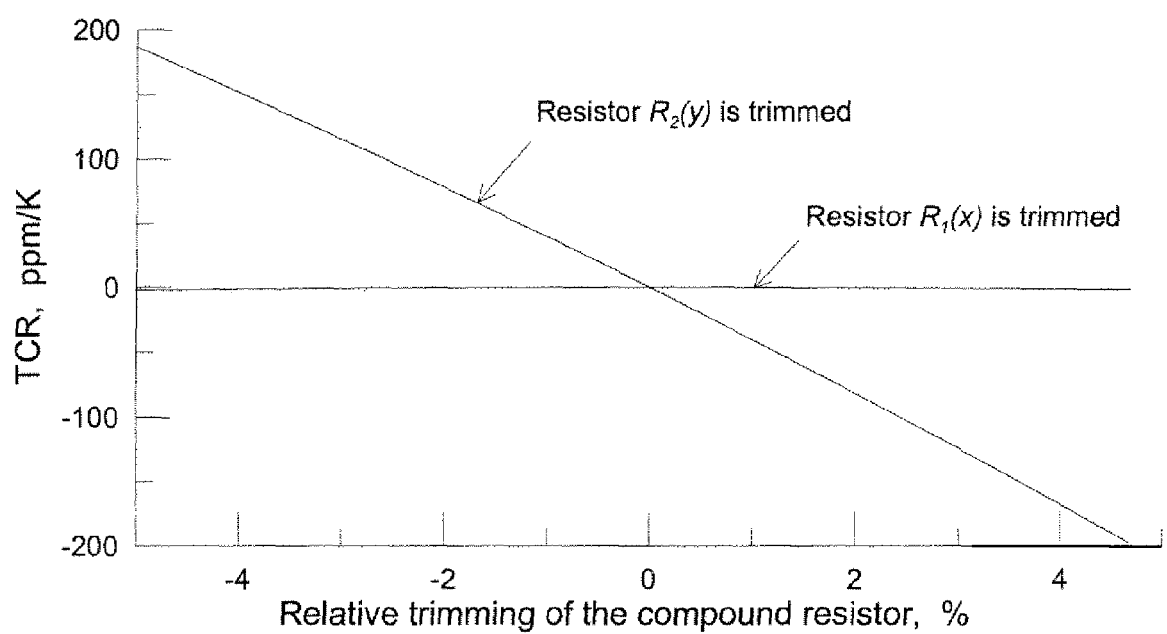

FIG. 6 shows the dependence of the TCR of this series-connected compound resistor $R_{comp}$ as a function of its relative trimming. When resistor $R_1(x)$ is trimmed by fraction x, the TCR of the compound resistor remains almost constant while its total resistance, $R_{comp}$, changes. Meanwhile trimming of the resistor $R_2(y)$ by fraction y results in a significant change in the TCR of $R_{comp}$, with a slope of approximately –40 ppm/K per 1% of trimming of the compound resistor, or –13 ppm/K per 1% of trimming of the resistor $R_2$. The possibility of trimming the resistance value of the compound resistor with different slopes of TCR vs. $R_{comp}$ trimming fraction is useful for building resistors with independent adjustment of resistance and TCR, and resistor networks with independent adjustment of resistance ratio and RTCR.

In general, the variations with trim of the temperature coefficients of resistance may be different for the two (or more) trimmable portions. Furthermore, these variations with trim of the temperature coefficients of resistance may each be linear or non-linear, with different coefficients ($\xi$) of non-linearity. In order to achieve trimming of resistance and TCR to independent values, the fundamental requirement is that the two trimmable portions have significantly different variations of TCR with trim-fractions: $[\alpha_0+\gamma_1(x)x]$ must be significantly different from $[\beta_0+\gamma_2(y)y]$. This is not to say that $\gamma_1(x)$ necessarily differs from $\gamma_2(X)$.

Consider a resistor voltage divider consisting of two identical compound resistors ($R_{1comp}/R_{2comp}=1$), each compound resistor having a first portion with TCT $\gamma_1$ and second portion with TCT $\gamma_2$ (shown in FIG. 7). Resistors $R_{11}$ and $R_{21}$ are the "first" resistors within each of the two compound resistors, and are made from the same material with resistance $R_{11}(x_1)=R_1(1+x_1)$, $R_{21}(x_2)=R_1(1+x_2$ and TCR $\alpha_{11}(x_1)=\alpha_0+\gamma_1 x_1$, $\alpha_{21}(x_2)=\alpha_0+\gamma_1 x_2$, where $x_1$ and $x_2$ are relative trimming fractions for each of the "first" resistors in each compound pair. Analogously, the resistance and TCR of resistors $R_{12}$ and $R_{22}$, (the "second" resistors in each compound pair), can be expressed as $R_{12}(y_1)=R_2(1+y_1)$, $R_{22}(y_2)=R_2(1+y_2)$, $\alpha_{12}(y_1)=\beta_0+\gamma_2 y_1$, $\alpha_{22}(y_2)=\beta_0+\gamma_2 y_2$, where $y_1$ and $y_2$ are relative trimming fractions for each of the "second" resistors in each compound pair.

The resistances and TCRs of the compound resistors are then equal to:

$$R_{1comp} = R_1(1+x_1) + R_2(1+y_1) \tag{12a}$$

$$\alpha_{1comp} = \frac{R_1(1+x_1)(\alpha_0+\gamma_1 x_1) + R_2(1+y_1)(\beta_0+\gamma_2 y_1)}{R_1(1+x_1) + R_2(1+y_1)} \tag{12b}$$

$$R_{2comp} = R_1(1+x_2) + R_2(1+y_2) \tag{12c}$$

$$\alpha_{2comp} = \frac{R_1(1+x_2)(\alpha_0+\gamma_1 x_2) + R_2(1+y_2)(\beta_0+\gamma_2 y_2)}{R_1(1+x_2) + R_2(1+y_2)} \tag{12d}$$

Suppose that two compound resistors are TCT-compensated with parameters analogous to those given in the previous example above (see FIG. 6). Independent adjustment of the resistance (voltage divider) ratio $R_{1comp}/R_{2comp}$ and RTCR $\Delta\alpha=\alpha_{1comp}-\alpha_{2comp}$ to specific target values is possible by joint trimming of at least two of the four single resistors in the two compound resistors.

Example 1

Suppose the target resistance ratio is $R_{1comp}/R_{2comp}=0.95$ and target RTCR $\Delta\alpha=0$ ppm/K. An approximate simplified trimming procedure is based on the assumption that trimming of resistors $R_{11}$ or $R_{21}$ does not change TCR of the compound resistors while trimming of the resistors $R_{12}$ or $R_{22}$ changes TCR of the compound resistors linearly with a slope of –13 ppm/K per 1% of trimming of the resistors $R_{12}$ or $R_{22}$ (see FIG. 6). Therefore one could begin by trimming resistor $R_1$, down by $x_1=0.05\cdot(1+k)=0.075$. As a result of this trimming, the TCR of the first compound resistor becomes $\alpha_{1comp}=-2$ ppm/K while the TCR of the second compound resistor remains unchanged ($\alpha_{2comp}=0$).

Next, accurate adjustment would require use of another single resistor to compensate for the small RTCR shift which was caused by trimming $R_{11}$. Resistor $R_{22}$ (whose trimming significantly changes the TCR of the compound resistor), can be used for this purpose.

In general, the desired trimming fractions $x_1$ and $y_2$ can be found by solving the system of two equations derived from Equations (12a-d):

$$\frac{1+k+x_1}{1+k+ky_2} = 0.95 \tag{13a}$$

$$(1+x_1)(\alpha_0+\gamma_1 x_1) + k\beta_0 - (\alpha_0+k(1+y_2)(\beta_0+\gamma_2 y_2))0.95 = 0 \tag{13b}$$

For the above example, the accurate solution is $x_1=-0.074$, $y_1=0$, $x_2=0$, $y_2=0.0015$, ($\alpha_{1comp}=-1.9$ ppm/K, $\alpha_{2comp}=-1.9$ ppm/K).

Example 2

Consider the target: $R_{1comp}/R_{2comp}=0.95$, $\Delta\alpha=-100$ ppm/K. In an approximate simplified trimming procedure, first, resistor $R_{22}$ is chosen for trimming by fraction $y_2=(100$ ppm/K$)/(-13$ ppm/K$)/100=-0.077$ to increase the TCR of the second compound resistor by 100 ppm/K. Then resistor $R_{11}$ is trimmed by fraction $x_1$ to reach the target resistance ratio: $x_1=-0.1112$. An approximate solution: $x_1=-0.112$, $y_2=-0.077$ ($\alpha_{1comp}=4.5$ ppm/K, $\alpha_{2comp}=99.3$ ppm/K). The accurate solution, found by solving the two equations 13a,b is: $x_1=-0.11$, $y_1=0$, $x_2=0$, $y_2=-0.074$ ($\alpha_{1comp}=-4.4$ ppm/K, $\alpha_{2comp}=95.6$ ppm/K).

Note that errors in a simplified procedure are caused by the nonlinearity of the variation of TCR of a compound resistor as function of trimming fraction.

Example 3

Consider a different target, $R_{1comp}/R_{2comp}=0.95$, $\Delta\alpha=100$ ppm/K. However, in this case, resistors $R_{12}$ and $R_{21}$ are chosen for trimming, resistor $R_{12}$ ($x_2$) being "responsible" for RTCR adjustment and $R_{21}$ ($y_1$) "responsible" for resistance ratio adjustment ($x_1=y_2=0$). Approximate solution: $y_1=-0.077$, $x_2=0.038$ ($\alpha_{1comp}=99.3$ ppm/K, $\alpha_{2comp}=-0.5$ ppm/K). Accurate solution: $y_1=-0.0772$, $x_2-0.038$, $y_2=0$, $x_1=0$, ($\alpha_{1comp}=99.5$ ppm/K, $\alpha_{2comp}=-0.5$ ppm/K).

Example 4

$R_{1comp}/R_{2comp}=1$, $\Delta\alpha=100$ ppm/K. Resistors $R_{12}$ and $R_{22}$ are trimmed by fractions $y_1$ and $x_2$ ($-x_1=y_2=0$). Approximate solution: $y_1=-0.077$, $x_2=-0.039$ ($\alpha_{1comp}=-99.3$ ppm/K, $\alpha_{2comp}=-0.5$ ppm/K).). Accurate solution: $y_1=-0.0772$, $x_2=-0.039$, $x_1=0$, $y_2=0$, ($\alpha_{1comp}=99.5$ ppm/K, $\alpha_{2comp}=-0.5$).

In general, it is not obligatory that the two compound resistors be TCT-compensated (such as in the example in FIG. 5 where k=0.5), but rather must each contain two single resistors with different TCT's which give different slopes or curves for the TCR vs. trimming fraction of each compound resistor. The numerical examples below demonstrate the possibility of independent resistance ratio and RTCR adjustment for a voltage divider containing two compound resistor each having $R_1=R_2$. In the set of four examples below, the trimming targets are farther deviated from the initial conditions, as compared to the four previous examples. The same resistor positions were chosen for trimming as in the previous examples.

Example 5

$R_{1comp}/R_{2comp}=0.9$, $\Delta\alpha=0$ ppm/K. Resistor $R_{11}$ and resistor $R_{22}$ are trimmed by fractions $x_1$ and $y_2$ ($x_2=y_1=0$). Accurate solution: $x_1=-0.184$, $y_2=-0.0183$ ($\alpha_{1comp}=-284.5$ ppm/K, $\alpha_{2comp}=-284.5$ ppm/K).

Example 6

$R_{1comp}/R_{2comp}=0.9$, $\Delta\alpha=-200$ ppm/K. Resistors $R_{11}$ and $R_{22}$ are trimmed by fractions $x_1$ and $y_2$ ($x_2=y_1=0$). Accurate solution: $x_1=-0.269$, $y_2=-0.0767$ ($\alpha_{1comp}=-309.7$ ppm/K, $\alpha_{2comp}=-109.7$ ppm/K).

Example 7

$R_{1comp}/R_{2comp}=0.9$, $\Delta\alpha=200$ ppm/K. Resistors $R_{12}$ and $R_{21}$ are trimmed by fractions $y_1$ and $x_2$ ($x_1=y_2=0$). Accurate solution: $y_1=-0.116$, $x_2=0.094$ ($\alpha_{1comp}=-40$ ppm/K, $\alpha_{2comp}=-240$ ppm/K).

Example 8

$R_{1comp}/R_{2comp}=1$, $\Delta\alpha=200$ ppm/K. Resistors $R_{12}$ and $R_{21}$ are trimmed by fractions $y_1$ and $x_2$ ($x_1=y_2=0$). Accurate solution: $y_1=-0.1013$, $x_2=-0.1013$ ($\alpha_{1comp}=-66$ ppm/K, $\alpha_{2comp}=-266$ ppm/K).

The above examples demonstrate that approximate solutions are readily available for the divider consisting of two TCT-compensated resistors, giving errors in RTCR up to 4 ppm/K. It should be understood that depending on the technical requirements (precision and trimming range), an appropriate method of calculation of trimming values should be chosen. It could be based on analytical or numerical solution of equations (12a-d) or usage of look-up tables.

Note that the necessity to adjust the resistance ratio of two trimmable resistors and their RTCR may exist not only for the resistor divider circuit as described in the examples, but also for other resistor networks where two trimmable resistors are not necessarily connected in series. The principle of the adjustment of such a circuit remains the same as described in the examples 1-8. In general, the overall circuit output may depend on (a) ratio(s) (or relationship) of a number of resistors, not necessarily in a simple series or parallel combination (not necessarily connected directly to each other). The main idea is that the compound resistor behaves differently when we trim one or the other, provided that they have different TCT.

FIG. 8 shows a schematic of a resistor divider consisting of a compound TCT-compensated trimmable resistor $R_{comp}$ plus a single trimmable resistor $R_3$, connected in series. The circuit can be used in applications where one needs essentially non-zero RTCR of the voltage divider. As an example, consider a voltage divider with the resistor $R_{comp}$ having TCR 900 ppm/K higher than that of resistor $R_3$. The TCT-compensated compound resistor is selected to be analogous to those shown in FIG. 2 ($\alpha_0=500$ ppm/K, $\beta_0=-1200$ ppm/K, $\gamma=-500$ ppm/K, k=0.417). The trimmable resistor RP is made from thermally trimmable material with TCR $\beta_0=-1200$ ppm/K and TCT $\gamma_3=-3000$ ppm/K. To reach RTCR equal to 900 ppm/K, resistor $R_3$ must be trimmed "down" by 10% (trimming fraction z=−10%=−0.1). Its TCR is changed by trimming from its "as-manufactured" value to: (−1200 ppm/K)+(−3000 ppm/K)·(−0.1)=900 ppm/K. After the target RTCR is reached, the divider resistance ratio can be adjusted by trimming of the TCT-compensated compound resistor. $R_{1comp}$ without significant RTCR changes, as was described above (e.g. in FIG. 6). In this case, if the "operating" resistance values of $R_{comp}$ and $R_3$ are known in advance, the as-manufactured resistance value of $R_3$ should be chosen intentionally 10% higher, so that subsequent trimming down by −10% allows both the required RTCR adjustment and the required resistance ratio.

In general, the present invention is suitable in a broad range of cases where thermal trimming of thermally-mutable resistance is possible. This does not necessarily require special thermal isolation of the resistors beyond what is typically found in standard integrated circuit host processes. The present invention does not necessarily require bidirectional trimming, and can function effectively even if individual resistors are trimmed largely only in a downward direction. It can also function effectively in cases where the range is limited for trimming upwards from a trimmed-down value. Since thermal trimming is typically much faster in the downward direction than in the upward direction, the required trim signals may be short enough that special thermal isolation is not needed (and thus this technique may work with thermally-trimmable resistors which are integrated on the same chip with other circuitry, such as those provided by standard CMOS processes).

The invention can be used in a variety of applications, such as for zero compensation of a Wheatstone bridge. Consider a Wheatstone bridge built from four resistors (which are commonly all nominally equal, but which may not be in some configurations). Let us call each of the equal resistors "$R_b$", for this analysis. "Zero offset" of a Wheatstone bridge (mismatch, imbalance ($\Delta u$) of the voltages at the two midpoints of the bridge), can be translated into a relative resistance mismatch $\Delta R_b/R_b$, of one of the four resistors, and a mismatch of the TCR of that resistor with respect to the others (which nominally have identical TCR's). If the voltage drop across the entire bridge is U, and one of the four nominally-identical resistors has an undesired resistance shift of $\Delta R_b$, then the zero offset is equal to:

$$\Delta u = \frac{U}{4}\frac{\Delta R_b}{R_b} \quad \text{or} \tag{14}$$

$$\frac{\Delta R_b}{R_b} = 4\frac{\Delta u}{U} \tag{15}$$

Analogously, the relative shift of TCR of one resistor by an amount $\Delta TCR$ results in temperature drift of that bridge mid point voltage mismatch (also called "temperature coefficient of zero offset"):

$$\Delta TCR = \frac{4}{U}\frac{d(\Delta u)}{dT} \quad (16)$$

Substituting examples of values for Zero Offset (±5 mV/V) into eq. (15) and Temperature Coefficient of Zero ±25 µV/V/K into eq. (16), one obtains an example of the rang of resistance and $\Delta TCR$ variability that one would want to trim out (or compensate for): $\Delta R_b/R_b = \pm 2.0\%$, $\Delta TCR = \pm 100$ ppm/K.

Figure 10:
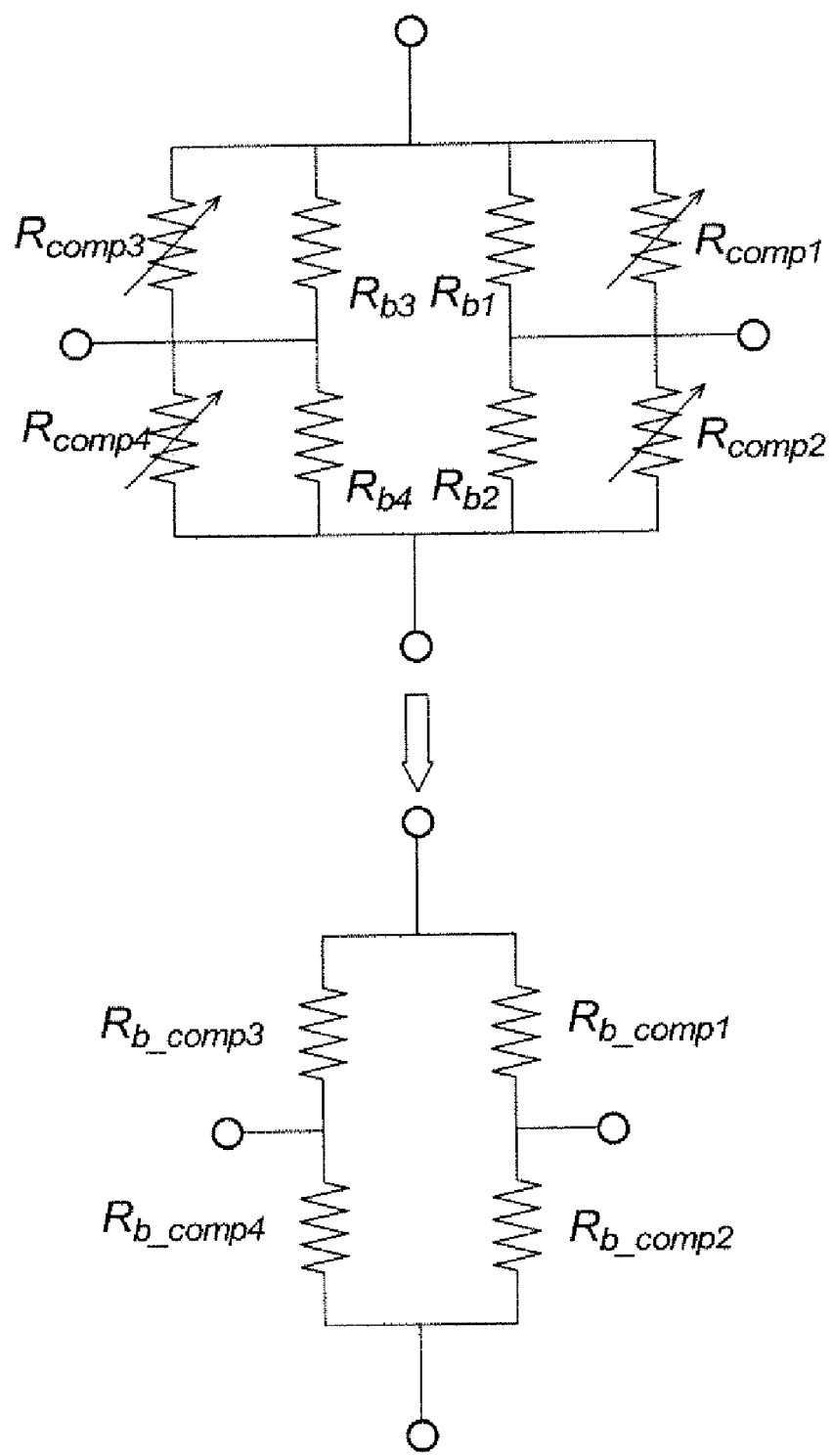
FIG. 10 shows a full Wheatstone bridge, $R_{b1}$, $R_{b2}$, $R_{b3}$, $R_{b4}$, each with a trimmable compound resistor, $R_{comp1}$, $R_{comp2}$, $R_{comp3}$, $R_{comp4}$, connected in parallel, and a simplified representation where each bridge resistor and its associated compound resistor is combined and represented as $R_{b\_comp1}$, $R_{b\_comp2}$, $R_{b\_comp3}$, $R_{b\_comp4}$.

The scheme depicted in FIG. 10 is an example of the invented method applied for zero compensation (compensation of zero offset and temperature coefficient of zero offset) of the Wheatstone bridge. Four trimmable compound resistors $R_{comp1}$, $R_{comp2}$, $R_{comp3}$, $R_{comp4}$ are each connected in parallel to the corresponding bridge resistors $R_{b1}$, $R_{b2}$, $R_{b3}$, $R_{b4}$. Each pair of resistors thus forms a new compound resistor, represented in the figure by $R_{b\_comp1}$, $R_{b\_comp2}$, $R_{b\_comp3}$, $R_{b\_comp4}$.

Figure 11:
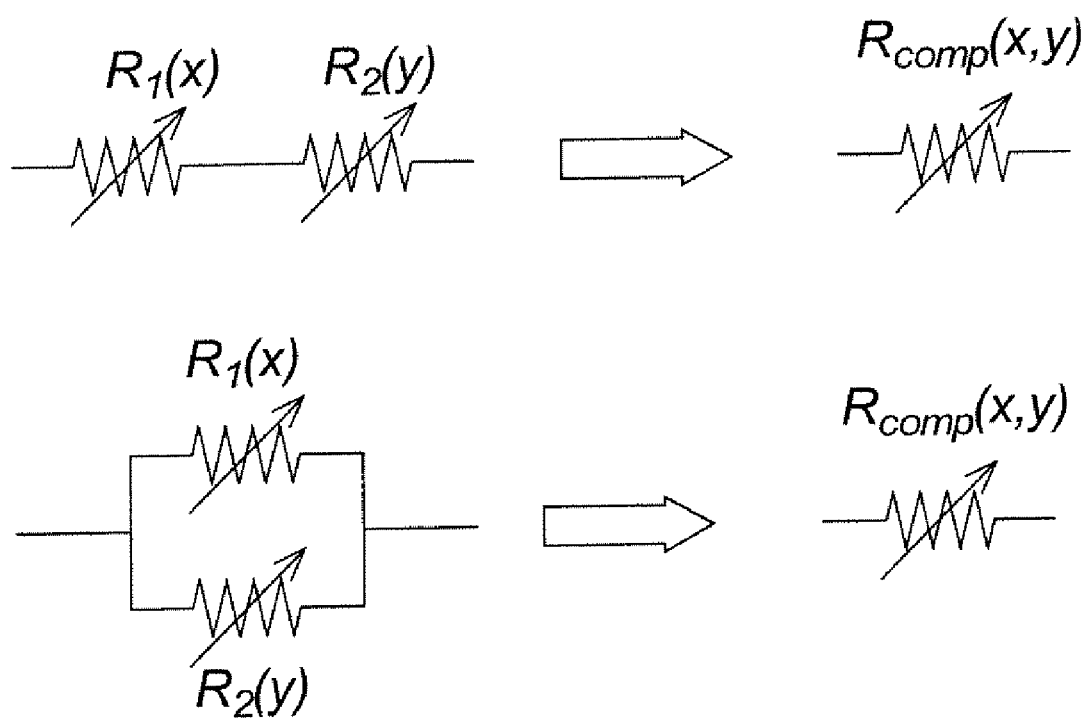
FIG. 11 shows two different configurations of trimmable compound resistors, one where $R_1(x)$ and $R_2(y)$ are connected in series, and the other where $R_1(x)$ and $R_2(y)$ are connected in parallel.

Consider the flexibility of trimming options of trimmable compound resistors, each consisting of two trimmable portions $R_1(x)$ and $R_2(y)$ made from different materials (where x and y are the trimming fractions of each single resistor within a compound resistor). These portions can be connected in series or in parallel, as shown in FIG. 11. Each resistive portion is independently trimmable:

$$R_1(x) = R_{10}(1+x) \quad (17a)$$

$$R_2(y) = R_{20}(1+y) \quad (17b)$$

where $R_{10}$ and $R_{20}$ are as-manufactured resistance values. The TCR of each of these single resistors varies with trimming according to the equations;

$$\alpha(x) = \alpha_0 + \gamma_1 x \quad (18a)$$

$$\beta(y) = \beta_0 + \gamma_1 y \quad (18b)$$

where $\alpha_0$ and a $\beta_0$ are as-manufactured values of TCR of two resistive portions; $\gamma_1$ and $\gamma_2$ are trimming-induced shifts of TCR per trimming fraction (called "TCT", measured in ppm/K/trim-fraction).

Figure 12:
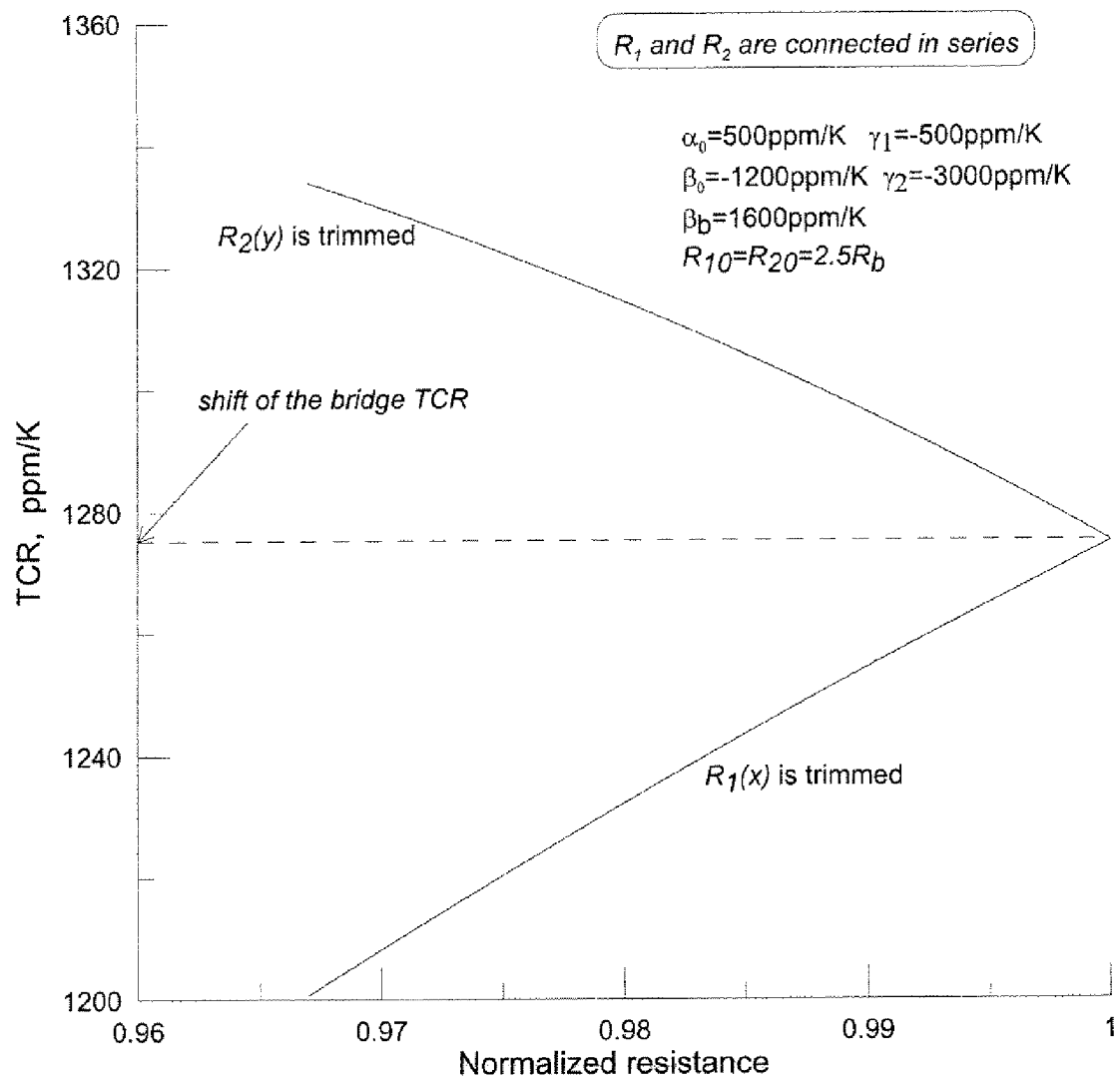
FIG. 12 is a graph of overall TCR of an example of one $R_{b\_comp}$ compound resistor having a series connection, as a function of its own normalized resistance, as one of the trimmable portions is trimmed down, where trimming $R_2(y)$ increases the TCR while trimming $R_1(x)$ decreases the TCR.
Figure 13:
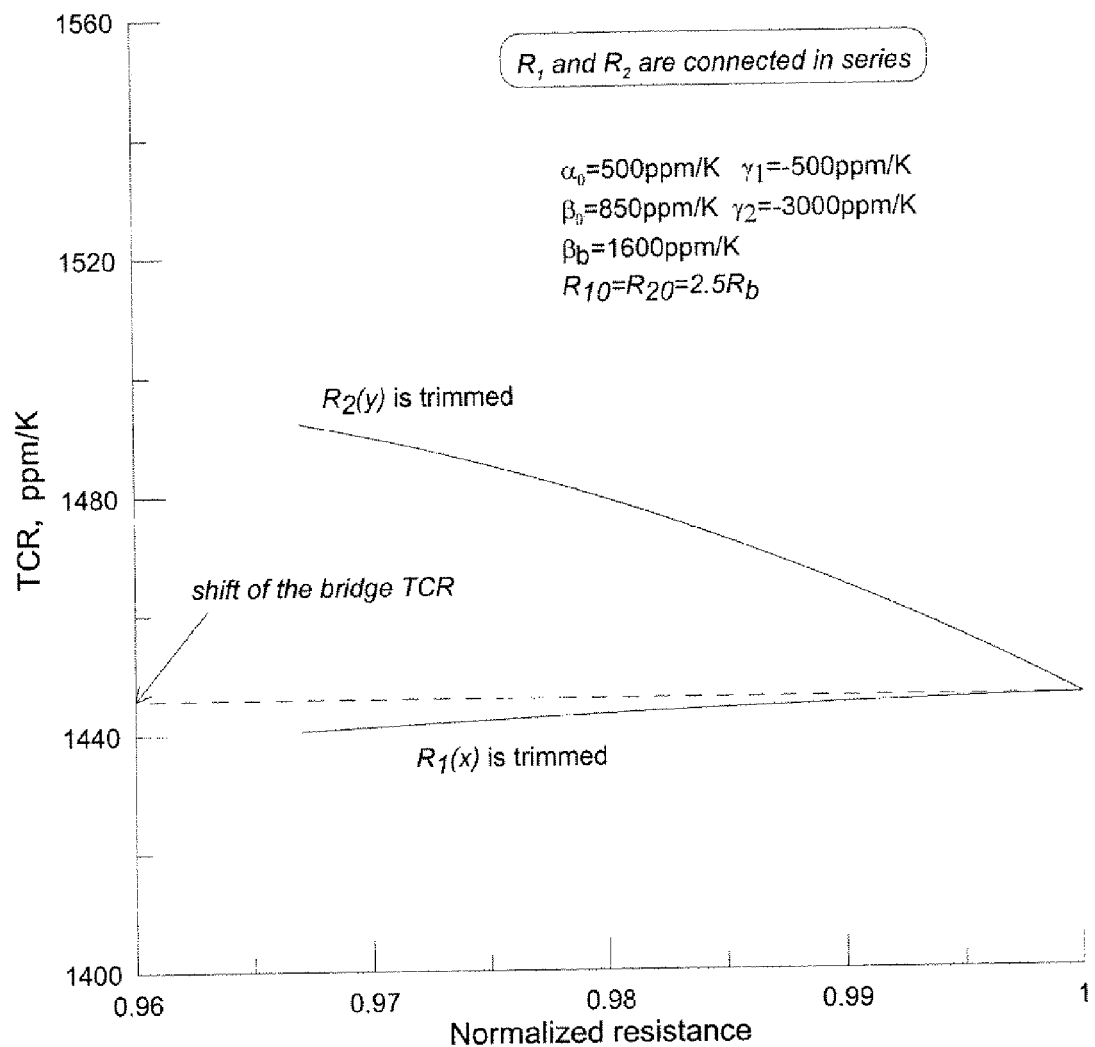
FIG. 13 is a graph of overall TCR of an example of one $R_{b\_comp}$ compound resistor having a series connection, as a function of its own normalized resistance, as one of the trimmable portions is trimmed down, where trimming $R_2(y)$ changes the TCR by a much larger amount than does trimming $R_1(x)$.
Figure 14:
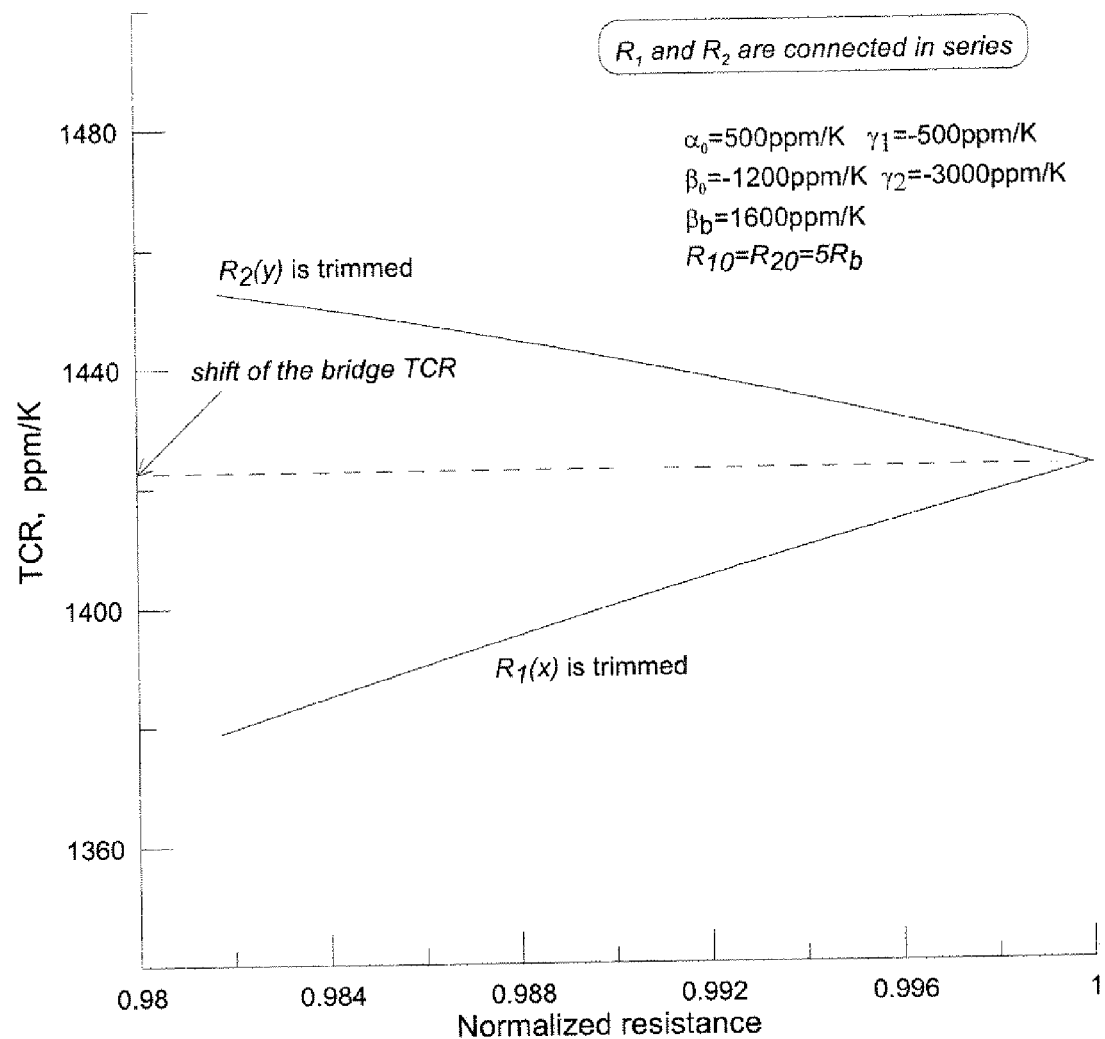
FIG. 14 is a graph of overall TCR of an example of one $R_{b\_comp}$ compound resistor having a series connection, as a function of its own normalized resistance, as one of the trimmable portions is trimmed down, where trimming $R_1(x)$ decreases the TCR by a larger amount than the increase caused by trimming $R_2(y)$.

FIGS. 12-14 show three different examples, plotting the overall ("net") TCR of one of the compound resistors (parallel combination of one of the bridge resistors $R_b$ with its corresponding $R_{comp}$, called generically $R_{b\_comp}$), as a function of its own normalized resistance ($R_{b\_comp}$). In FIG. 12, for example, $R_b$, (by itself) has TCR of 1600 ppm/K, and when this is connected in parallel with $R_{comp}$, (having the parameters specified in FIG. 12), the overall TCR of the resultant $R_{b\_comp}$ is approximately 1275 ppm/K. In these examples, all of the compound resistors $R_{comp}$ have equal resistive sub-portions $R_1=R_2$, connected in series (as shown in the upper part of FIG. 11). Note that the trimming range of the single resistors $R_1$ and $R_2$ is -35% (down 35% from the as-manufactured resistance value). In these examples, the resistance value of the compound resistor, $R_{comp}$ is approximately 5 times (FIGS. 12 and 13), and 10 times (FIG. 14), greater than the resistance of the bridge resistor $R_b$. The as-manufactured TCR and TCT of resistors $R_1$ and $R_2$ are $\alpha_0 = 500$ ppm/K; $\gamma_1 = -500$ ppm/K, $\beta_0 = -1200$ ppm/k and $\gamma_2 = 3000$ ppm/K (FIGS. 12 and 14) and $\beta_0 = 850$ ppm/K, $\gamma_2 = -3000$ ppm/K (FIG. 13).

If, in FIG. 12, we trim down only $R_1$ in the compound resistor $R_{comp}$, then the trimming-induced $\Delta TCR$ in $R_{b\_comp}$ could reach about -70 ppm/K. Since $R_1$ is only about half of the resistance of $R_{comp}$, and $R_{comp}$ is in parallel with $R_b$ and 5 times greater than $R_b$, then a 3% decrease in $R_{b\_comp}$ requires a decrease of approximately 31% in $R_1$. If instead of trimming only $R_1$, we trim down only $R_2$ leaving $R_1$ untrimmed, then for an equal ~31% decrease in $R_2$, the trimming-induced $\Delta TCR$ in $R_{b\_comp}$ would be about +50 ppm/K.

The fact that there are different slopes of net TCR as a function of trimming fraction of the compound resistor $R_{b\_comp}$, enables $\Delta TCR$ adjustment independent of relative resistance mismatch adjustment of the bridge. To illustrate this, assume that we will trim down only portions of resistors $R_{comp1}$ and $R_{comp3}$ (see FIG. 10), having trimming properties shown/listed in FIG. 12. Assume that $R_{b\_comp1}$ and $R_{b\_comp3}$ are each trimmed "down" by ~3%, but that said trimming is the result of trimming "down" of resistor $R_1$ by ~31% in the compound resistor $R_{comp1}$, and trimming "down" of resistor $R_2$ by ~31% in the compound resistor $R_{comp3}$. In this case, the trimming-induced $\Delta TCR$ in $R_{b\_comp1}$ is about -70 ppm/K, while the trimming-induced $\Delta TCR$ in $R_{b\_comp3}$, on the opposite side of the bridge, is about +50 ppm/K, for a total $\Delta TCR$ having magnitude approximately 120 ppm/K. Note that these trimming operations did not change the state of bridge resistance match (or mismatch), since $R_{b\_comp1}$ and $R_{b\_comp3}$, in corresponding positions on opposite arms of the bridge, were each reduced by the same 3%. Only the relative TCRs were changed in such a way that the effective temperature coefficient of zero was changed by 120 ppm/K, which corresponds to a temperature coefficient of zero of approximately 30 uV/V/K.

It is also possible to trim "down" resistors $R_1$ and $R_2$ of a single given compound resistor, for example $R_{comp1}$, say by 20% each. As a result, the total resistance of resistor $R_{b\_comp1}$ reduced by ~4% with virtually no change in its TCR. In this way, the bridge zero offset can be significantly adjusted using thermally-trimmable resistors, without significantly unbalancing the relative TCR of the system (without causing additional $\Delta TCR$). In general, trimming of at least two of four single resistors included in two compound resistors $R_{comp1}$ and $R_{comp3}$, one can reach both a target trimming-induced $\Delta TCR$ and a target relative resistance change ($\Delta R_b/R_b$) of the bridge.

The range of bridge zero offset adjustment can be further doubled if the corresponding (same-numbered) single resistors $R_1$ or $R_2$ in pair $R_{comp1}$, $R_{comp4}$, and in pair $R_{comp2}$, $R_{comp3}$, are trimmed simultaneously. For example, one would trim down $R_1$ in $R_{comp1}$ and $R_{comp4}$, and trim down $R_2$ in $R_{comp2}$ and $R_{comp3}$.

Figure 15:
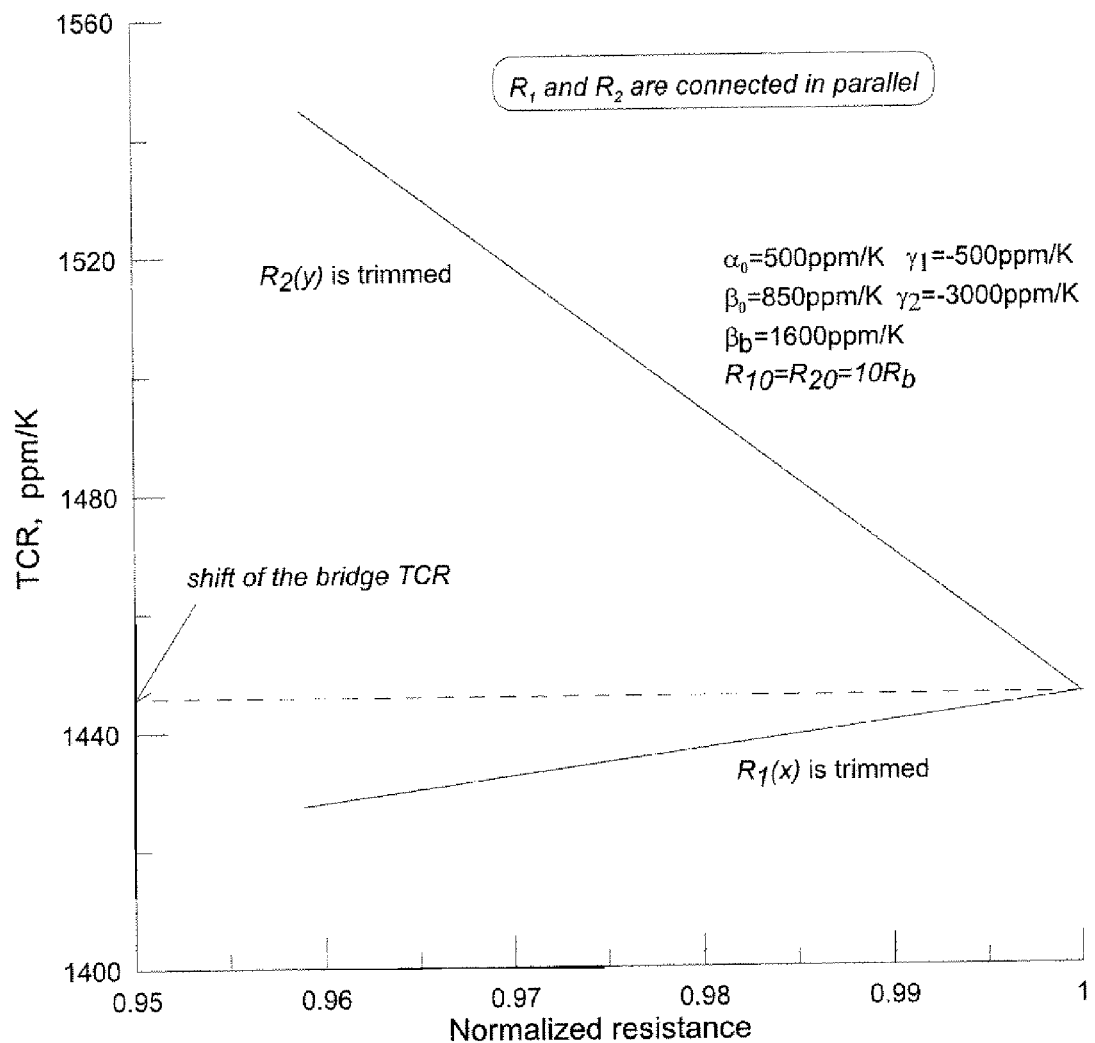
FIG. 15 is a graph of overall TCR of an example of one $R_{b\_comp}$ compound resistor having a parallel connection, as a function of its own normalized resistance, as one of the trimmable portions is trimmed down, where trimming $R_2(y)$ increases the TCR by a larger amount than the decrease caused by trimming $R_1(x)$.
Figure 16:
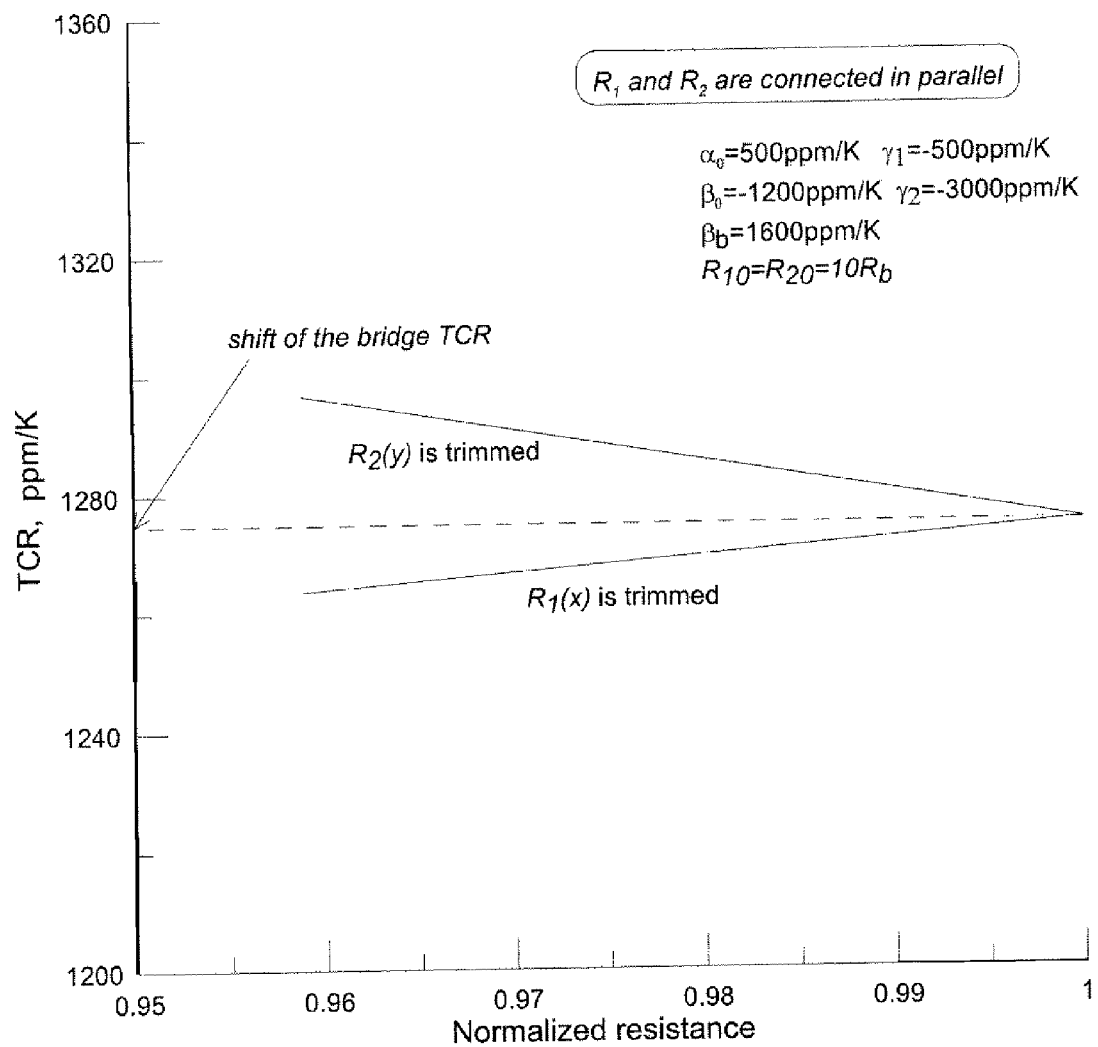
FIG. 16 is a graph of overall TCR of all example of one $R_{b\_comp}$ compound resistor having a parallel connection, as a function of its own normalized resistance, as one of the trimmable portions is trimmed down, where the magnitudes of the changes in TCR are smaller than those in FIG. 15.
Figure 17:
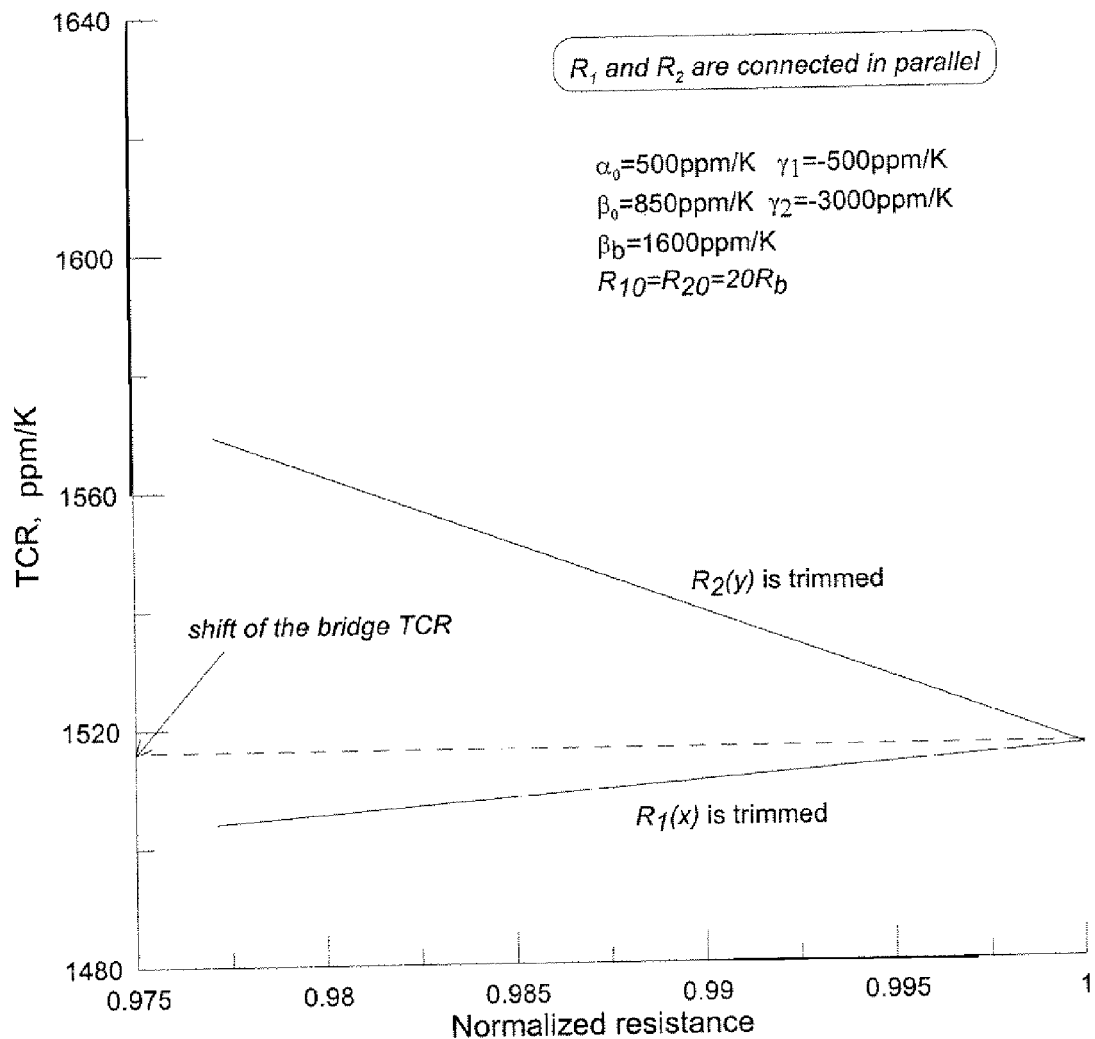
FIG. 17 is a graph of overall TCR of an example of one $R_{b\_comp}$ coot compound resistor having a parallel connection, as a function of its own normalized resistance, as one of the trimmable portions is trimmed down, where trimming R₂(y) causes a larger increase in TCR than the decrease in TCR caused by trimming R₁(x)

FIGS. 15-17 show examples similar to those shown in FIGS. 12-14, where the single trimmable resistors $R_1$ and $R_2$ are connected in parallel instead of in series. Again the overall (net) TCR of the compound resistor $R_{b\_comp}$ is shown as a function of normalized resistance $R_{b\_comp}$ when single trimmable resistors $R_1$ and $R_2$ are trimmed down.

The examples in FIGS. 12-17 show that certain combinations of single resistor parameters provide favorable trimming properties of the compound resistor for application in adjusting the bridge zero offset and temperature coefficient of zero offset. For example, a suitable range of $\Delta TCR$ adjustment is reached for the combination of two trimmable resistors (connected in series) with $\alpha_0 = 500$ ppm/K; $\gamma_1 = -500$ ppm/K, $\beta_0 = -1200$ ppm/K and $\gamma_2 = -3000$ ppm/K (FIG. 12). Parallel connection of two trimmable resistors is most favorable (widest range of $\Delta TCR$ adjustment) when $\alpha_0 = 500$ ppm/K; $\gamma_1 = -500$ ppm/K, $\beta_0 = 850$ ppm/K and $\gamma_2 = 3000$ ppm/K (FIG. 6).

Figure 18:
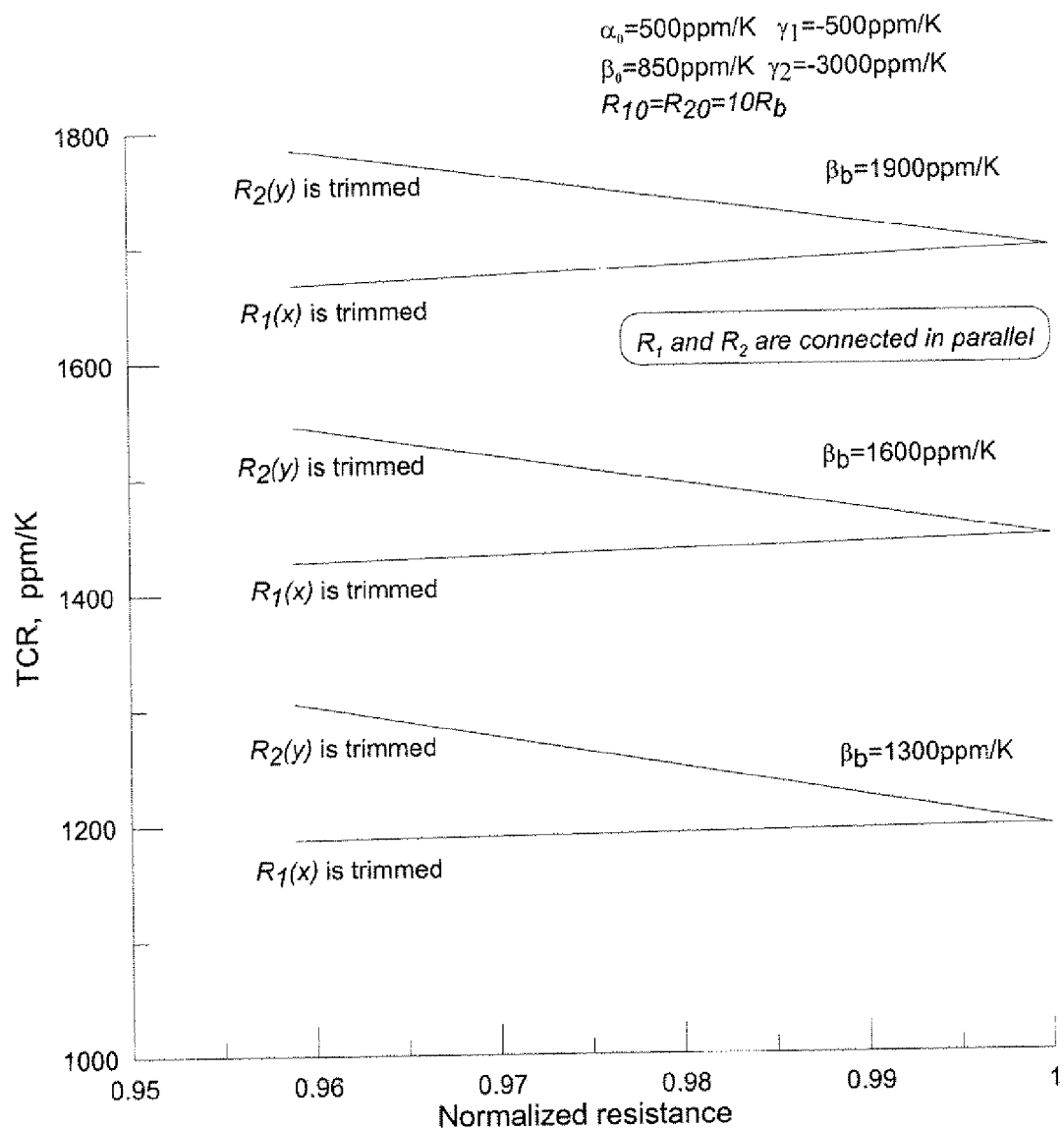
FIG. 18 shows the trimming behavior of one compound resistor $R_{b\_comp}$ having several different values of the nominal TCR ($\beta_b$) of the bridge resistor ($R_b$), where the changes in TCR and relative resistance remain almost the same, for the three different values of $\beta_b$.

FIG. 18 shows the trimming behavior of compound resistor $R_{b\_comp}$ with several different values of the nominal TCR ($\beta_b$) of each of the four bridge resistors ($R_b$). Note that in FIG. 18 the slope of this overall bridge TCR with trimming depends on the value of $\beta_b$ while trimming range of $\Delta$TCR and relative resistance change remains almost the same, for each of the three values of $\beta_b$.

In summary, trimming-compensation circuit (FIG. 10) consisting of four compound resistors with resistance value of approximately 5 times higher than resistance of resistors of the bridge allows RTCR adjustment in the range of ±240 ppm/K (2×120 ppm/K) and relative resistance adjustment of ±12% (2×2×3%).

In addition to zero offset compensation, the present invention can also be applied to change the overall TCR of the bridge (modeling the four-resistor bridge network as a single resistor whose overall TCR will be nominally the same ($\beta_b$) as the TCR of one of the resistors.) For example, if $\beta_b$=nominally 1600 ppm/K, and the target is to reduce it to be within a range 1225-1530 ppm/K, this can be considered as a goal for the invented trimming scheme.

Some sensor-based applications, where the sensing element(s) is/are configured in a Wheatstone bridge, require increasing the bridge-voltage (e.g. $U_b$ in FIG. 21) with temperature (applying a positive bridge-voltage tempco), to compensate for negative temperature-induced drift of the sensitivity of the sensing element(s). Examples of these types of sensors include piezo-resistive pressure sensors and resistive magnetic field sensors. Usually the calibration procedure of a particular sensor involves adjustment of bridge-voltage tempco, in order to achieve temperature-stable full-scale output.

Figure 19:
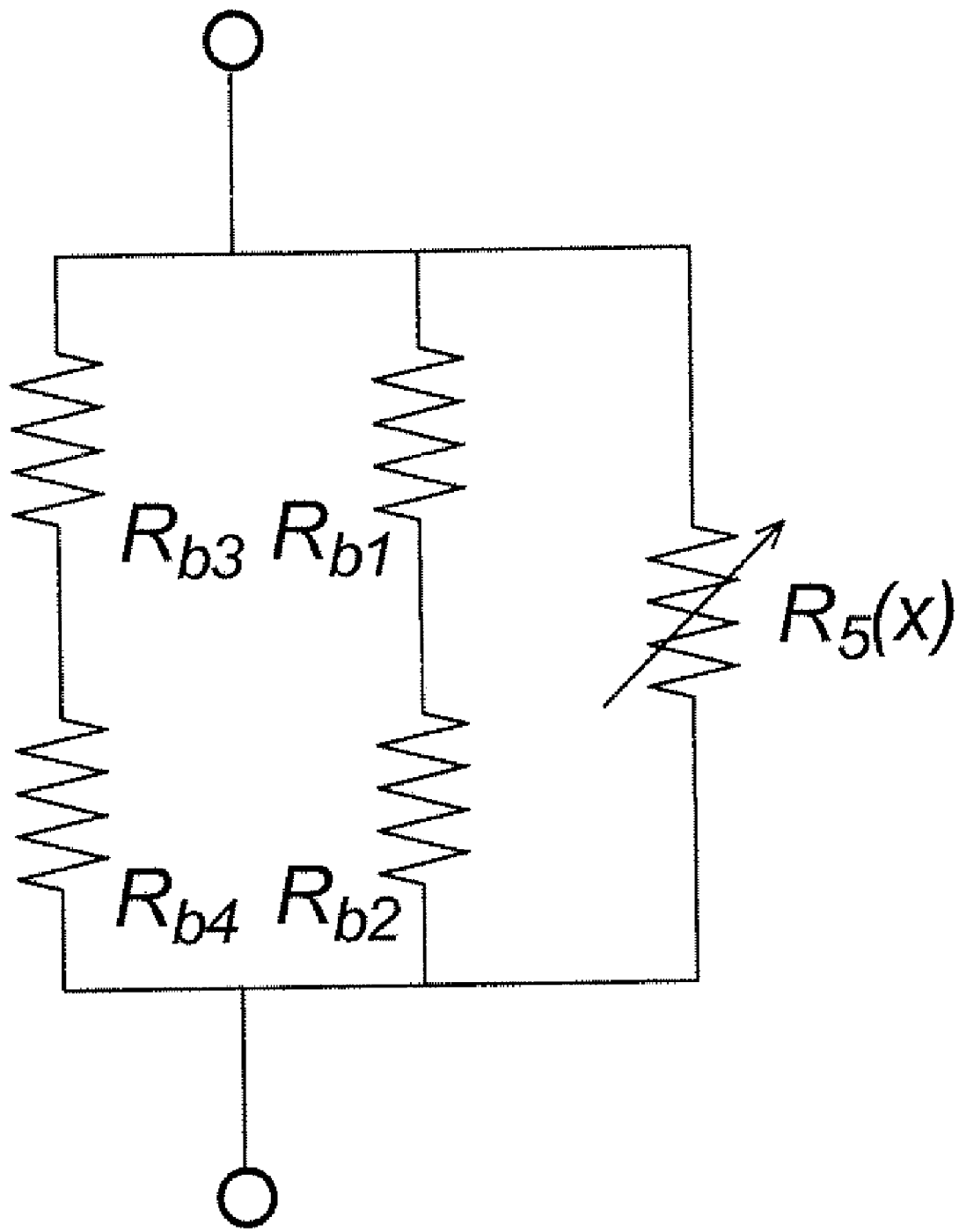
FIG. 19 shows a scheme of TCR compensation of the bridge as a whole, where the trimmable compound resistor $R_5$ is connected in parallel with the whole bridge, such that it experiences the entire voltage applied to the bridge, $U_b$.

Bridge TCR compensation scheme (trimmable resistor in parallel with the bridge): First, note that the shift of the bridge TCR (shown in FIGS. 12-17) caused by connection of "zero-offset-compensation" compound resistors $R_{comp1}$-$R_{comp4}$ (FIG. 10), must be included into consideration. Assume that the "zero-offset-compensated" bridge with parameters shown in FIG. 15 is to be "TCR-compensated" using the scheme depicted in FIG. 19. In this case, the bridge TCR is already shifted (prior to any trimming), from its initial 1600 ppm/K to approximately 1450 ppm/K.

Figure 20:
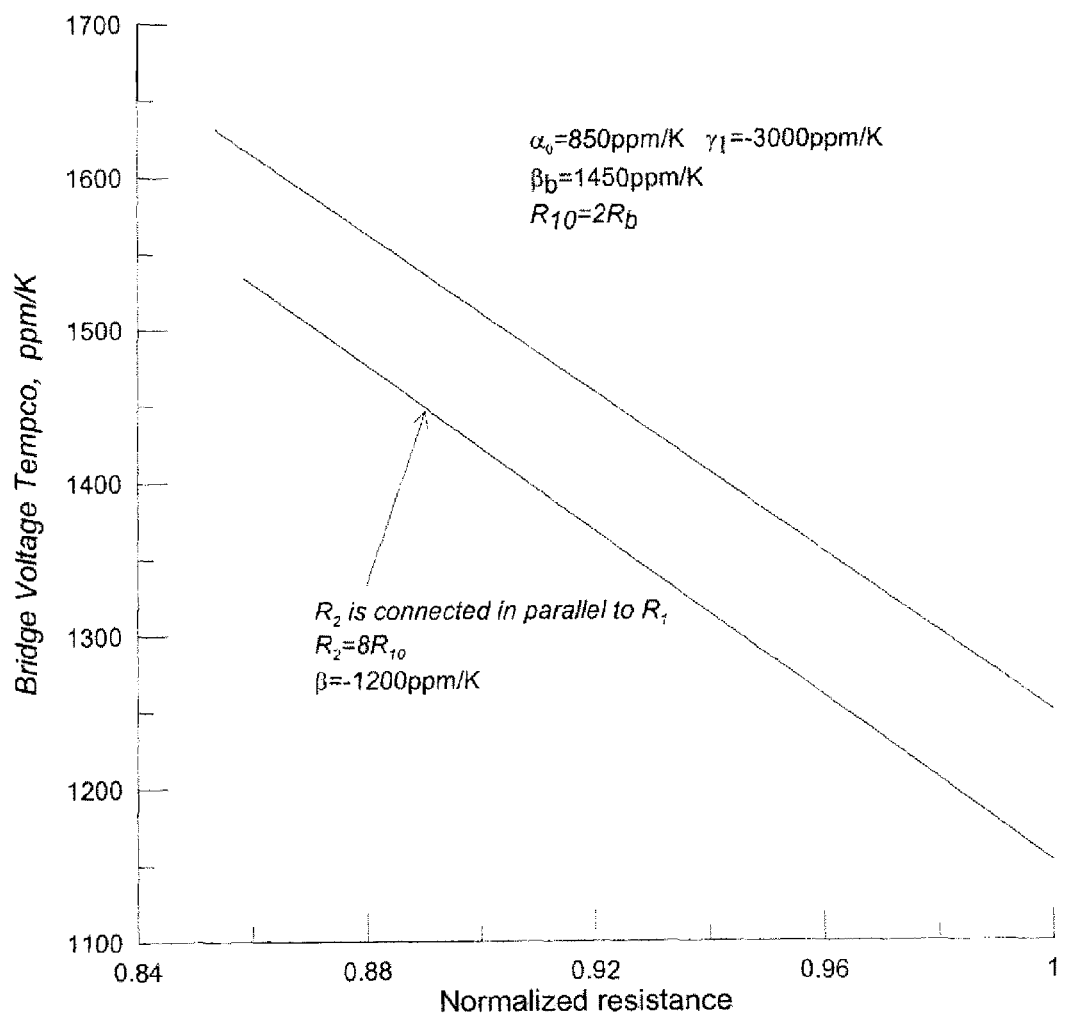
FIG. 20 shows an example of trimming the TCR of the overall bridge using resistor $R_5$, connected in parallel with the entire bridge.

Usage of a trimmable resistor with high TCT is preferable for the adjustment. FIG. 20 shows that resistor $R_5$, consisting of one single trimmable resistor $R_1$ with $\alpha_0$=850 ppm/K; $\gamma_1$=–3000 ppm/K and as-manufactured resistance value $R_{10}$=2$R_b$, allows variation of bridge TCR in a range between ~1240 ppm/K and ~1630 ppm/K. Assuming that the variation of bridge TCR required by a particular user's application must instead be between 1100 and 1500 ppm/K. In this case, the obtained range of bridge TCR adjustment is offset slightly above the desired target. It is possible to shift the whole trimming range "lower" on the TCR scale by connecting, as a part of $R_5$, an additional resistor $R_2$, having negative TCR, in parallel with the resistor $R_1$, described above in this paragraph. (This would transform the resistor $R_5$ into a compound resistor.) If this resistor $R_2$ has $R_{20}$=8$R_{10}$, and TCR $\beta$=–11200 ppm/K, then it would have the effect of lowering the bridge TCR trimming range to a range between 1150 and 1530 ppm/K, much closer to the desired range.

Figure 21:
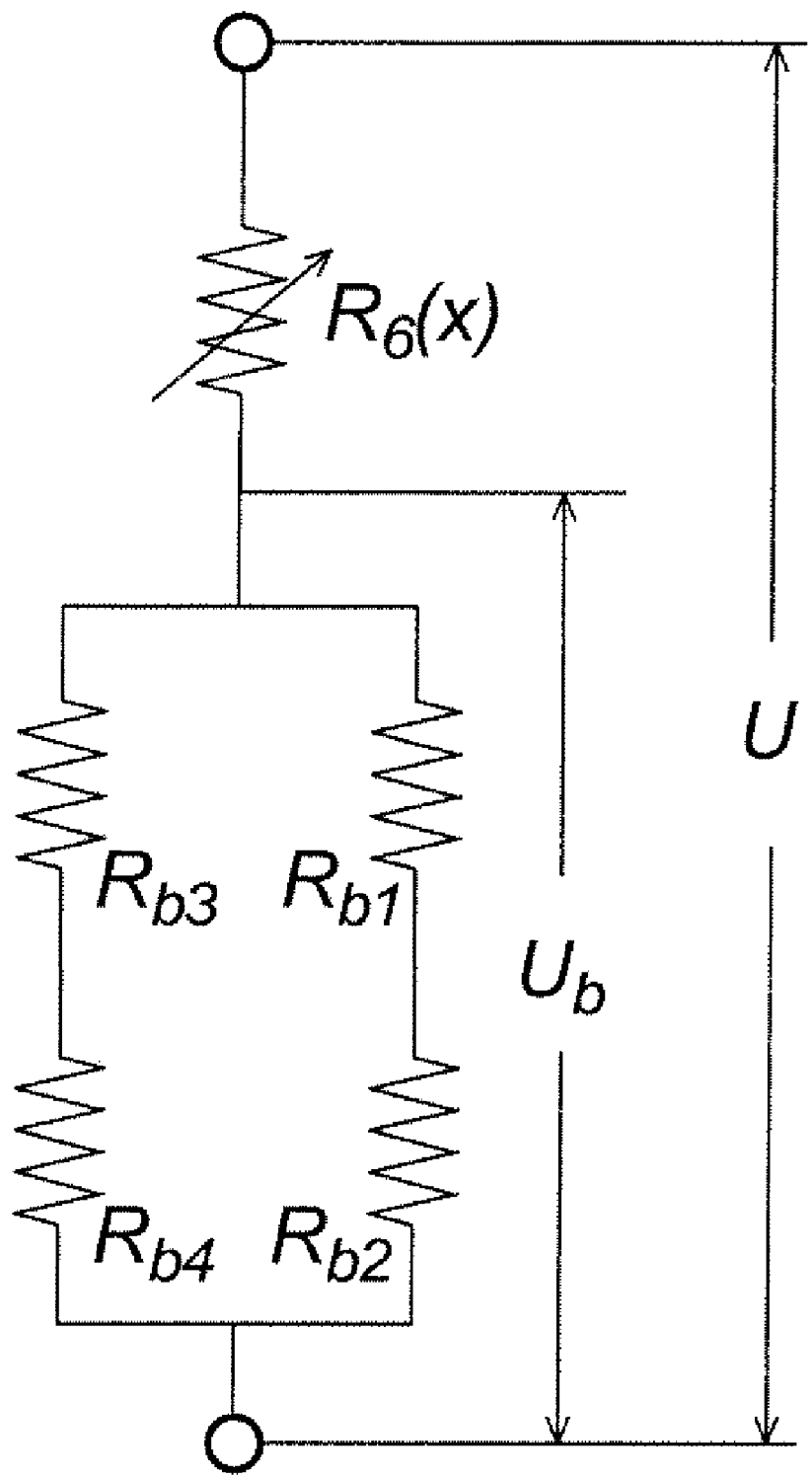
FIG. 21 shows another scheme of TCR compensation of the bridge as a whole, where the trimmable compound resistor $R_6$ is connected in series with the whole bridge, such that it experiences the same current as that applied to the bridge.

Bridge TCR compensation scheme (trimmable resistor in series with the bridge): Adjustment of the bridge-voltage tempco (temperature coefficient) is possible not only by the scheme shown in FIG. 19, with trimmable resistor $R_5$(x) connected in parallel with the bridge, but also with trimmable resistor $R_6$(Y) connected in series with the bridge (having equivalent resistance RP, since all four bridge resistors have resistance $R_b$), as shown in FIG. 21.

Figure 22:
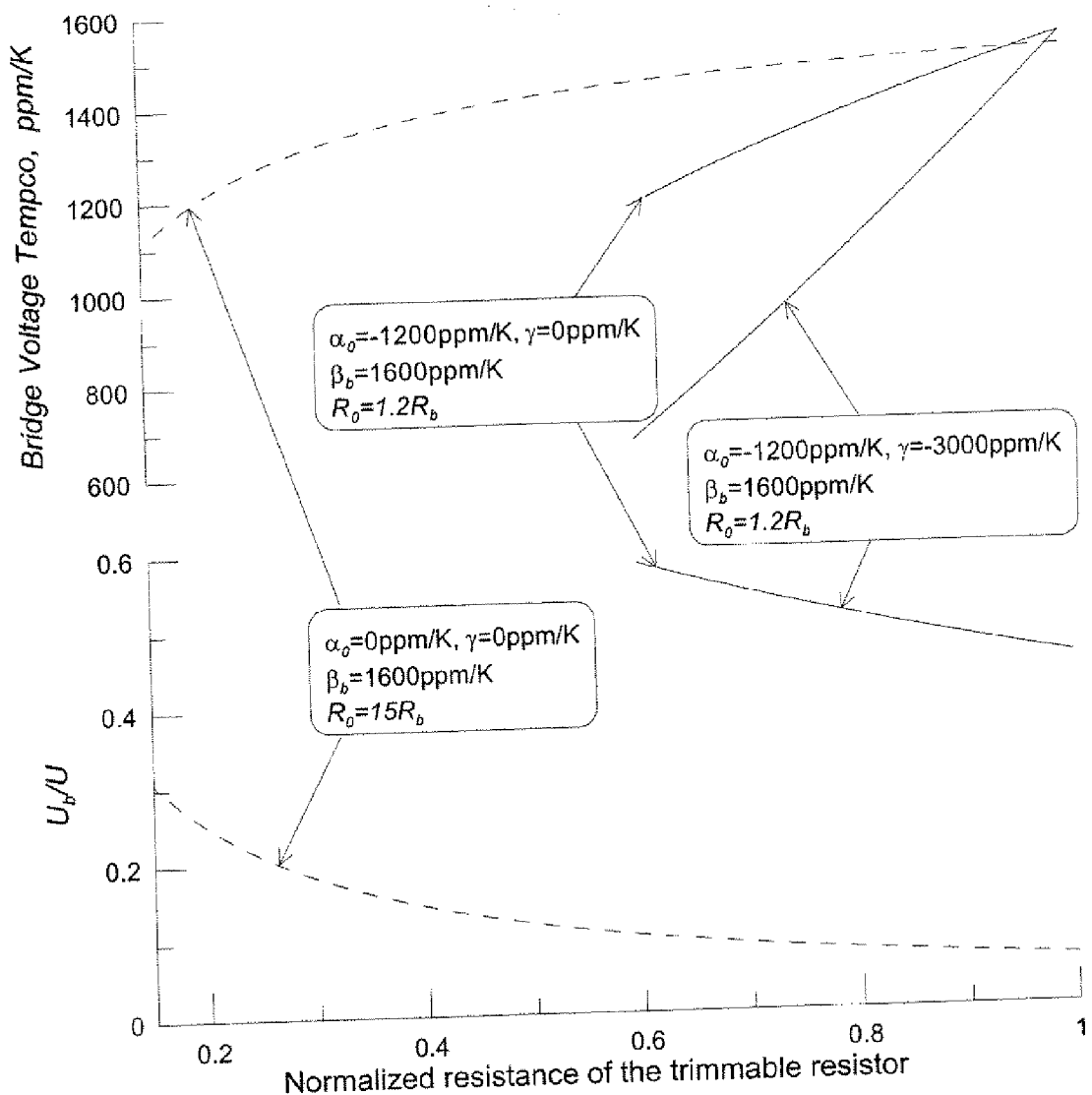
FIG. 22 shows the temperature coefficient of bridge voltage (upper graph), and the ratio $U_b/U$ (lower graph, where U is the excitation voltage of the circuit shown in FIG. 21), as functions of normalized resistance of the trimmable resistor $R_6(x)$ from FIG. 21.

FIG. 22 shows bridge voltage tempco and ratio $U_b$/U (where U is the excitation voltage) as functions of normalized resistance of the trimmable resistor $R_6$(X). The effectiveness of the compensation scheme substantially depends on the as-manufactured TCR $\alpha_0$ and trimming-induced shift of TCR per trimming fraction $\gamma$ of the trimmable resistor.

For example, if a trimmable resistor having constant, nominally-zero TCR is used for compensation, it must be trimmed from 0 to 85%-down from its as-manufactured resistance, in order to cover a particular desired bridge voltage temperature coefficient range between 1100 and 1500 ppm/K. It is also important to note that the as-manufactured resistance value of the trimmable resistor, 15 times greater than the bridge resistance, results in reduction of ratio $U_b$/U to 0.1-0.3, with corresponding reduction in sensor sensitivity. Therefore, a desired normal operating bridge voltage of, say, 1V requires 3-10V of excitation voltage.

Usage of a trimmable $R_6$(x) resistor with high constant negative TCR helps to alleviate this problem. If, for example, $\alpha_0$=–2100 ppm/K, then the required trim range is only 0 to 40%-down, covering the same bridge voltage tempco range. A substantially greater ratio $U_b$/U of 0.45-0.55 is achieved in this case, as shown in FIG. 22 (right side).

If the TCT ($\gamma$) of $R_6$(x) is zero, then the bridge voltage tempco behaves as shown in the upper-right curve in FIG. 22. However, usage of a trimmable resistor with negative TCR $\alpha_0$=–1200 ppm/K, and trimming-induced shift of TCR per trimming fraction $\gamma$=–3000 ppm/K, requires even smaller trimming (0 to 15%-down), to cover the same bridge voltage tempco range (also shown in the upper-right portion of FIG. 22).

The TCR and TCT values of the single trimmable resistors used in the above analysis correspond to the following materials:

TCR=500 ppm/K (approx.); TCT=–800 ppm/K (approx.)→a variant of polysilicon doped primarily with Boron;

TCR=–1200 ppm/K (approx.); TCT=–3000 ppm/K (approx.)→a variant of polysilicon doped primarily with Arsenic;

TCR=850 ppm/K (approx.); TCT=3000 ppm/K (approx.)→a variant of polysilicon doped primarily with Phosphorus;

Calculation of overall TCR of the compound resistor-1. Compound resistor. $R_{comp}$ consisting of two single trimmable resistors $R_1$ and $R_2$ connected in series (FIG. 11) and bridge resistor $R_b$ (FIG. 1) form net compound resistor $R_{b\_comp}$.

Resistance and TCR of single resistors are functions of their trimming fraction x and y correspondently:

$$R_1(x) = R_{10}(1+x) \tag{19a}$$

$$R_2(y) = R_{20}(1+y) \tag{19b}$$

$$\alpha(x) = \alpha_0 + \gamma_1 x \tag{19c}$$

$$\beta(y) = \beta_0 + \gamma_2 y \tag{19d}$$

where $R_{10}$, $R_{20}$, $\alpha_0$, $\beta_0$, $\gamma_1$, $\gamma_2$ are as-manufactured resistance, TCR and TCT values of single resistors.

Resistance of the compound resistor $R_{b\_comp}$ equals:

$$R_{b\_comp}(x, y) = \frac{R_b(R_1(x) + R_2(y))}{R_b + R_1(x) + R_2(y)} \tag{20}$$

Derivative of the $R_{b\_comp}$ over temperature T equals:

$$\frac{dR_{b\_comp}}{dT} = \frac{\partial R_{b\_comp}}{\partial R_b}\frac{dR_b}{dT} + \frac{\partial R_{b\_comp}}{\partial R_1}\frac{dR_1}{dT} + \frac{\partial R_{b\_comp}}{\partial R_2}\frac{dR_2}{dT} \quad (21)$$

Using definition of TCR $\alpha$ of a resistor R:

$$\alpha = \frac{1}{R}\frac{dR}{dT} \text{ and substituting } \frac{\partial R_{b\_comp}}{\partial R_b} = \frac{(R_1(x) + R_2(y))^2}{(R_b + R_1(x) + R_2(y))^2} \quad (22a)$$

and $$\frac{\partial R_{b\_comp}}{\partial R_1} = \frac{\partial R_{b\_comp}}{\partial R_2} = \frac{R_b^2}{(R_b + R_1(x) + R_2(y))^2} \quad (22b)$$

into eq. (21), obtain TCR for the compound resistor:

$$\alpha_{b\_comp}(x, y) = \frac{1}{R_b + R_1(x) + R_2(y)}\left[R_b\left(\frac{\alpha(x)R_1(x)}{R_1(x) + R_2(y)} + \frac{\beta(y)R_2(y)}{R_1(x) + R_2(y)}\right) + (R_1(x) + R_2(y))\beta_b\right] \quad (23)$$

where $\beta_b$ is TCR of the resistor $R_b$.

FIGS. 12-14 show TCR a $\alpha_{b\_comp}$ (eq. (23)) vs. normalized resistance $R_{b\_comp}$ (eq. (20)) where both are functions of the parameter x (when y=0) or y (when x=0).

Calculation of net TCR of the compound resistor-2. Compound resistor $R_{comp}$ consisting of two single trimmable resistors $R_1$ and $R_2$ connected in parallel (FIG. 11) and one bridge resistor $R_b$ (FIG. 10) form net compound resistor $R_{b\_comp}$.

Resistance of the compound resistor $R_{b\_comp}$ equals:

$$R_{b\_comp}(x, y) = \frac{R_1(x)R_2(y)R_b}{R_1(x)R_b + R_2(y)R_b + R_1(x)R_2(y)} \quad (24)$$

Derivative of the $R_{b\_comp}$ over temperature T is presented by eq. (21), where:

$$\frac{\partial R_{b\_comp}}{\partial R_b} = \left[\frac{R_1(x)R_2(y)}{R_1(x)R_b + R_2(y)R_b + R_1(x)R_2(y)}\right]^2 \quad (25a)$$

$$\frac{\partial R_{b\_comp}}{\partial R_1} = \left[\frac{R_bR_2(y)}{R_1(x)R_b + R_2(y)R_b + R_1(x)R_2(y)}\right]^2 \quad (25b)$$

$$\frac{\partial R_{b\_comp}}{\partial R_2} = \left[\frac{R_bR_2(y)}{R_1(x)R_b + R_2(y)R_b + R_1(x)R_2(y)}\right]^2 \quad (25c)$$

TCR of the compound resistor can be expressed as:

$$\alpha_{b\_comp}(x, y) = R_{b\_comp}(x, y)\left[\frac{\alpha(x)}{R_1(x)} + \frac{\beta(y)}{R_2(y)} + \frac{\beta_b}{R_b}\right] \quad (26)$$

FIGS. 15-17 show TCR $\alpha_{b\_comp}$ (eq. (26)) vs. normalized resistance $R_{b\_comp}$ (eq. (24)) where both are functions of the parameter x (when y=0) or y (when x=0).

As another example of an application of the present invention, one may build a circuit for compensation of non-linear temperature variations. Such a circuit generates an output voltage as a polynomial function of temperature T. It could be used, for example, for temperature compensation of crystal oscillators (U.S. Pat. No. 4,560,959). Typically such generation of higher-order temperature compensation is done with analog multiplication using bipolar devices, and analog or digital summing of the desired higher order components for the compensation signal. This typically requires the host process capabilities of a BiCMOS process. The present invention enables the implementation of such higher-order temperature compensation needing less-complex analog circuitry, as demonstrated in FIGS. 23a, 23b, and in the associated text below. The circuitry shown in FIGS. 23a, 23b can be more-easily implemented in a CMOS process, (without requiring a BiCMOS process).

Figure 23A:
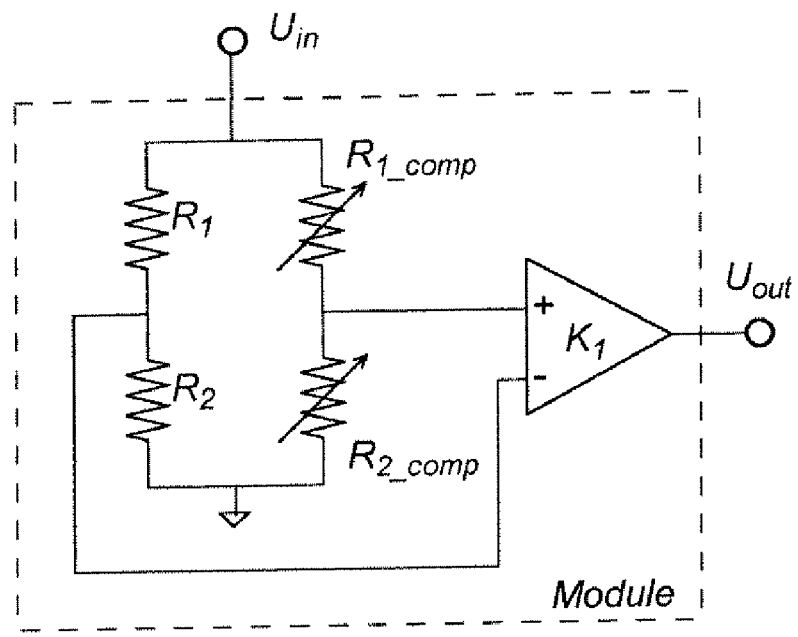
FIGS. 23a and 23b show schematics of, respectively, (a) a single module containing a resistor bridge with two trimmable compound resistors $R_{1\text{-}comp}$ and $R_{2\text{-}comp}$ on one side of the bridge and an amplifier having a gain K1 and (b) a demonstrative schematic showing how several modules from 23(a) could be cascaded such that N=3 to obtain a third order polynomial function of temperature.
Figure 23B:
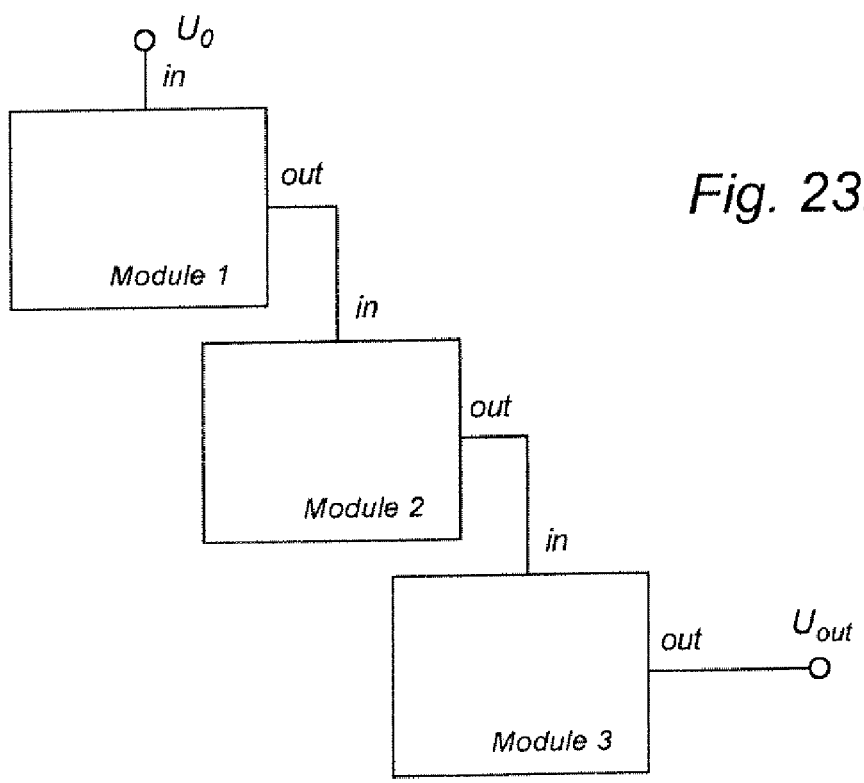

FIG. 23a shows a schematic of a single module containing a resistor bridge with two compound trimmable resistors $R_{1\_comp}$ and $R_{2\_comp}$ (analogous to those described above), and an amplifier with gain $K_1$. The resistors $R_1$ and $R_2$ on the opposite side of the bridge are not necessarily trimmable. The output voltage of the module, with the bridge initially balanced at ambient temperature $T_0$ (zero output voltage), equals.

$$U_{out} = \frac{U_{in}K_1}{(1+\eta)^2}[\Delta\eta + \eta\Delta TCR(T - T_0)], \quad (27)$$

where $$\eta = \frac{R_{1\_comp}}{R_{2\_comp}};$$

$\Delta\eta$ is the change in resistance ratio of two compound resistors resulting from trimming; $\Delta TCR$ is the difference in TCR of the two compound resistors resulting from trimming.

Eq. (27) can be rewritten as:

$$U_{out} = U_{in}K_1[a_1 + b_1(T - T_0)], \quad (28)$$

where coefficients $a_1$ and $b_1$ depend on resistance mismatch and TCR mismatch of the two trimmable compound resistors. It follows from the previous description that the coefficients $a_1$ and $b_1$ can be adjusted independently and may have arbitrary polarity.

If several (N) of such modules are connected so that the output voltage of the previous module is applied to the input of the next module, then the output voltage of the final module is an N-order polynomial function of temperature. For the scheme, shown in FIG. 23b, the output voltage of the third module equals:

$$U_{out} = U_0 K_1 K_2 K_3 [a_1 + b_1(T-T_0)][a_2 + b_2(T-T_0)][a_3 + b_3(T-T_0)], \quad (29a)$$

which can be rearranged into the form.

$$U_{out} = A_0 + A_1(T-T_0) + A_2(T-T_0)^2 + A_3(T-T_0)^3 \quad (29b)$$

where the coefficients $A_j$ can be derived from the coefficients $a_i$ and $h_i$ (where i,j=1, 2, 3).

Adjustment of coefficients $a_i$ and $b_i$ (where i=1, 2, 3), by trimming of the compound resistors as was described above, allows generation of the desired polynomial function of temperature (29b).

Note that the output voltages of the first and second modules can also be used to generate the polynomial function of temperature by summing all three output voltages. It should be understood that the number of modules can be different from three. Also, the resistor bridges in the modules can be initially intentionally unbalanced to simplify generation of the desired polynomial function of temperature. For example, the scheme shown in FIG. 23b may have the first module with an initial (as-manufactured) bridge being unbalanced, which generates an output voltage as a linear function of temperature. Then the trimming of only the compound resistors from modules 2 and 3 (responsible for coefficients $a_2$, $a_3$, $b_2$, $b_3$) may be sufficient to generate a desired function (29b).

In the various embodiments of the present invention a trimming control system can be provided in combination with a trimmable resistive component or application specific circuit or other circuit incorporating or operationally related to such component, including, e.g., the adaptive-control-of-heating-pulse-methods and apparatus (including algorithms and control circuitry) described in PCT application PCT/CA2004/00398 published as WO2004/097589 A1 on 11 Nov. 2004, and more particularly as shown and described at FIGS. 15 and 16 and related text thereof and also in PCT publication WO 03/023794, WO 04/097860 and WO 04/083840.

Pre-Scanning

The specific case of thermal trimming provides an advantage over other trimming techniques having limited reversibility. The thermally-trimmable resistor may be electrically heated to temperatures significantly higher than room temperature or operating temperatures, without initiating significant thermal trimming. In such cases, if it has significant non-zero temperature coefficient of resistance (TCR), then significant resistance changes may be available without committing to a trim. These reversible resistance changes may offer exploratory thermal pre-scanning of significant portions of the thermal trim range. This is discussed below with reference to FIG. 26.

Thermal pre-scanning is feasible when the thermally-trimmable resistor, or a portion thereof, has an essentially non-zero temperature coefficient of resistance (TCR). Thermally-trimmable resistors can offer this capability, exploratory thermal pre-scanning to determine the desired trim-position, without committing the trim and irreversibly losing trim range. By exploratory pre-scanning, the approximate desired trim position can be ascertained, and then the trimming algorithm can take account of this position during the trim. This may be particularly important in cases where several thermally-trimmable resistors are used in a given circuit, since the optimal trim position of one thermally-trimmable resistor may depend sensitively on the precise trimmed position of another.

While this is true of any thermal trimming situation (even if the thermally-trimmable resistor does not have high thermal isolation), it is especially convenient when the thermally-trimmable resistor has high thermal isolation, since then the power needed for heating is lower.

Even if the pre-scan range does not cover the whole trim range, it may still be quite useful. For example, some thermally-trimmable resistors may have a trim range of some tens of % (e.g. 30%) down from its as-manufactured value. Within this range, there is bi-directionality, however the trimming is typically not fully-bidirectional over the entire trim range. For example in some cases an upper portion of the trim range (e.g. the top 5% or 10%), may be accessible only once, and within this range it may be difficult to trim up. In this case, the pre-scan may be particularly useful even if it is smaller than the full 30% trim range, because the pre-scan range may cover, or coincide with, the specific part of the trim range which is not bi-directional.

Consider a single thermally-trimmable resistor having large negative TCR (e.g. −1300 ppm/CC), and which has significant trim-down range. The large negative TCR allows thermal pre-scanning of the single thermally-trimmable resistor in the same direction that it will be trimmed. With a TCR of −1300 ppm/C, it can be pre-scanned over a significant range without reaching a trimming temperature. Let's assume, for example, that we want to keep the pre-scanning temperature below 250° C. to avoid thermal trimming, this would be equivalent to a ΔT of ~225° C. Without considering $2^{nd}$-order temperature coefficient, this would give [−1300 ppm/° C.*225° C.] almost 300000 ppm, almost ~30%—a significant useful pre-scan range, even if the whole trim range were larger.

If there were a significant positive $2^{nd}$-order temperature coefficient, (e.g. ~1 ppm/K$^2$), then the pre-scan range would be reduced for this case of large negative TCR, but still a substantial pre-scan range would be available, based on the same basic principle. (If the $2^{nd}$-order temperature coefficient were negative, then in this example it would act to enhance the pre-scan range.)

Note that in the above case of a single thermally-trimmable resistor, it does not have a near-zero TCR, (since it is by itself and has TCR~−1300 ppm/K). However, if it were combined with another resistor (whether thermally-trimmable or not), having positive TCR (for example, having TCR+430 ppm/K), then the overall TCR of the compound resistor could be brought near to zero. In this case, there could still be pre-scanning using the negative-TCR resistor, however, the range of pre-scanning would be reduced by a substantial fraction (e.g. by approximately 3, if the ratio of the portions was ~1:3 in order to achieve near-zero overall TCR).

Consider a thermally-trimmable voltage divider, where both resistors have trim-down properties similar to those described above. In this case some advantageous features can be obtained, since the TCRs of the thermally-trimmable resistors can be matched or near-matched, and since pre-scanning need not be done by the same resistor which is being thermally-trimmed. In a divider configuration, this allows pre-scanning to be done using thermally-trimmable resistors having positive TCR, since in this case the thermal trimming can be accomplished by the other thermally-trimmable resistor in the divider, opposite from that being used for pre-scanning.

For example, consider a voltage divider made from two thermally-trimmable resistors having TCR approximately +800 ppm/K. In this case, one can pre-scan one resistor (e.g. the "upper" divider resistor), increasing the resistance of that pre-scan resistor by about 15%, thus pre-scanning the divider voltage (Vout) in the corresponding direction (e.g. decreasing the divider voltage). Then, when the target divider voltage has been found by pre-scanning, one can thermally trim-down the other (e.g. "lower") divider resistor, by the amount decided during the thermal pre-scan of the first (e.g. "upper") divider resistor.

In cases like this, where the TCR is positive, if the $2^{nd}$-order temperature coefficient were positive, it would act to enhance the pre-scan range.

It should also be noted that in a voltage divider having 1:1 ratio the conversion from pre-scan of one of the divider resistors (e.g. "upper" resistor), to trim-target of the opposite divider resistor (e.g. "lower" resistor), is relatively straightforward, since changes in either divider resistor affect Vout by substantially the same magnitude. If the divider ratio is not 1:1 (e.g. 10:1), then a fractional change in one of the resistors will cause a change in $V_{out}$ of the same magnitude as will be caused by the same fractional change in the other resistor. Thus one may still convert the pre-scan information from one resistor into the correct trimming target (or the opposite) resistor.

In general, in a divider configuration, one may select which resistor to pre-scan depending on the TCRs and thermal-trimming characteristics of the divider resistors, in order for the pre-scan to imitate the effect of thermal trimming on divider voltage $V_{out}$. In another example, if the thermal-trimming increases the resistance, then if the TCR were negative one would pre-scan using the opposite divider resistor, while if the TCR were positive one would pre-scan using the same resistor as that intended to be thermally-trimmed.

Consider thermally-trimmable resistors having significant trim-down range, as described above. Consider compound resistors made from one portion of thermally-trimmable resistor having positive TCR, and another portion of resistance (not necessarily thermally-trimmable), having negative TCR, such that the overall TCR is close to zero and remains close to zero as the thermally-trimmable portion is thermally trimmed. If two such compound resistors are connected in a voltage-divider configuration, even though the overall TCR of each of the two divider resistors is close to zero, pre-scanning is available through the positive-TCR thermally-trimmable portion (or through the negative-TCR portion, if that portion has a separate control pin).

For example, if the thermally-trimmable positive-TCR portion has TCR. ~+400 ppm/K, then this positive-TCR portion can be used for pre-scanning, followed by trimming-down a thermally-trimmable portion of the opposite divider-resistor. In this case, if the thermally-trimmable portion constituted, for example, ⅗ of the resistance of one of the divider resistors, and if one wanted to keep the pre-scan temperature below, for example, 250° C., then the pre-scan range would be approximately 400*250*3/5=60000 ppm=6%.

Consider the pre-scan technique in the context of thermally-trimmable resistors having the trim-down property. In order to implement the pre-scan technique, one may need to know the trim-down amount corresponding to an electrical heating pulse input (voltage-measured, or power-measured). Since the temperature range of pre-scanning can be significant, the temperature-variation of the pre-scan resistance may be non-linear. Thus one may need to pre-calibrate the single thermally-trimmable resistor or thermally-trimmable resistor-divider before embedding them in a larger circuit.

An application of the pre-scan technique: pre-scan a circuit to find an optimum. For example, a maximum or minimum or other optimum of the circuit output signal or set of signals, such as adjusting the pre-scan signal to set contrast or brightness of a TV screen. The "controlled circuit output parameter" and the "parameter of interest" being optimized may be different. For example, the "parameter of interest" may be the frequency of an oscillator, while the "controlled circuit output parameter" may be a voltage applied to an oven which in turn controls that frequency.

Another area of application: a circuit in which there is significant cross-sensitivity between the effects of several (at least two) thermally-trimmable resistors. In this case, several iterations of pre-scan of each resistor may be required to find the "optimum" (since the perceived optimal position of one resistor may depend sensitively (and/or in a complex manner) on the position of the other, and vice-versa). For example, in the case of amplifier offset and gain. In such cases of cross-sensitivity, pre-scan can offer significant advantages over thermal trimming without pre-scan: pre-scanning is typically faster (e.g. some ms for pre-scan instead of ~1 s or more for adaptive thermal trimming pulse sequence); also, pre-scanning is fully reversible, while typically the reversibility of thermal trimming is more limited, which could prevent finding the true optimum in cases of complex cross-sensitivity.

Figure 26:
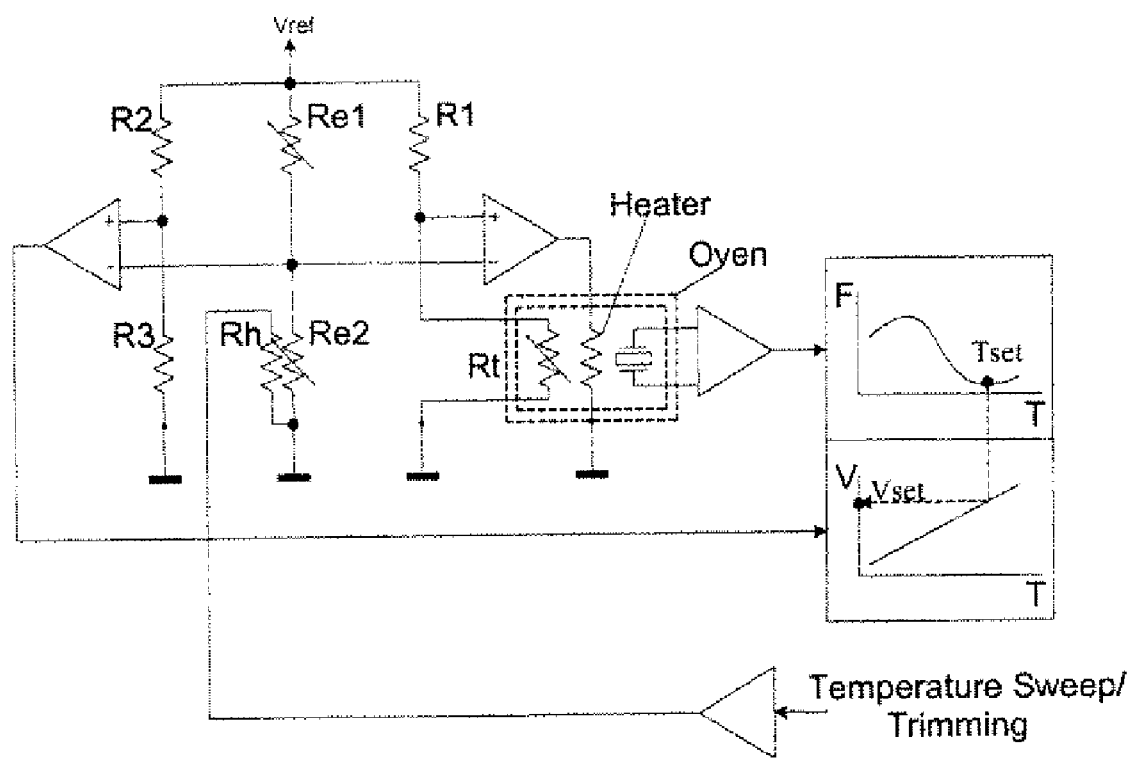
FIG. 26 is an example of a circuit to which the method of the present invention according to a certain aspect of the invention can be applied.

FIG. 26 shows a practical example of the pre-scan technique in an oven-controlled crystal oscillator (OCXO) application. OCXO circuits are well known in the prior art, and typically have an oven with heater and temperature sensor $R_t$ within it, along with the crystal itself. The circuitry external to the oven is designed to control the power applied to the heater, to maintain the oven temperature at a level (called "$T_{set}$") determined experimentally such that the crystal oscillator frequency (the frequency of the voltage output from the right-most amplifier) is least dependent on temperature variations. The heater is powered by the op-amp, which is configured to adjust (by negative feedback) the oven's temperature, such that the bridge circuit consisting of $R_{e1}$, $R_{e2}$, $R_1$ and $R_t$ is balanced. As an example: $R_1=R_2=R_3=10$ kΩ; $R_{e1}$ and $R_{e2}$ are thermally-trimmable resistors with negative TCRs, and $R_{e1}=R_{e2}$ before any trimming; $R_t$ can be a thermistor having TCR approximately –4%/° C., where at 85° C. $R_t/R_1=10$ kΩ. By pre-scan heating $R_{e2}$ (using heater-resistor $R_h$), this bridge can be intentionally (non-permanently) unbalanced, and thus the oven temperature will be changed due to the feedback circuit. By sweeping the voltage applied to $R_h$, the oscillator output ca be effectively scanned over temperature, as depicted in the upper graph (F vs T) at the right side of FIG. 26. In the circuit depicted, one cannot directly measure the resistance $R_{e2}$ (since typically it is better not to disturb the impedance of the bridge). Therefore, in order to better implement the present invention in this context, resistors $R_2$ and $R_3$ are added at the left side of the circuit, along with another op-amp, in order to monitor the changes in $R_{e2}$ with high precision (high precision is needed since the OCXO application demands extreme precision of temperature control). The output voltage of this auxiliary amplifier is also monitored during pre-scan (depicted in the lower graph (V vs T). By simultaneously observing both signals F vs T and V vs T, and recording the voltage "$V_{set}$" at which the variation of frequency with temperature is optimal, this recorded $V_{set}$ becomes an observable high-precision target for the thermal trimming operation which follows the pre-scan. After pre-scan is completed, the pre-scan power applied to $R_h$ is returned to zero, and then $R_h$ is used to thermally trim $R_{e2}$, until the output of the left-side amplifier reaches $V_{set}$. Because of the pre-scan we know that when this $V=V_{set}$, the oven temperature will be at the particular desired temperature, $T_{set}$. This implementation of the technique relies on significant non-zero TCR of the thermally-trimmable resistor $R_{e2}$, which must in this case be negative. If, instead, the thermally-trimmable resistor had positive TCR, then one would pre-scan $R_{e1}$ while trimming $R_{e2}$.

This circuit gives an example of a case where the target output signal (frequency of the right-side amplifier output voltage), is not practical to be used directly in an electronic feedback circuit for trimming. This is because the oven has high thermal inertia and its temperature cannot respond quickly to increments or decrements of the adjustable resistor. Thus, the speed of the pre-scan procedure is limited by this thermal inertia of the oven. On the other hand, the auxiliary voltage from the left-side amplifier is able to respond much more quickly, and therefore can be used more efficiently in adaptive thermal trimming.

Another group of applications where this concept is helpful comprises applications where the judgment of what is "optimal" is not easily quantified or transformed into a quantified electrical signal for example "brightness" or "contrast" or "uniformity" of an LCD display.

The following example demonstrates how the pre-scan works in the case where: (1) one directly measurable parameter (one output voltage) is used as an indicator of trimming during the adjustment procedure; (2) two different parameters of the circuit are to be adjusted (in this case, gain and offset); (3) the two parameters cannot be unambiguously defined from the directly measurable parameter (the output voltage is a potentially complex function of both parameters).

Consider an application circuit including amplifier with initial gain $K_i$ and initial offset $u_{ofin}$. Said gain can be trimmed and pre-scanned with the use of at least one thermally trimmable resistor $R_K$. The application circuit also contains a thermally-trimmable sub-circuit which generates an adjustable DC voltage $u_{ofDC}$ added to the output voltage of the amplifier to compensate the overall offset. The goals of the adjustment procedure are (a) tune voltage $u_{ofDC}$ such that output voltage of the whole application circuit equals zero at zero input signal; and (U) to tune gain $K_i$ to its target value $K_t$.

The output voltage at zero input signal equals:

$$U_0 = K_i \cdot u_{ofin} + u_{ofDC} \quad (30)$$

If reference input signal S is applied, then output voltage equals:

$$U_{0s} = K_i \cdot (u_{ofin} + S) + u_{ofDC} \quad (31)$$

This system of two equations with three unknown parameters ($K_i$, $u_{ofamp}$ and $u_{ofDc}$) cannot be solved unambiguously. One may iterate to approach an approximate solution. To show this, assume that voltage $u_{ofDC}$ is trimmed such that $U_0=0$. This will occur when $u_{ofDC}=-K_i \cdot u_{ofin}$. Next, gain resistor $R_K$ is trimmed such that voltage $U_{0s}=K_t \cdot S$, where S is the known reference input signal and Kt is the known (pre-determined) target gain. However, after this second trimming, $U_0 \neq 0$, and voltage $u_{ofDC}$ must be trimmed again. Then gain resistor $R_K$ must be trimmed again. These trimming cycles can be repeated several times, to reach gain and offset of the overall circuit at or close to their targets.

The proposed pre-scan procedure improves the adjustment process. Assume that, before any permanent thermal trimming, at least one thermally trimmable resistor is reversibly heated (without thermally trimming), to temporarily change gain to a flew value $K_1$, (which must be significantly different from the initial gain $K_i$, in order to enable the calculations below). Then the output voltage is measured at zero and non-zero reference input signals:

$$U_1 = K_1 u_{ofin} + u_{ofDC} \quad (32)$$

$$U_{1s} = K_1 \cdot (u_{ofin} + S) + u_{ofDC} \quad (33)$$

The following equations can then be derived from equations (30)-(33):

$$\frac{K_t - K_i}{K_i} = \frac{(U_{1s} - U_1) - (U_{0s} - U_0)}{U_{0s} - U_0} \quad (34a)$$

$$u_{ofin} = \frac{U_1 - U_0}{K_1 - K_i} = \frac{(U_1 - U_0) - (U_{0s} - U_0)}{K_i[(U_{1s} - U_1) - (U_{0s} - U_0)]} \quad (34b)$$

$$K_i = \frac{U_{0s} - U_0}{S} \quad (5c)$$

The target value for thermal trimming of $u_{ofDC}$ must be $u_{ofDC} = -K_t \cdot u_{ofin}$, in order that the initial offset $u_{ofin}$ will be compensated after gain of the circuit will be trimmed to its target value $K_t$. With this intermediate target in mind, trimming is started. First, switch off pre-scan heating (gain returns to its initial value $K_i$). Then thermally trim $u_{ofDC}$ to set the output voltage to value:

$$U\_trim = K_t \cdot u_{ofin} - K_t \cdot u_{ofin} \quad (35)$$

$$= \left(1 - \frac{K_t}{K_t}\right) \cdot \frac{(U_1 - U_0)(U_{0s} - U_0)}{[(U_{1s} - U_1)(U_{0s} - U_0)]}$$

by thermally trimming the sub-circuit which controls $u_{ofDC}$.

Next, the second thermal trimming operation adjusts the gain resistor $R_K$. Reference signal S is applied to the circuit, and gain resistor $R_K$ is thermally trimmed to set the output voltage to the predetermined value:

$$Us\_trim = K_t \cdot S \quad (36)$$

Based on pre-scan data, first target voltage for trimming offset $u_{ofDC}$ is not zero. This means that at initial gain $K_i$, offset is not compensated. Offset compensation is reached only after the gain is trimmed to its target value $K_t$. This is the result of "prediction" of the circuit behavior obtained during the pre-scan stage. The input signal may be an electrical signal (voltage or current). It also can be a non-electrical signal (pressure, acceleration, magnetic field, light radiation, etc.). In the second case, a sensor may be considered to be a part of the circuit to convert input signal into voltage. In this given example, the calibrated value of pre-scan heating (i.e. overheating temperature of the resistor, or dissipated power, or percent of resistance shift) is not needed. The only requirement is that the change in resistance must be large enough to allow accurate target calculation after measurements (equations (1)-(4)) are done. For example, if change of $U_1 - U_0$ is of order of microvolts and the voltmeter has resolution of millivolts, then accurate calculation of trim targets is impossible.

The pre-scan procedure can be rather fast. For example:

| | |
|---|---|
| measure $U_0$ | 10 ms |
| apply input signal | 10 ms |
| measure $U_{0s}$ | 10 ms |
| apply heating voltage | 10 ms |
| measure $U_{1s}$ | 10 ms |
| reset zero input signal | 10 ms |
| measure $U_1$ | 10 ms |
| turn off heating voltage and calculate Trim target | 10 ms |
| Thus the total time consumed by the pre-scan may be less than 0.1 s. | |

The two previous examples describe two types of cases (i) where the pre-scan range covers the entire thermal trim range, and (ii) where the pre-scan range does not necessarily cover the entire thermal trim range. As shown in the second (gain-and-offset) example, if the pre-scan range does not cover the entire thermal trim range, and if one knows enough about the circuit being scanned, one may use pre-scanning to investigate the circuit to determine parameters needed to accurately calculate the trimming targets. On the other hand, if the pre-scan range does cover the entire needed trim range, then one may operate as shown in the first (OCXO) example.

In general, it should be noted that one may simultaneously pre-scan more than one thermally-trimmable resistor. One may heat both at the same time.

Indeed, in the case where a plurality (N) of thermally-trimmable resistors are simultaneously pre-scanned, and where the pre-scan ranges do cover the entire needed trim range, one may use a pre-scan-and-hold technique, as follows. Consider simultaneous pre-scan of the N resistors to find an optimum set of trim positions, and record the optimum circuit output. Next, turn off pre-scan for the Nth resistor, while holding the pre-scan positions of the remaining N−1 resistors. Then trim that Nth resistor to bring the circuit output to its optimum value. Next, turn off pre-scan for the N−1th resistor, while holding the pre-scan positions of the remaining N−2 resistors. Then trim the N−1th resistor to again bring the circuit output to its optimum position. Continue this procedure until there are no more resistors remaining to be trimmed. As specifically described, this pre-scan-and-hold procedure works only if the pre-scan is in the same direction as the thermal trim. However, even if in some cases the pre-scan is in the opposite direction as the thermal trim, there may be groups of thermally-trimmable resistors such as voltage dividers, where one may consider the entire divider as one of the N thermally-trimmable and pre-scannable units—when appropriate in the procedure, turn off the pre-scan then thermally-trim the opposite resistor in the divider.

In the context of pre-scanning, in general the thermal trimming could be done by self-trimming or by an auxiliary resistor, or some other source of heat-pulses for trimming, because the trimming target(s) are established before actually executing the trim, and during an adaptive trimming sequence one typically removes the trimming signal while making measurements. However, the pre-scan itself must in most cases not be done by self-heating of the functional resistor itself—it needs a heat source electrically isolated from itself. This is because pre-scan is typically intended to find a fine-tuned optimum for real circuit function, within a significant pre-scan range, and it would in most cases defeat the purpose if one severely disturbed the circuit by applying a relatively large voltage and current to a critical circuit element.

Self-Heating Effects

Consider the series compound resistor shown in FIG. 1 with two resistive portions $R_1$ and $R_2$, having corresponding thermal isolation $G_1$ and $G_2$ (measured in K/mW, meaning average increase in temperature in the resistor per mW of power dissipated in that resistor). Assume that one of the portions is thermally-trimmable, in this case $R_1$. Electric current I passing through the series compound resistor results in resistance changes in each of the two portions, and in the whole resistor:

$$\Delta R_1(x) = R_1(x)[\alpha(x)\Delta T_1] = R_1(x)[\alpha(x)I^2R_1(x)G_1], \quad (37)$$

$$\Delta R_2 = R_{20}[\beta_o \Delta T_2] = R_{20}[\beta_o I^2 R_{20} G_2], \quad (38)$$

where $\Delta T_1$ and $\Delta T_2$ are overheating temperatures of each of the two portions due to power $I^2R_1$ and $I^2R_2$ dissipated in them, where x is the trim-fraction of the trimmable portion $R_1$, where $\alpha(x)$ is the TCR of $R_1$ as x varies, and where $\beta_o$ is the TCR of $R_2$. For the overall series-connected resistor $R_1(x)+R_2$, the self-heating-induced resistance modulation is $$\Delta R(x) = \Delta R_1(x) + \Delta R_2 = I^2[\alpha(x)G_1 R_1^2(x) + \beta_o G_2 R_{20}^2]. \quad (39)$$

In practice, the thermal isolations $G_1$ and $G_2$ do not vary significantly with thermal trimming. Since $G_1$ and $G_2$ can only be positive, reduction of self-heating-induced $\Delta R$ by compensation of TCR is only possible if $\alpha(x)$ and $\beta_o$ have opposite signs. In the case of this first example described above, for untrimmed resistors $\Delta R$ is zero when $G_1/G_2 = -[R_{20}^2/R_{10}^2]*[\beta_o/\alpha_o]$, where $\alpha_o$ is the TCR of $R_1$ when untrimmed. Thus, untrimmed compound resistors where one portion has positive TCR and one portion has negative TCR can be self-heating compensated by setting the thermal isolation according to the condition in the above paragraph. For example, if portion $R_1=2000\Omega$ has TCR $\alpha_o=450$ ppm/K, and portion $R_2=1000\Omega$ has TCR $\beta_o=-1350$ ppm/K, then one can compensate the self-heating effect by creating $G_1/G_2 = -[R_{20}^2/R_{10}^2]*[\beta_o/\alpha_o] = [\frac{1}{4}]*[1350/450] = 0.75$.

Designed ratios of thermal isolation $G_1/G_2$ of a pair of resistance elements can be obtained in practice in a variety of ways. If the two portions are simple integrated resistors made from surface films on a substrate, then one can arrange materials of different thermal conductivities to surround each of the two portions. Or one may place the two resistance portions on insulating films of different thicknesses, thereby creating different thermal isolation from the substrate.

One may create special film-based thermal isolation structures (e.g. US2005/258990, Babcock et al), with known or measured thermal isolation.

If the two portions are implemented in identical thermally-isolated micro-platforms (each having thermal isolation, for example 30K/mW), then one can arrange $R_1$ on 4 such identical units, while arranging $R_2$ on 3 such identical units. For example if 1 mA is passed through this series-connected compound resistor, the 2 mW of power dissipated in $R_1$ is divided into 4 micro-platforms (0.5 mW in each unit), while the 1 mW of power dissipated in $R_2$ is divided into 3 micro-platforms (0.33 mW in each unit). Thus $R_1$ experiences a temperature rise of 15K, (and a resistance increase of 6750 ppm), while $R_2$ experiences a temperature rise of 10K (and a resistance decrease of 13500 ppm). Since $R=2R_2$, $2*6750+(-13500)=0$, and the self-heating-induced resistance change is compensated.

If one is not limited to using identical thermally-isolated micro-platforms, one may use micro-platforms which have different thermal isolation values. For example, one may implement the thermally-isolated micro-platforms as two-armed cantilevers (e.g. as show in WO03023794), where the length and width of the supporting arms can be varied, or one can add or subtract material of known thermal conductivity to the supporting arms. For example, if the desired $G_1/G_2$ ratio is 3.92 (instead of a more-easily implementable "3" or "4"), then one may use 4 cantilevers for $G_2$, and use 1 cantilever for $G_1$, and decrease the thermal isolation of $R_1$ slightly by adding an appropriate slab of thermally-conductive material in the supporting arms of its cantilever.

If one has waisted structures available (PCT/CA2005/001726), one may use such structures to implement intermediate thermal isolation values. The above variety of ways are intended to be illustrative. One skilled in the art of thermal properties of materials used in integrated circuits is expected be able to apply such techniques within the context of his/her application.

Another goal of this invention is to minimize self-heating-induced resistance modulation in thermally-trimmable resistors over a trim range of interest. Zero self-heating-induced resistance modulation is theoretically possible over a trim range, in certain restrictive conditions. The two resistive portions $R_1$ and $R_2$ of the compound resistor must be designed such that their thermal isolation complies with the condition: $G_1/G_2 = -[R_2^2(y)/R_1^2(x)]*[\beta(y)/\alpha(x)]$, over the trim ranges (x,y) of interest.

In practice, it may be difficult to obtain variations of resistance and TCR over a trim range such that this ratio is exactly maintained, since it is unlikely that thermal trimming would appreciably change the thermal isolations $G_1$, $G_2$. However, awareness and simulation using this equation should allow minimization or optimization of self-heating-induced resistance changes over a trim range of interest.

For example, in the case of a series-connected compound resistor, where only $R_1$ is thermally-trimmable, then zero self-heating-induced resistance modulation is theoretically possible over a trim range only when the two resistive portions $R_1$ and $R_2$ of the compound resistor are designed so that their thermal isolation complies with a condition: $G_1/G_2 = -[R_{20}^2/R_1^2(x)][\beta_o/\alpha(x)]$, over the trim range (x) of interest.

In practice, it is problematic to keep $\Delta R=0$ over a significant trim range, since the variations $\alpha(x)$ may vary arbitrarily. For example, $\alpha(x)$ may be approximately of the form $\alpha(x) = \alpha_o + \gamma_1(x)_x$. Therefore, a typical goal is to keep $\Delta R$ as small as possible over the desired trim range, and the "optimum" may vary delicately depending on the criteria and trim range.

Figure 27:
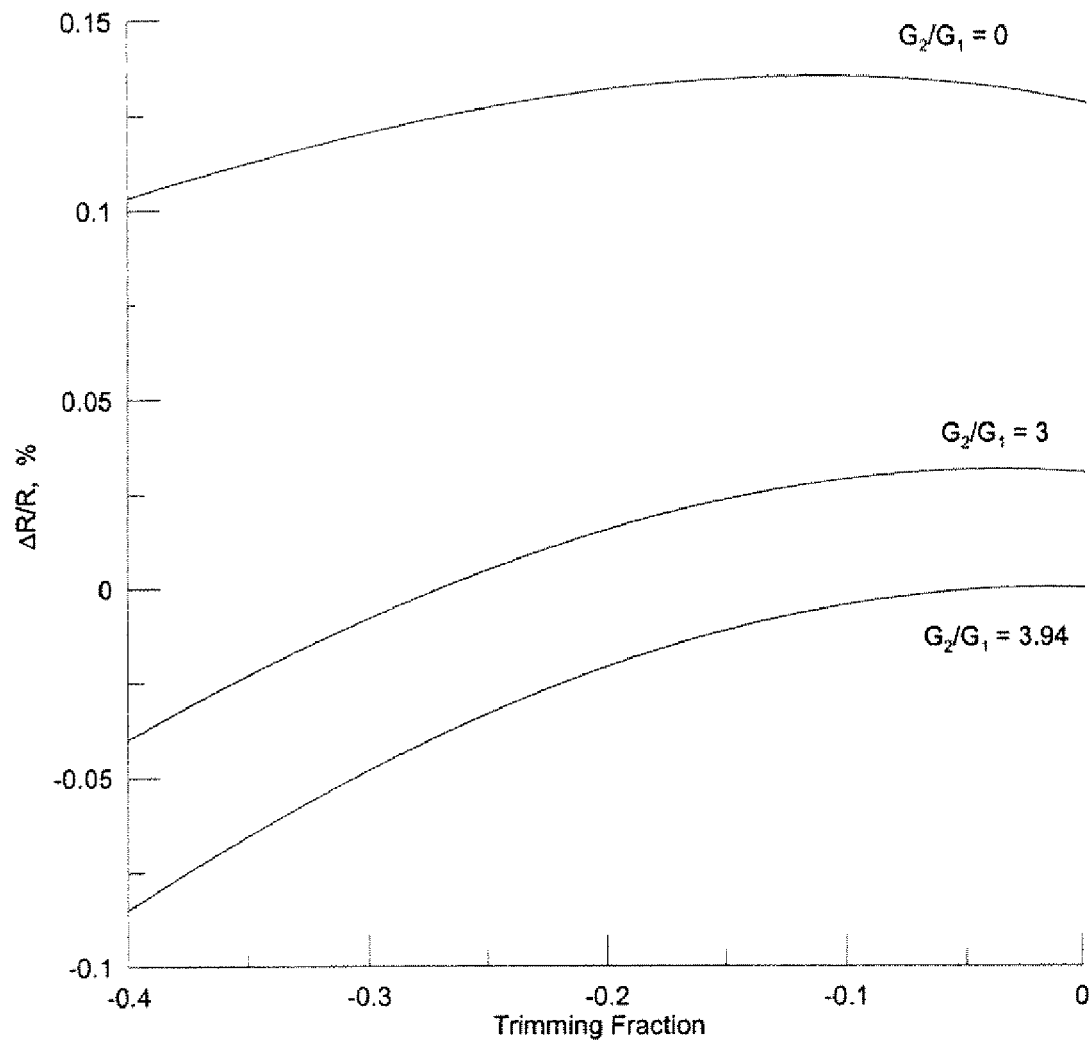
FIG. 27 is a graph showing normalized self-heating-induced resistance change (ΔR/R), of a compound resistor configured as shown in FIG. 1 vs. trimming of the resistance value of its trimmable portion (R₁), for several different ratios of $G_2/G_1$=0, 3.94, 3.

As an example, consider a compound resistor consisting of a first trimmable portion with initial resistance $R_{10}=10000\Omega$, TCR $\alpha_0=320$ ppm/K and a second un-trimmable portion connected in series, having resistance $R_{20}=0.25 \cdot R_{10}=2500\Omega$ and TCR $\beta_0=1300$ ppm/K. The first portion is located on a thermally isolated platform with thermal isolation $G_1=50$K/mW. During trimming, resistance of the first resistor and its TCR vary as:

$$R_1(x) = R_{10}(1+x) \alpha(x) = \alpha_0 - \gamma_1(1+\xi x)x \quad (40)$$

where x ($-0.4 < x < 0$) is the trimming fraction of $R_1$, $\gamma_1 = 700$ ppm/K is TCT (coefficient of variation of TCR with trim-fraction), and $\xi = 1$ is a coefficient describing non-linear variation of TCR vs. trim fraction. When electric current passes through this compound resistor, the self-heating effect causes a change of resistance. The amount of the change depends on overheating temperature of each resistive portion with positive and negative TCR. Assume that the second resistor has thermal isolation $G_2$. FIG. 27 shows the variation of resistance of the described compound resistor, with an applied current of 0.1 mA, over the trimming range from x=0 to x=−0.4.

The greatest resistance variation corresponds to the case when $G_2=0$ (no self-heating of the second resistance portion). When the second portion is placed on a thermally isolated platform with a thermal isolation $G_2$ 3.94 times higher than $G_1$ (calculated from equation (12), p. 21, PCT/CA2005/001440), no resistance change occurs at x=0. However, trimming of the portion $R_1$ decreases its resistance value, which results in reduction of its self-heating and unbalances the self-heating compensation such that the overall self-heating-induced $\Delta R$ is negative, as seen in the figure. To reduce resistance change due to self-heating over the whole trimming range, one may adjust the ratio $G_2/G_1$ to a different value. The remaining curve in FIG. 27 shows an example where $G_2/G_1=3$, and self-heating-induced $\Delta R$ remains smaller than +/−0.05% over the entire 40%-down trim-range.

Also, the thermal isolation ratio may have limited selection. For example, if it is desired to use substantially the same thermally-isolated platforms, which each have approximately the same thermal isolation, one may approximate the ratio 1:3 by using 3 platforms for $R_1$ and 1 platform for $R_2$. ($R_1$ has effectively 3 times less thermal isolation, since its dissipated power is divided among three platforms, leading to three times less temperature rise for a given power input.)

There may be different types of constraints impinging on the design problem. Often, $\alpha(x)$ and $\beta_o$ are given, fixed due to other (materials-availability) constraints. Perhaps even $R_{10}$, $R_1(x)$ and $R_{20}$ may be fixed due to constraints related to the variation of TCR with trim in the compound resistor. If these types of prior constraints are treated as a higher priority than the compensation of self-heating, then a simple procedure is mandated. If one takes as given $\alpha(x)$ $\beta_o$, $R_{10}$, $R_1(x)$ and $R_{20}$ then one simply works with the resulting formula $G_1/G_2 = -[R_{20}^2/R_1^2(x)]*[\beta_o/\alpha(x)]$, over the trim range (x) of interest. This formula may be a closed-form mathematical prescription, or may reduce to an experimentally-generated lookup table at discrete values of x, perhaps with uncertainties at each value of x. By examining the result of this formula at a set of x-values, one simply chooses and implements the $G_1/G_2$ ratio which meets (or approximates) one's criteria of "optimum" over one's desired trim range.

For example, if the $G_1/G_2$ ratio varies from 2.5 to 3.8 over the trim range of interest, then one may want to choose a ratio of 3.2, and implement such a number using one or more of the methods described earlier. On the other hand, one may also decide that a ratio of 3.0 is sufficient, and use identical cantilevers in a ratio of 1:3.

If the parameters $\alpha(x)$ $\beta_o$, $R_{10}$, $R_1(x)$ and $R_{20}$ are not necessarily fixed, then one may also co-design trimming behavior with compensation of self-heating. If, for example $\alpha(x)$, $\beta_o$, were fixed due to materials-availability constraints, but $R_{10}$ and $R_{20}$ were free to be varied somewhat, then these resistances could be varied as well as $G_1/G_2$ to obtain a better self-heating behavior over the desired trim range.

Consider a compound resistor with two resistive portions $R_1$ and $R_2$, connected in parallel and having corresponding thermal isolation $G_1$ and $G_2$ (measured in K/mW). Voltage U applied to the compound resistor results in resistance change of the two portions and the whole resistor:

$$\Delta R_1(x) = R_1(x)(\alpha(x)\Delta T_1) \quad (41)$$
$$= R_1(x)(\alpha(x) G_1 U^2 / R_1(x))$$
$$= \alpha(x) G_1 U^2$$

$$\Delta R_2 = R_{20}(\beta_0 \Delta T_2) \quad (42)$$
$$= R_{20}(\beta_0 G_2 U^2 / R_{20})$$
$$= \beta_0 G_2 U^2$$

$$\Delta R(x) = \frac{R_{20}^2 \Delta R_1(x) + R_1(x)^2 \Delta R_{20}}{(R_1(x) + R_{20})^2} \quad (39)$$
$$= \frac{U^2(R_{20}^2 \alpha(x) G_1 + R_1(x)^2 \beta_0 G_2)}{(R_1(x) + R_{20})^2}$$

Zero self-heating-induced resistance modulation is theoretically possible when the two resistive portions $R_1$ and $R_2$ of the compound resistor are designed so that their thermal isolation complies with a condition:

$$G_1/G_2 = -[R_1(x)^2/R_{20}^2][\beta_o/\alpha(x)] \quad (40)$$

which again only has physical meaning if $\alpha(x)$ and $\beta_o$ have opposite sips.

Figure 28:
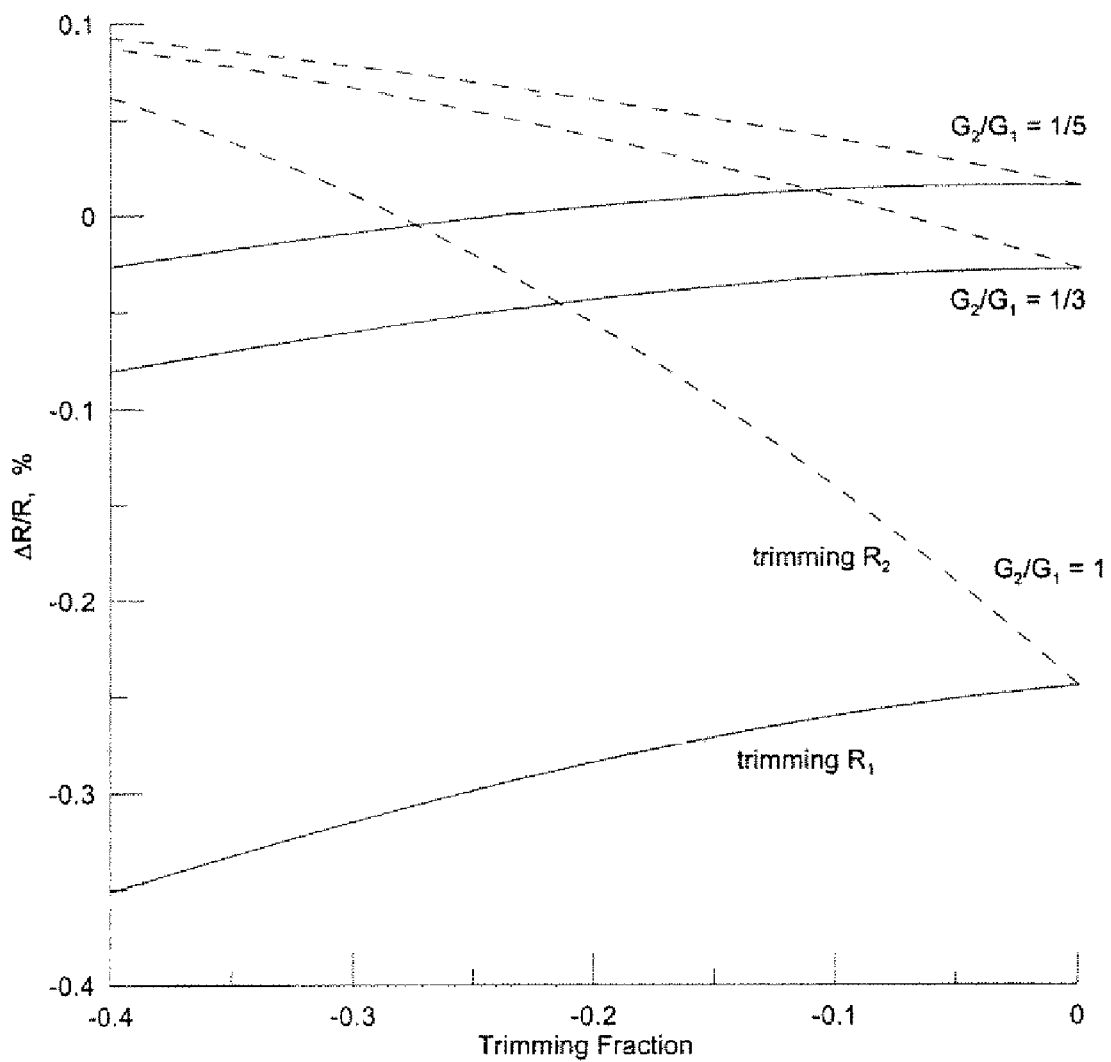
FIG. 28 is a graph showing normalized self-heating-induced resistance change (ΔR/R), of a compound resistor consisting of two trimmable portions vs. trimming fractions x, y, of the resistance value of each trimmable portion R₁(x), R₂(y), for several different ratios of $G_2/G_1$=1, 1/3, 1/5.

The above analyses hold for the case where one portion is trimmed while the other is not. It is also possible to design a compound thermally-trimmable resistor where both portions may be trimmed, having (in general) different TCR and TCT. In this case, the self-heating-induced resistance change may vary differently depending on which portion is trimmed. FIG. 28 shows several possible results, as a function of trimming fraction of one resistance portion, where the two portions are connected in series, and have as-manufactured resistance ratio of 1:1. One can see that if the two portions have equal thermal isolation ($G_2/G_1=1$), then before any trimming there is significant self-heating-induced $\Delta R/R$, while trimming portions $R_1$ and $R_2$ have quite different effects on $\Delta R/R$. When the resistance portion, $R_2$, having large negative TCR, is given ⅓ of the thermal isolation, then both the absolute $\Delta R/R$ and its change with trim are significantly reduced. When the $R_2$ resistance portion is given a ⅕ of the thermal isolation, the change with trim is further reduced, but the absolute ΔR/R is increased slightly.

It should be understood that the given examples do not limit the variety of the possible schemes based on trimmable compound resistors. Such parameters as number of single and compound resistors in the network, resistance values, resistance ratios, etc., are application-specific, and can be different from those described above. Also, the physical parameters of the resistor materials, such as TCR and TCT, may differ, which changes the "optimal" resistor ratios.

It is possible that, in certain cases, it may not be possible to realize exactly and simultaneously more than one of the imperatives suggested by the fundamental equations in this invention. Therefore, a prioritization may be done, in which features which are "less critical" for a particular application may be partially sacrificed, or "near-optimal" matching of the resistor network parameters may be used as a trade-off.

The embodiment(s) of the invention described above is(are) intended to be exemplary only. The scope of the invention is therefore intended to be limited solely by the scope of the appended claims.

The invention claimed is:

1. A method for providing a trimmable resistive component having a predetermined behavior of temperature coefficient of resistance (TCR) as a function of trimming, the method comprising:
   selecting materials to form a compound resistor having at least a first portion and a second portion, at least said first portion including a first resistor $R_1$, that is thermally trimmable and has a first resistivity, a first temperature coefficient of resistance value $\alpha_0$, and a trimming-induced shift of temperature coefficient $\gamma_1$, which defines a change in said $\alpha_0$ per fraction of trimming x of said first resistivity, said second portion including at least a second resistor, $R_2$, having a second resistivity value, and a second temperature coefficient of resistance value $\beta_0$;
   determining how said TCR value of said resistive component changes as at least said first portion is trimmed, by generating a function of said TCR versus trim-fraction x, with $R_1$ and $R_2$ as variable parameters and $\alpha_0$, $\beta_0$, and $\gamma_1$ as fixed parameters; and
   selecting specific values for $R_1$ and $R_2$ or $R_1/R_2$ to provide said resistive component with said predetermined behavior of said TCR, thereby incorporating an effect of said $\gamma_1$ in said resistive component, with $\gamma_1$ being (a) a constant or (b) a function, $\gamma_1(x)$, representing fixed behavior of $\gamma_1$ as a function of trim-fraction x.

2. A method as claimed in claim 1 wherein said change in $\alpha_o$ per fraction of trimming x is further defined by a variation of said $\gamma_1$ as a function of x.

3. A method as claimed in claim 2 including:
   (i) choosing materials for each of the two portions with resistivity value and TCR for each portion and $\gamma_1(x)$ for at least the first portion,
   (ii) choosing a trimming range $(x_1 \ldots x_2)$, where $x_1$ and $x_2$ are within the normal trimming range of the trimmable resistive portion;
   (iii) defining a resistance ratio of the two portions such that the compound resistor provides a substantially flat TCR vs. trim-fraction relationship in a useful portion of the range of trimming, and
   (iv) trimming to set the resistance to a desired value allowing trimming within said substantially flat part of the range of trimming.

4. A method as claimed in claim 1 including:
   (i) choosing materials for each of the two portions with resistivity value and TCR for each portion and $\gamma_1(x)$ for at least the first portion,
   (ii) choosing a trimming range $(x_1 \ldots x_2)$, where $x_1$ and $x_2$ are within the normal trimming range of the trimmable resistive portion,
   (iii) defining a resistance ratio of the two portions such that the compound resistor provides substantially flat TCR vs. trim-fraction relationship in a useful portion of the range of trimming, and
   (iv) trimming to set the resistance to a desired value allowing trimming within said substantially flat part of the range of trimming.

5. A method as claimed in either of claims 1 or 2, wherein said predetermined behavior of TCR corresponds to a substantially non-zero variation of said TCR with said fraction of trimming x.

6. A method as claimed in any of claims 1, 2, 3 or 4, wherein said selecting materials comprises choosing materials (a) such that $\alpha_0 - \beta_0 > -\gamma_1$, for series connection of the first and second resistors, and (b) such that $\beta_0 - \alpha_0 > -\gamma_1$ for parallel connection of the first and second resistors.

7. A method as claimed in claim 6 wherein said selecting specific values comprises choosing values (a) such that $$\frac{R_2}{R_{10}} = \frac{\gamma_1}{\beta_0 - \alpha_0 - \gamma_1},$$

wherein $R_{10}$ is a resistance value of said first resistor at a predetermined trim-fraction within a trimming range of said first resistor for series connection of the first and second resistors and (b) such that $$\frac{R_2}{R_{10}} = \frac{\alpha_0 - \beta_0 - \gamma_1}{\gamma_1},$$

wherein $R_{10}$ is a resistance value of said first resistor at a predetermined trim-fraction within a trimming range of said first resistor for parallel connection of the first and second resistors.

8. A method as claimed in any of claims 1, 2, 3 or 4 wherein any one or more of $\alpha_o$, $\beta_o$ or $\gamma_1$ further comprises at least first and second order coefficients of variation of resistance with temperature.

9. A method as claimed in any of claims 1, 2, 3 or 4 further comprising provision of one or more additional resistors (a) in series with said first and second resistors when they are in parallel with each other and (b) in parallel with said first and second resistors when they are in series with each other, in each such case being selected to shift untrimmed TCR value of the compound resistor to a greater or lower desired value without substantially changing the shape of the curve of TCR vs. trim-fraction of the compound resistor, including the additional resistor(s).

10. A method as claimed in any of claims 1, 2, 3 or 4, wherein said first and second resistors may be in series or in parallel and, in either case, said second resistor is also thermally trimmable and has a value of trimming-induced shift of temperature coefficient $\gamma_2$, which defines a change in said $\beta_0$ per fraction of trimming y of said second resistivity, and said predetermined behavior of TCR of the resistive component corresponds to two substantially different curves representing variation of said TCR with said trim fraction x and variation of said TCR with said trim fraction y.

11. A method as claimed in claim 10, wherein said two curves have slopes of different signs.

12. A method as claimed in any of claims 1, 2, 3 or 4, further comprising thermally isolating said first portion and said second portion on at least one thermally isolated micro-platform.

13. A method as claimed in claim 12, wherein said first portion and said second portion are provided on separate thermally isolated micro-platforms.

14. A method as claimed in any of claims 1, 2, 3, or 4 wherein said second portion is part of an application specific circuit, and said selecting specific values for $R_1$ and $R_2$ or $R_1/R_2$ comprises selecting said specific values to provide a predetermined behavior of a temperature coefficient of voltage across said second portion as a function of trimming said first resistor.

15. A trimmable resistive component having a predetermined behavior of temperature coefficient of resistance (TCR) as a function of trimming comprising:
a first portion composed of a first resistor that is thermally trimmable and has a first resistivity, a first temperature coefficient of resistance value $\alpha_0$, and a trimming-induced shift of temperature coefficient $\gamma_1$, which defines a change in said $\alpha_0$ per fraction of trimming x of said first resistivity; and
a second portion composed of at least a second resistor having a second resistivity value and a second temperature coefficient of resistance value $\beta_0$, said first portion and said second portion having specific values for $R_1$ and $R_2$ or $R_1/R_2$ to provide said resistive component with said predetermined behavior of said TCR value,
wherein said predetermined behavior of said TCR is defined by a function of said TCR versus trim-fraction x, with $R_1$ and $R_2$ as variable parameters and $\alpha_0$, $\beta_0$, and $\gamma_1$ as fixed parameters, thereby incorporating an effect of said $\gamma_1$ in said resistive component with $\gamma_1$ being (a) a constant or (b) a function, $\gamma_1(x)$, representing fixed behavior of $\gamma_1$ as a function of trim-fraction x.

16. A trimmable resistive component as claimed in claim 15 wherein said change in $\alpha_o$ per fraction of trimming x is further defined by a variation of said $\gamma_1$ as a function of x.

17. A trimmable resistive component as claimed in either of claims 15 or 16 constructed and arranged such that said predetermined behavior of said TCR has a substantially-flat TCR vs. trim-fraction relationship in a useful portion of the range of trimming.

18. A trimmable resistive component as claimed in either of claims 15 or 16, wherein said predetermined behavior of TCR corresponds to a substantially non-zero variation of said TCR with said fraction of trimming x.

19. A trimmable resistive component as claimed in either of claims 15 or 16, wherein said predetermined behavior of TCR corresponds to a negligible variation of said TCR with said fraction of trimming x over a range of trim-fraction.

20. A trimmable resistive component as claimed in either of claims 15 or 16, wherein (a) for series connection of said first and second resistors $\alpha_0 - \beta_0 > -\gamma_1$ and (b) for parallel connection of said first and second resistors $\beta_o - \alpha_o > -\gamma_1$.

21. A trimmable resistive component as claimed in claim 20 wherein (a) for series connection of said first and second resistors $$\frac{R_2}{R_{10}} = \frac{\gamma_1}{\beta_0 - \alpha_0 - \gamma_1},$$

wherein $R_{10}$ is a resistance value of said first resistor at a predetermined trim-fraction within a trimming range of said first resistor and (b) for parallel connection of said first and second resistors $$\frac{R_2}{R_{10}} = \frac{\alpha_0 - \beta_0 - \gamma_1}{\gamma_1},$$

wherein $R_{10}$ is a resistance value of said first resistor at a predetermined trim-fraction within a trimming range of said first resistor.

22. A trimmable resistive component as claimed in either of claims 15 or 16, wherein any one or more of $\alpha_0$, $\beta_0$ or $\gamma_1$ further comprises at least first and second order coefficients of variation of resistance with temperature.

23. A trimmable resistive component as claimed in either of claim 22 and comprising one or more additional resistors (a) in parallel with said first and second resistors when they are in series with each other and (b) in series with said first and second resistors when they are in parallel with each others in each such case constructed and arranged to shift untrimmed TCR value of the compound resistor to a greater or lower desired value without substantially changing the shape of the curve of TCR vs. trim-fraction of the compound resistor including the additional resistor(s).

24. A trimmable resistive component as claimed in either of claims 15 or 16 and comprising one or more additional resistors (a) in parallel with said first and second resistors when they are in series with each other and (b) in series with said first and second resistors when they are in parallel with each other in each such case constructed and arranged to shift untrimmed TCR value of the compound resistor to a greater or lower desired value without substantially changing the shape of the curve of TCR vs. trim-fraction of the compound resistor including the additional resistor(s).

25. A trimmable resistive component as claimed in either of claims 15 or 16 wherein said second resistor is also thermally trimmable and has a value of trimming-induced shift of temperature coefficient $\gamma_2$, which defines a change in said $\beta_0$ per fraction of trimming y of said second resistivity, said predetermined behavior of TCR of the resistive component corresponds to two substantially different curves representing variation of said TCR with said trim fraction x and variation of said TCR with said trim fraction y.

26. A trimmable resistive component as claimed in claim 25, wherein said two curves have slopes of different signs.

27. A trimmable resistive component as claimed in either of claims 15 or 16, comprising a trimmable resistive second portion wherein a predetermined behavior of a temperature coefficient of voltage across said second portion as a function of trimming said first resistor is also defined by said specific values for at least one of $R_1$ and $R_2$ or $R_1/R_2$.

28. A trimmable resistive component as claimed in either of claims 15 or 16, wherein said first portion and said second portion are on at least one thermally isolated micro-platform.

29. A trimmable resistive component as claimed in claim 28, wherein said first portion and said second portion are on separate thermally isolated micro-platforms.

30. A trimmable resistive component as claimed in either of claims 15 or 16, wherein said first resistor is made of boron-doped polysilicon and said second resistor is made of arsenic-doped polysilicon.

31. A trimmable resistive component as claimed in claim 27, wherein said second portion is composed of four interconnected resistors.

32. A trimmable resistive component as claimed in either of claims 15 or 16, wherein said second portion is composed of four interconnected resistors.

33. A trimmable resistive component as claimed in claim 32, wherein said four interconnected resistors form at least a portion of a Wheatstone bridge circuit.

34. A trimmable resistive component as claimed in claim 31 wherein said four interconnected resistors form at least a portion of a Wheatstone bridge circuit.

35. An application specific circuit having an adjustable parameter of the circuit and an adjustable temperature coefficient of said parameter, the circuit comprising:
at least one compound resistor including:
a first portion comprising a first resistor, $R_1$, that is thermally trimmable and has a first resistivity, a first temperature coefficient of resistance (TCR) value $\alpha_0$, and a trimming-induced shift of temperature coefficient $\gamma_1$, which defines a change in said $\alpha_0$ per fraction of trimming x of said first resistivity, and
a second portion comprising a second resistor, $R_2$, having a second resistivity value and a second TCR value $\beta_0$, said first portion and said second portion having specific values for at least one of $R_1$ and $R_2$ and $R_1/R_2$ to provide said compound resistor with said predetermined behavior of said TCR value;
circuitry for said application connected to said at least one compound resistor;
wherein said predetermined behavior of said TCR is defined by a function of said TCR versus trim-fraction x, with $R_1$ and $R_2$ as variable parameters and $\alpha_0$, $\beta_0$, and $\gamma_1$ as fixed parameters, thereby incorporating an effect of said $\gamma_1$ in said compound resistor, $\gamma_1$ being, (a) a constant or (b) a function, $\gamma_1(x)$, representing fixed behavior of $\gamma_1$ as a function of trim-fraction x.

36. An application specific circuit as claimed in claim 35 wherein said change in $\alpha_o$ per fraction of trimming x is further defined by a variation of said $\gamma_1$ as a function of x.

37. An application specific circuit as claimed in either of claims 35 or 36 constructed and arranged so that said predetermined behavior of said TCR has a substantially-flat TCR vs. trim-fraction relationship in a useful portion of the range of trimming.

38. An application specific circuit as claimed in either of claims 35 or 36, further comprising provision of one or more additional resistors (a) in series with said first and second resistors when they are in parallel with each other and (b) in parallel with said first and second resistors when they are in series with each other, in each such case being selected to shift untrimmed TCR value of the compound resistor to a greater or lower desired value without substantially changing the shape of the curve of TCR vs. trim-fraction of the compound resistor, including the additional resistor(s).

39. A circuit as claimed in either of claims 35 or 36, wherein said second resistor is also thermally trimmable and has a value of trimming-induced shift of temperature coefficient $\gamma_2$, which defines a change in said $\beta_0$ per fraction of trimming y of said second resistivity, said predetermined behavior of TCR of the resistive component corresponds to two substantially different curves representing variation of said TCR with said trim fraction x and variation of said TCR with said trim fraction y.

40. A circuit as claimed in claim 39, wherein said two curves have slopes of different signs.

41. A circuit as claimed in claim 35, wherein said compound resistor is part of a Wheatstone bridge.

42. A circuit as claimed in claim 35, wherein said circuit is a Wheatstone bridge.

43. A circuit as claimed in either of claims 41 or 42, wherein said at least one compound resistor comprises four compound resistors, and said four compound resistors make up said Wheatstone bridge.

44. A circuit as claimed in claim 43, wherein only two of said four compound resistors are trimmed to adjust said temperature coefficient of said parameter, and said two are selected in accordance with a measured offset of said parameter.

45. A circuit as claimed in either of claims 41 or 42, wherein said parameter is an overall bridge resistance.

46. A circuit as claimed in either of claims 41 or 42, wherein said parameter is a zero offset of a sensor stimulus.

47. A circuit as claimed in claim 35, wherein said circuit is a voltage divider.

48. A circuit as claimed in claim 47, wherein said at least one compound resistor comprises two compound resistors, and said two compound resistors make up said voltage divider.

49. A circuit as claimed in either of claims 35 or 36, wherein said predetermined behavior of TCR corresponds to a substantially non-zero variation of said TCR with said fraction of trimming x.

50. A circuit as claimed in either of claims 35 or 36, wherein (a) for a series connection of said first and second resistors $\alpha_0 - \beta_0 > -\gamma_1$, and (b) wherein for parallel connection of said first and second resistors $\beta_o - \alpha_o > -\gamma_1$.

51. A circuit as claimed in claim 50 wherein (a) for a series connection of said first and second resistors $$\frac{R_2}{R_{10}} = \frac{\alpha_0 - \beta_0 - \gamma_1}{\gamma_1},$$

wherein $R_{10}$ is a resistance value of said first resistor at a predetermined trim-fraction within a trimming range of said first resistor and (b) wherein for parallel connection of said first and second resistors $$\frac{R_2}{R_{10}} = \frac{\gamma_1}{\beta_0 - \alpha_0 - \gamma_1},$$

wherein $R_{10}$ is a resistance value of said first resistor at a predetermined trim-fraction within a trimming range of said first resistor.

52. A circuit as claimed in either of claims 35 or 36, wherein said first portion and said second portion are on at least one thermally isolated micro-platform.

53. A circuit as claimed in claim 52, wherein said first portion and said second portion are on separate thermally isolated micro-platforms.

54. A circuit as claimed in either of claims 35 or 36, wherein said first portion is made of boron-doped polysilicon and said second portion is made of arsenic-doped polysilicon.

55. A circuit as claimed in either of claims 35 or 36, wherein said circuit has an output that is a linear function of an input, with a substantially linear temperature-induced drift.

56. A circuit as claimed in claim 55, wherein said circuit is a differential bridge circuit with an amplified output.

57. A circuit as claimed in either of claims 55 or 56, wherein said circuit is a cascade of a plurality of said differential bridge circuit with an amplified output.

58. A circuit as claimed in claim 57, wherein said circuit is three cascaded differential bridge circuits.

59. A circuit as claimed in either of claims 35 or 36, wherein any one or more of αo, βo or γ, further comprises at least first and second order coefficients of variation of resistance with temperature and wherein any one or more of αo, βo or γ, further comprises at least first and second order coefficients of variation of resistance with temperature.

60. A circuit as claimed in either of claims 35 or 36, wherein said second portion is part of an application specific circuit, and wherein a predetermined behavior of a temperature coefficient of voltage across said second portion as a function of trimming said first resistor is also defined by said specific values for at least one of $R_1$ and $R_2$ or $R_1/R_2$.

61. A circuit as claimed in claim 35 and further comprising, in combination therewith, a control system for thermally trimming said at least one compound resistor.

62. A method for providing a resistor having a predetermined resistance value and temperature coefficient of resistance value, the method comprising:
  providing a trimmable resistive component having a predetermined behavior of temperature coefficient of resistance (TCR) as a function of trimming, the method comprising:
  selecting materials to form a compound resistor having at least a first portion and a second portion, at least said first portion including a first resistor, $R_1$, that is thermally trimmable and has a first resistivity, a first temperature coefficient of resistance value $\alpha_0$, and a trimming-induced shift of temperature coefficient $\gamma_1$, which defines a change in said co per fraction of trimming x of said first resistivity, said second portion including at least a second resistor, $R_2$, having a second resistivity value, and a second temperature coefficient of resistance value $\beta_0$;
  determining how said TCR value of said resistive component changes as at least said first portion is trimmed, by generating a function of said TCR versus trim-fraction x, with $R_1$ and $R_2$ as variable parameters and $\alpha_0$, $\beta_0$, and $\gamma_1$ as fixed parameters;
  selecting specific values for $R_1$ and $R_2$ or $R_1/R_2$ to provide said resistive component with said predetermined behavior of said TCR, thereby incorporating an effect of said $\gamma_1$ in said resistive component with $\gamma_1$ being (a) a constant or (b) a function $\gamma_1$ (x), representing fixed behavior of $\gamma_1$ as a function of trim-fraction x; and
  thermally trimming said first resistor to obtain said predetermined resistance value and temperature coefficient of resistance value of the compound resistor.

63. A method as claimed in claim 62 including:
  (i) choosing materials for each of the two portions with resistivity value and TCR for each portion and $\gamma_1$ (x) for at least the first portion
  (ii) choosing a trimming range ($x_1 \ldots x_2$), where $x_1$ and $x_2$ are within the normal trimming range of the trimmable resistive portion,
  (iii) defining a resistance ratio of the two portions such that the compound resistor provides substantially flat TCR vs. trim-fraction relationship in a useful portion of the range of trimming, and
  (iv) trimming to set the resistance to a desired value allowing trimming within said substantially flat part of the range of trimming.

64. A method as claimed in claim 62 wherein (a) said selecting materials comprises choosing materials such that $\alpha_0-\beta_0 > -\gamma_1$, for series connection of the first and second resistors, and (b) such that $\beta_0-\alpha_0 > -\gamma_1$ for parallel connection of the first and second resistors.

65. A method as claimed in claim 64, wherein said selecting specific values comprises choosing values such that $$\frac{R_2}{R_{10}} = \frac{\gamma_1}{\beta_0 - \alpha_0 - \gamma_1},$$

wherein $R_{10}$ is a resistance value of said first resistor at a predetermined trim-fraction within a trimming range of said first resistor for series connection of the first and second resistors and (b) such that $$\frac{R_2}{R_{10}} = \frac{\alpha_0 - \beta_0 - \gamma_1}{\gamma_1},$$

wherein $R_{10}$ is a resistance value of said first resistor at a predetermined trim-fraction within a trimming range of said first resistor for parallel connection of the first and second resistors.

66. A method as claimed in claim 62, wherein said second resistor is also thermally trimmable and has a value of trimming-induced shift of temperature coefficient, $\gamma_2$, which defines a change in said $\beta_0$ per fraction of trimming y of said second resistivity, said predetermined behavior of TCR of the compound resistor corresponds to two substantially different curves representing variation of said TCR with said trim fraction x and variation of said TCR with said trim fraction y.

67. A method as claimed in claim 66 wherein said two curves have slopes of different signs.

68. A method as claimed in either of claims 65, 66 or 67 wherein said thermally trimming comprises thermally trimming said first resistance value and said second resistance value to different values.

69. A method as claimed in claim 62 wherein any one or more of $\alpha_o$, $\beta_o$ or $\gamma_1$ further comprises at least first and second order coefficients of variation of resistance with temperature.

70. A method as claimed in claim 62 including
  (i) choosing materials for each of the two portions with resistivity value and TCR for each portion and $\gamma_1$ (x) for at least the first portion,
  (ii) choosing a trimming range ($x_1 \ldots x_2$), where $x_1$ and $x_2$ are within the normal trimming range of the resistor;
  (iii) defining a resistance ratio of the two portions such that the compound resistor provides a substantially flat TCR vs. trim-fraction relationship in a useful part of the range of trimming, and
  (iv) trimming within said substantially flat part of the range portion to set an initial required resistance value.

71. A method as claimed in either of claims 1 or 2 wherein said predetermined behavior of TCR corresponds to a negligible variation of said TCR with said fraction of trimming x over a range of trim-fraction.

72. A trimmable resistive component as claimed in either of claims 15 or 16 wherein said predetermined behavior of TCR corresponds to a negligible variation of said TCR with said fraction of trimming x over a range of trim-fraction.

* * * * *